United States Patent
Miyata et al.

(10) Patent No.: US 12,034,021 B2
(45) Date of Patent: Jul. 9, 2024

(54) STRUCTURE, COMPOSITION FOR NEAR-INFRARED CUT FILTER, DRY FILM, METHOD FOR PRODUCING STRUCTURE, OPTICAL SENSOR, AND IMAGE DISPLAY DEVICE

(71) Applicant: FUJIFILM Corporation, Tokyo (JP)

(72) Inventors: Tetsushi Miyata, Haibara-gun (JP); Tokihiko Matsumura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1017 days.

(21) Appl. No.: 16/940,137

(22) Filed: Jul. 27, 2020

(65) Prior Publication Data
US 2020/0357836 A1    Nov. 12, 2020

Related U.S. Application Data

(63) Continuation of application No. PCT/JP2019/010141, filed on Mar. 13, 2019.

(30) Foreign Application Priority Data

Mar. 16, 2018  (JP) .................................. 2018-048803
Mar. 1, 2019   (JP) .................................. 2019-037495

(51) Int. Cl.
*H01L 27/146*   (2006.01)
*G02B 5/20*     (2006.01)
(Continued)

(52) U.S. Cl.
CPC .. *H01L 27/14621* (2013.01); *H01L 27/14685* (2013.01); *H04N 5/33* (2013.01)

(58) Field of Classification Search
CPC ......... H01L 27/14621; H01L 27/14685; C09B 57/00; G02B 5/201; G02B 5/208;
(Continued)

(56) References Cited

U.S. PATENT DOCUMENTS 10,732,333 B2     8/2020  Norizuki et al.
2013/0036938 A1*  2/2013  Higashi .................. G03F 7/105
                                                          106/31.77
(Continued)

FOREIGN PATENT DOCUMENTS

JP  2002-40440 A    2/2002
JP  2015-507218 A   3/2015
(Continued)

OTHER PUBLICATIONS

Taiwanese Office Action and Search Report for corresponding Taiwanese Application No. 108108966, dated Sep. 7, 2022, with English translation.
(Continued)

*Primary Examiner* — Omar F Mojaddedi
(74) *Attorney, Agent, or Firm* — Birch, Stewart, Kolasch & Birch, LLP

(57) ABSTRACT

A structure has first pixels constituted of a laminate including a light-receiving element, a color filter, and a near-infrared cut filter, and second pixels including a near-infrared transmitting filter. The near-infrared cut filter includes a predetermined near-infrared absorbing colorant, a resin having a glass transition temperature of 100° C. or higher, and a surfactant.

13 Claims, 2 Drawing Sheets

(51) Int. Cl.
  *G02B 5/22* (2006.01)
  *H04N 5/33* (2023.01)
(58) Field of Classification Search
  CPC .......... G02B 5/22; G02B 5/223; G03F 7/004; C09K 3/00
  See application file for complete search history.

(56) References Cited

U.S. PATENT DOCUMENTS

| | | | |
|---|---|---|---|
| 2013/0157463 A1 | 6/2013 | Goldfarb et al. | |
| 2015/0130008 A1* | 5/2015 | Muro | H01L 27/14625 438/70 |
| 2017/0017023 A1* | 1/2017 | Sugiyama | H01L 27/14618 |
| 2017/0038507 A1* | 2/2017 | Norizuki | G02B 5/208 |
| 2017/0317132 A1 | 11/2017 | Hatakeyama et al. | |
| 2018/0017721 A1 | 1/2018 | Nagaya et al. | |
| 2018/0057690 A1 | 3/2018 | Mori et al. | |
| 2019/0137670 A1* | 5/2019 | Nagaya | G02B 5/22 |
| 2020/0386928 A1* | 12/2020 | Takagi | H01L 27/146 |

FOREIGN PATENT DOCUMENTS

| | | |
|---|---|---|
| JP | 2018-10296 A | 1/2018 |
| KR | 10-2016-0137629 | 11/2016 |
| TW | 201704357 A | 2/2017 |
| TW | 201731684 A | 9/2017 |
| WO | WO 2016/117596 A1 | 7/2016 |
| WO | WO 2016/190162 A1 | 12/2016 |
| WO | WO 2017/018202 A1 | 2/2017 |
| WO | WO 2018/030247 A1 | 2/2018 |
| WO | WO 2016/088644 A1 | 6/2018 |

OTHER PUBLICATIONS

Korean Notification of Reason for Refusal for corresponding Korean Application No. 10-2020-7021637, dated Dec. 21, 2021, with an English translation.

International Preliminary Report on Patentability and Written Opinion of the International Searching Authority with an English translation (forms PCT/IB/373, PCT/ISA/237 and PCT/IB/326), dated Oct. 1, 2020, for corresponding International Application No. PCT/JP2019/010141.

International Search Report (forms PCT/ISA/210 and PCT/ISA/220), dated Jun. 11, 2019. for corresponding International Application No. PCT/JP2019/010141, with an English translation.

Korean Office Action for corresponding Korean Application No. 10-2020-7021637, dated Jun. 15, 2022 with an English translation.

Japanese Notice of Reasons for Refusal for corresponding Japanese Application No. 2020-506579, dated Sep. 14, 2021, with an English translation.

* cited by examiner

STRUCTURE, COMPOSITION FOR NEAR-INFRARED CUT FILTER, DRY FILM, METHOD FOR PRODUCING STRUCTURE, OPTICAL SENSOR, AND IMAGE DISPLAY DEVICE

CROSS-REFERENCE TO RELATED APPLICATIONS

This application is a Continuation of PCT International Application No. PCT/JP2019/010141 filed on Mar. 13, 2019, which claims priority under 35 U.S.C § 119(a) to Japanese Patent Application No. 2018-048803 filed on Mar. 16, 2018, and Japanese Patent Application No. 2019-037495 filed on Mar. 1, 2019. Each of the above application(s) is hereby expressly incorporated by reference, in its entirety, into the present application.

BACKGROUND OF THE INVENTION

1. Field of the Invention

The present invention provides a structure having first pixels constituted of a laminate including a color filter and a near-infrared cut filter, and second pixels including a near-infrared transmitting filter on a light-receiving surface of a light-receiving element. The present invention also relates to a composition for a near-infrared cut filter, a dry film, a method for producing a structure, an optical sensor, and an image display device.

2. Description of the Related Art

In a video camera, a digital still camera, a mobile phone with a camera function, and the like, a charge-coupled device (CCD) or a complementary metal-oxide semiconductor (CMOS), which is a solid-state imaging device for a color image, has been used. Such the solid-state imaging device uses a silicon photodiode having a sensitivity to infrared rays in a light-receiving portion thereof. For this reason, a near-infrared cut filter may be arranged on the optical path of a color filter to perform luminosity correction.

On the other hand, an attempt to incorporate a sensing function using infrared rays into a solid-state imaging device is also under consideration.

WO2016/117596A describes a solid-state imaging device including first pixels in which a color filter layer having a transmission band in a visible wavelength range is provided on a light-receiving surface of a first light-receiving element; second pixels in which an infrared pass filter layer having a transmission band in an infrared wavelength range is provided on a light-receiving surface of a second light-receiving element; an infrared cut filter layer provided at a position where the color filter layer and the infrared cut filter layer shielding light in the infrared wavelength range and transmitting light in the visible wavelength range overlap; and a cured film provided in contact with the infrared cut filter layer.

Further, WO2016/088644A describes a solid-state imaging device comprising a first optical layer that transmits visible light and at least a part of near-infrared light; a second optical layer that absorbs at least a part of near-infrared light; and a pixel array including a first light-receiving element that detects the visible light transmitted by the first and second optical layers and a second light-receiving element that detects the near-infrared light transmitted by the first optical layer.

SUMMARY OF THE INVENTION

On the other hand, the present inventors have conducted intensive studies on a laminate having first pixels constituted of a laminate including a color filter and a near-infrared cut filter, and second pixels including a near-infrared transmitting filter, and have found that in a case where such a structure is exposed to a high-temperature and high-humidity environment, voids are easily generated on the surface of the near-infrared cut filter for the first pixels.

Furthermore, the near-infrared cut filter used for such a structure preferably has excellent visible transparency so as not to impair color resolution of the color filter.

In addition, a film including a near-infrared absorber, or the like has been used for the near-infrared cut filter, but in a step for producing an optical sensor and the like, each of the above-mentioned pixels is formed on the light-receiving element, and then subjected to a high-temperature heating treatment process such as a solder flow step so that each of the pixels may be exposed to a high temperature. However, many near-infrared absorbers have low heat resistance and may be discolored by heating to reduce visible transparency. For this reason, it is also desirable that the near-infrared cut filter has excellent heat resistance.

Therefore, an object of the present invention is to provide a structure having a near-infrared cut filter, which has good heat resistance and spectral characteristics and causes generation of voids to be suppressed. Furthermore, another object of the present invention is to provide a composition for a near-infrared cut filter and a dry film, each of which is used for the above-mentioned structure. In addition, still another object of the present invention is to provide a method for producing the above-mentioned structure, an optical sensor, and an image display device.

According to the studies of the present inventor, it was found that the objects can be accomplished by using the following structure, thereby leading to completion of the present invention. The present invention provides the following aspects.

<1> A structure comprising:
a light-receiving element;
first pixels constituted of a laminate including a color filter and a near-infrared cut filter, provided on a light-receiving surface of the light-receiving element; and
second pixels including a near-infrared transmitting filter, provided on the light-receiving surface of the light-receiving element at a position different from a region where the first pixels are provided,
in which the near-infrared cut filter includes a near-infrared absorbing colorant, a resin having a glass transition temperature of 100° C. or higher, and a surfactant, and
the near-infrared absorbing colorant is at least one selected from a colorant compound having a cation and an anion in the same molecule, a colorant compound which is a salt of a cationic chromophore and a counter anion, or a colorant compound which is a salt of an anionic chromophore and a counter cation.
<2> The structure as described in <1>,
in which the near-infrared absorbing colorant is a squarylium compound or a croconium compound.

<3> The structure as described in <1> or <2>,
in which the near-infrared cut filter includes a cyclic olefin resin having a glass transition temperature of 100° C. or higher.

<4> The structure as described in any one of <1> to <3>, in which a content of the near-infrared absorbing colorant in the near-infrared cut filter is 10% by mass or more.

<5> The structure as described in any one of <1> to <4>, in which the color filter includes a surfactant.

<6> The structure as described in any one of <1> to <5>, in which the surfactant is a fluorine-based surfactant.

<7> The structure as described in any one of <1> to <6>, in which a content of the surfactant in the near-infrared cut filter is 10 to 10,000 ppm by mass.

<8> The structure as described in any one of <1> to <7>, in which a concentration of the surfactant of the near-infrared cut filter in a region in a range of 0% to 5% in the thickness direction from one surface of the near-infrared cut filter is higher than a concentration of the surfactant in a region in a range of 60% to 70% in the thickness direction from the surface.

<9> A composition for a near-infrared cut filter, used for producing a near-infrared cut filter of the structure as described in any one of <1> to <8>, the composition comprising:
a near-infrared absorbing colorant;
at least one compound selected from the group consisting of a resin having a glass transition temperature of 100° C. or higher and a precursor of the resin having a glass transition temperature of 100° C. or higher; and
a surfactant,
in which the near-infrared absorbing colorant is at least one selected from a colorant compound having a cation and an anion in the same molecule, a colorant compound which is a salt of a cationic chromophore and a counter anion, or a colorant compound which is a salt of an anionic chromophore and a counter cation.

<10> A dry film obtained by using the composition for a near-infrared cut filter as described in <9>.

<11> A method for producing the structure as described in any one of <1> to <8>, the method comprising:
forming first pixels constituted of a laminate including a color filter and a near-infrared cut filter on a light-receiving surface of the light-receiving element; and
forming second pixels including a near-infrared transmitting filter on the light-receiving surface of the light-receiving element at a position different from a region where the first pixels are provided,
in which the near-infrared cut filter is formed by applying the composition for a near-infrared cut filter as described in <9> onto a light-receiving surface of a light-receiving element to form a composition layer and subjecting the composition layer to a photolithography method or a dry etching method to form a pattern.

<12> A method for producing the structure as described in any one of <1> to <8>, the method comprising:
forming first pixels constituted of a laminate including a color filter and a near-infrared cut filter on a light-receiving surface of the light-receiving element; and
forming second pixels including a near-infrared transmitting filter on the light-receiving surface of the light-receiving element at a position different from a region where the first pixels are provided,
in which the near-infrared cut filter is formed by applying the dry film as described in <10> onto a light-receiving surface of a light-receiving element to form a dry film layer and subjecting the dry film layer to a photolithography method or a dry etching method to form a pattern.

<13> An optical sensor comprising the structure as described in any one of <1> to <8>.

<14> An image display device comprising the structure as described in any one of <1> to <8>.

According to the present invention, it is possible to provide a structure having a near-infrared cut filter, which has good heat resistance and spectral characteristics and causes generation of voids to be suppressed. Furthermore, it is possible to provide a composition for a near-infrared cut filter and a dry film, each of which is used for the above-mentioned structure. In addition, it is possible to provide a method for producing the above-mentioned structure, an optical sensor, and an image display device.

DESCRIPTION OF THE PREFERRED EMBODIMENTS

Figure 1:
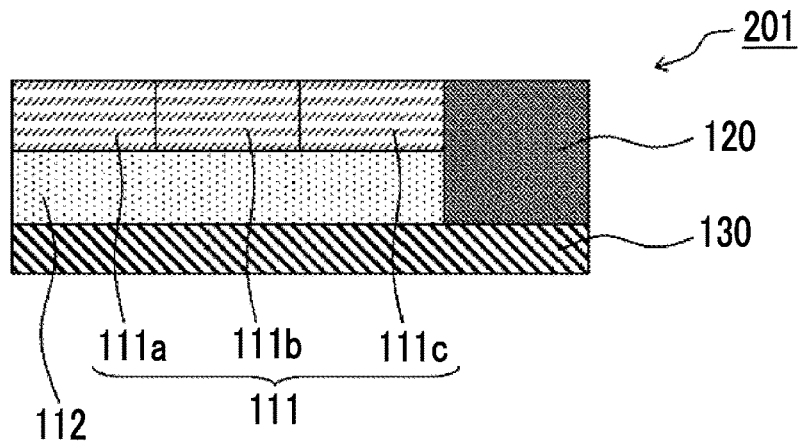
FIG. 1 is a schematic view showing an embodiment of the structure of the present invention.

Hereinafter, the contents of the present invention will be described in detail.

In the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group (atomic group) includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, and electron beams.

In the present specification, "(meth)allyl" represents either or both of allyl and methallyl, "(meth)acrylate" represents either or both of acrylate and methacrylate, "(meth) acryl" represents either or both of acryl and methacryl, and "(meth)acryloyl" represents either or both of acryloyl and methacryloyl.

In the present specification, a weight-average molecular weight and a number-average molecular weight are each defined as a value in terms of polystyrene, as measured by means of gel permeation chromatography (GPC). In the present specification, the weight-average molecular weight (Mw) and the number-average molecular weight (Mn) can be determined, for example, by using HLC-8220 (manufactured by Tosoh Corporation), TSKgel Super AWM-H (manufactured by Tosoh Corporation, 6.0 mm ID (inner diameter))×15.0 cm) as columns, and a 10-mmol/L lithium bromide N-methylpyrrolidinone (NMP) solution as an eluant.

In the present specification, near-infrared rays refer to light (electromagnetic waves) at a wavelength of 700 to 2,500 nm.

In the present specification, the total solid content refers to a total mass of the components excluding a solvent from all the components of a composition.

In the present specification, a term "step" not only means an independent step but also includes a step which is not clearly distinguished from other steps in a case where an intended action of the step is accomplished.

<Structure>

The structure of an embodiment of the present invention includes:

an light-receiving element, first pixels constituted of a laminate including a color filter and a near-infrared cut filter, provided on a light-receiving surface of the light-receiving element, and second pixels including a near-infrared transmitting filter, provided on the light-receiving surface of the light-receiving element at a position different from a region where the first pixels are provided, in which the near-infrared cut filter includes a near-infrared absorbing colorant, a resin having a glass transition temperature of 100° C. or higher, and a surfactant, and the near-infrared absorbing colorant is at least one selected from a colorant compound having a cation and an anion in the same molecule, a colorant compound which is a salt of a cationic chromophore and a counter anion, or a colorant compound which is a salt of an anionic chromophore and a counter cation.

According to the present invention, by adopting the structure as described above, it is possible to obtain a structure having a near-infrared cut filter which has good heat resistance and spectral characteristics and causes generation of voids to be suppressed. A reason for obtaining such an effect is presumed to be as follows.

That is, the colorant compound having a cation and an anion in the same molecule, the colorant compound which is a salt of a cationic chromophore and a counter anion, and the colorant compound which is a salt of an anionic chromophore and a counter cation are each a colorant compound that develops a spectrum by highest occupied orbital (HOMO)-lowest unoccupied orbital (LUMO) transition, and the absorption peak is steep. For this reason, by using the near-infrared absorbing colorant consisting of these colorant compounds, the visible transparency can be enhanced and a near-infrared cut filter having excellent spectral characteristics can be obtained. Further, the near-infrared absorbing colorant consisting of these colorant compounds tends to have high hydrophilicity, and therefore, in a case where the near-infrared absorbing colorant is used in combination with a surfactant, it is possible to suppress the floating and the like of the near-infrared absorbing colorant on the surface of the near-infrared cut filter while unevenly distributing the surfactant on the surface of the near-infrared cut filter.

In addition, with the resin having a glass transition temperature of 100° C. or higher included in the near-infrared cut filter, it is possible to firmly hold the near-infrared absorbing colorant in the near-infrared cut filter, and it is thus possible to effectively suppress the near-infrared absorbing colorant from being unevenly distributed on the surface. For this reason, even in a case where the structure of the embodiment of the present invention is exposed to a high temperature, it is possible to suppress the decomposition, modification, and the like of the near-infrared absorbing colorant included in the near-infrared cut filter, and thus, the heat resistance of the near-infrared cut filter can be improved. Further, even in a case where the structure of the embodiment of the present invention is exposed to a high temperature, it is possible to suppress the decomposition of the resin contained in the near-infrared cut filter. In addition, as described above, in a case where the near-infrared cut filter includes the surfactant and the resin having a glass transition temperature of 100° C. or higher, it is possible to effectively suppress the near-infrared absorbing colorant from being unevenly distributed on the surface of the near-infrared cut filter, and therefore, even in a case where the structure of the embodiment of the present invention is exposed to a high temperature, it is possible to suppress the decomposition of the near-infrared absorbing colorant included in the near-infrared cut filter. For this reason, it is possible to suppress the generation of voids on the surface of the near-infrared cut filter.

Moreover, for example, as shown in FIG. 1, in the case where a near-infrared cut filter 112 and a color filter 111 are laminated in this order on a light-receiving element to form first pixels, it is assumed that the surfactant is unevenly distributed on the surface in the vicinity of the interface between the near-infrared cut filter 112 and the color filter 111. For this reason, it is presumed that the near-infrared absorbing colorant included in the near-infrared cut filter 112 can hardly exist at an interface with the color filter 111, and thus, more excellent heat resistance and an effect of suppressing voids can be obtained. In addition, it is also possible to suppress a color transfer between the color filter 111 and the near-infrared cut filter 112, and the like.

Moreover, in the near-infrared cut filter, the resin having a glass transition temperature of 100° C. or higher preferably includes a cyclic olefin resin having a glass transition temperature of 100° C. or higher. For the near-infrared cut filter, in a case where a cyclic olefin resin having a glass transition temperature of 100° C. or higher is used, more excellent heat resistance and an effect of suppressing voids can be obtained. Since it is difficult for the cyclic olefin resin to show a π system-hydrophilic group interaction with the surfactant, it is presumed that the surfactant is hardly taken into the resin and is easily unevenly distributed on the surface of the near-infrared cut filter. Above all, in a case where the near-infrared absorbing colorant is a squarylium compound or a croconium compound, more excellent heat resistance can be easily obtained, and in a case where the near-infrared absorbing colorant is the squarylium compound, particularly excellent heat resistance can be easily obtained. A reason why such an effect is obtained is presumed to be that the cyclic olefin resin effectively suppresses a rotational movement of a square acid of the squarylium compound, and it is thus possible to effectively suppress a bond around the square acid of the squarylium compound from being cut.

Furthermore, for the near-infrared cut filter, in a case where a fluorine-based surfactant is used as the surfactant, more excellent heat resistance and an effect of suppressing voids can be obtained. Above all, in a case where the near-infrared absorbing colorant is a squarylium compound or a croconium compound, more excellent heat resistance can be easily obtained, and in a case where the near-infrared absorbing colorant is the squarylium compound, particularly excellent heat resistance can be easily obtained. Since the squarylium compound and the croconium compound generally have a cation and an anion in the same molecule, they have a high repulsive force against the surfactant. Furthermore, since the fluorine-based surfactant has relatively high hydrophobicity, it is possible to more significantly suppress the migration of the near-infrared absorbing colorant onto the surface of the near-infrared cut filter by combining those ions, and thus more excellent heat resistance and an effect of suppressing voids can be obtained. In addition, in a case where a fluorine-based surfactant and a cyclic olefin resin having a glass transition temperature of 100° C. or higher are used in combination, it is presumed that the surfactant is easily unevenly distributed on the surface of the near-infrared cut filter, and more excellent heat resistance and an effect of suppressing voids can be obtained.

In the structure of the embodiment of the present invention, the first pixels and the second pixels may be arranged at different positions on the light-receiving element, but it is preferable that both are two-dimensionally arranged on the light-receiving element. In the present invention, an expression that the first pixels and the second pixels are two-dimensionally arranged means that at least a part of both the pixels are present on the same plane. In the structure of the embodiment of the present invention, the first pixels and the second pixels are preferably formed on the same plane. Hereinafter, the structure of the embodiment of the present invention will be described in detail with reference to the drawings.

FIG. 1 shows an embodiment of a structure of the present invention, in which a structure 201 has first pixels consisting of a laminate of a near-infrared cut filter 112 and a color filter 111 on a light-receiving element 130, and second pixels consisting of a near-infrared transmitting filter 120.

Furthermore, in the embodiment shown in FIG. 1, the color filter 111 is constituted of colored pixels 111a, 111b, and 111c, but the color filter 111 may be constituted of only colored pixels of a single color, may be constituted of colored pixels of two colors, or may be constituted of colored pixels of four or more colors. It can be appropriately selected depending on uses and purposes.

Figure 2:
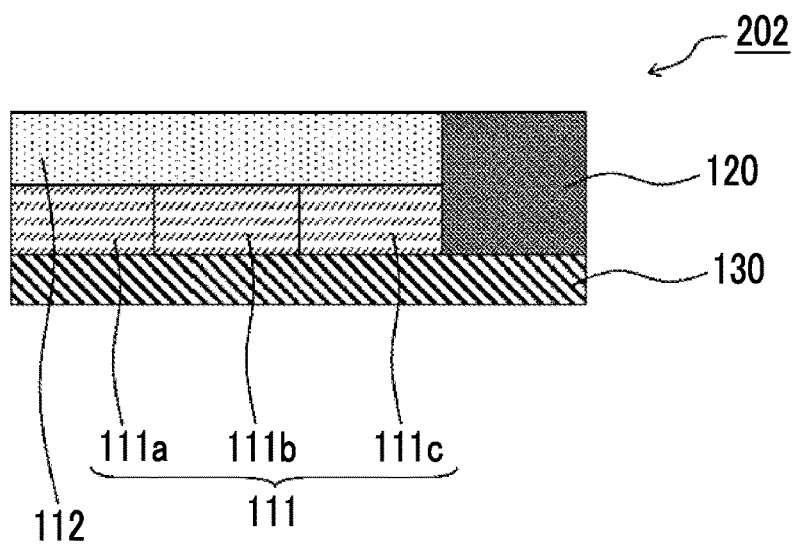
FIG. 2 is a schematic view showing another embodiment of the structure of the present invention.

Moreover, in the embodiment shown in FIG. 1, the first pixels are formed by laminating the near-infrared cut filter 112/the color filter 111 in this order on the light-receiving element 130, but the lamination order of the near-infrared cut filter 112/the color filter 111 is not particularly limited, and the first pixels may also be formed by laminating the color filter 111/the near-infrared cut filter 112 in this order on the light-receiving element 130, as shown in FIG. 2.

Figure 3:
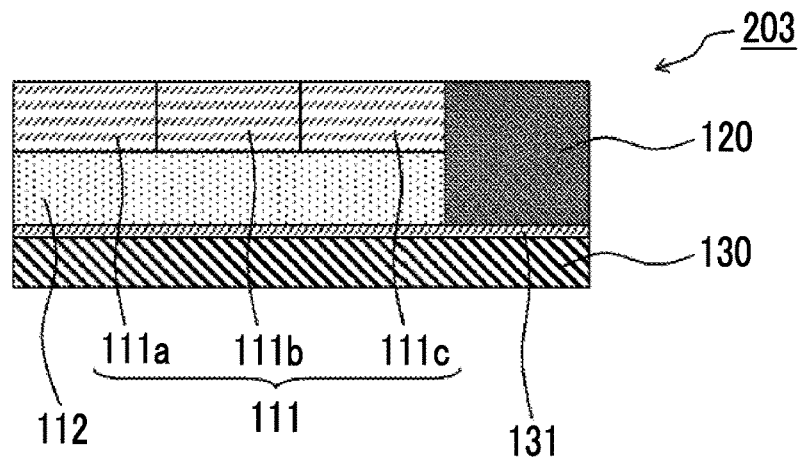
FIG. 3 is a schematic view showing still another embodiment of the structure of the present invention.

Furthermore, in the embodiment shown in FIG. 1, the first pixels (a laminate of the color filter 111 and the near-infrared cut filter 112) and the second pixels (the near-infrared transmitting filter 120) are directly formed, respectively, on the light-receiving element 130 but may also be formed on the light-receiving element 130 via an underlayer 131 as shown in FIG. 3.

Figure 4:
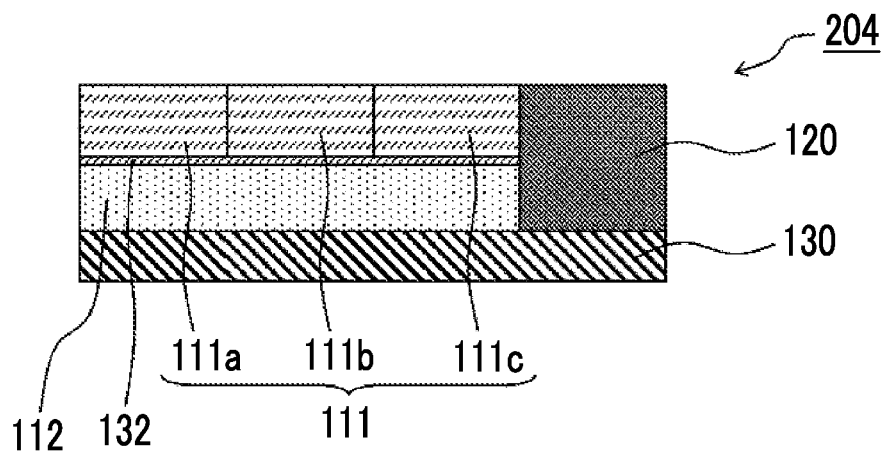
FIG. 4 is a schematic view showing yet still another embodiment of the structure of the present invention.
Figure 5:
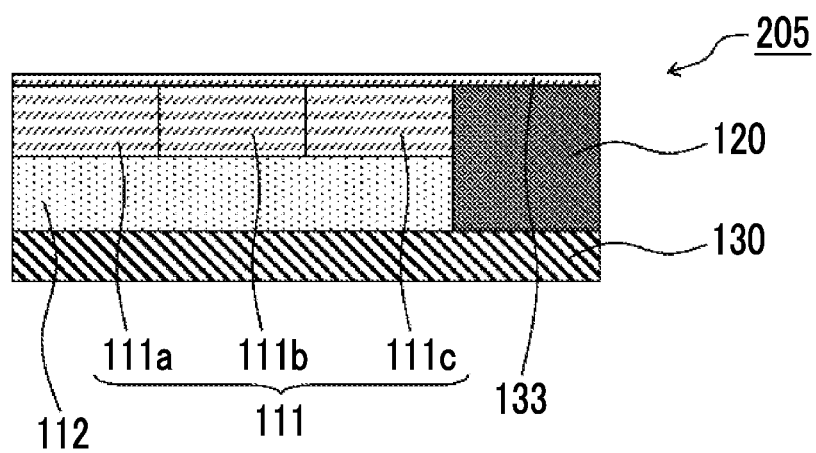
FIG. 5 is a schematic view showing even yet still another embodiment of the structure of the present invention.

In addition, in the embodiment shown in FIG. 1, the first pixels are constituted of a laminate of the color filter 111 and the near-infrared cut filter 112, but an interlayer 132 may be included between the color filter 111 and the near-infrared cut filter 112 as shown in FIG. 4. The interlayer 132 may have only one layer or two or more layers. Further, as shown in FIG. 5, a planarization layer 133 may be formed on the filter on the outermost layer side. The planarization layer 133 may be only one layer or two or more layers. Further, in the structure 204 of FIG. 4, the laminate of the color filter 111, the interlayer 132, and the near-infrared cut filter 112 corresponds to the first pixels. In the structure 205 of FIG. 5, the laminate of the color filter 111, the near-infrared cut filter 112, and the planarization layer 133 corresponds to the first pixels, and the laminate of the near-infrared transmitting filter 120 and the planarization layer 133 corresponds to the second pixels.

Furthermore, in the embodiment shown in FIG. 1, a height difference between the upper surfaces of the first pixels and the second pixels is substantially the same, but the height difference between the upper surfaces of both pixels may be different. In the structure of the embodiment of the present invention, the height difference between the upper surfaces of the first pixels and the second pixels is preferably 20% or less, more preferably 10% or less, and still more preferably 5% or less of the film thickness of the thickest pixel. In a case where the height difference between the upper surfaces of the pixels is 20% or less of the film thickness of the thickest pixel, the distortion of microlenses can be reduced with the microlenses being arranged on the upper surface of each pixel, and thus, a clear image with less distortion, ambient light with less noise, and the like can be detected with high sensitivity. Further, a step of producing a filter can be simplified, and thus, a filter producing cost can be reduced. In order to reduce the height difference between the upper surfaces of the pixels, a method in which a film thickness at the time of forming each pixel is adjusted or the upper surface after forming each pixel is polished and planarized, or a planarization layer is formed on an upper surface and/or a lower surface of any pixel to adjust the height of the pixels, and other methods can be cited.

In addition, in the embodiment shown in FIG. 1, the first pixels and the second pixels are adjacent to each other, but an aspect in which the first pixels and the second pixels are not in contact with each other can also be used. From the viewpoint of resolution, it is preferable that the first pixels and the second pixels are adjacent to each other.

<<Light-Receiving Element>>

The light-receiving element 130 used in the structure of the embodiment of the present invention is not particularly limited, and any light-receiving element can be preferably used as long as it is an element having a function of generating current or voltage by a photovoltaic effect. Examples thereof include an element in which a charge coupled device (CCD), a complementary metal oxide semiconductor (CMOS), or the like is formed on a known semiconductor substrate such as a silicon substrate.

<<First Pixels>>

In the structure of the embodiment of the present invention, the first pixels are constituted of a laminate including the color filter 111 and the near-infrared cut filter 112.

In the first pixels, a ratio of the thickness of the color filter 111 to the thickness of the near-infrared cut filter 112 is the thickness of the color filter 111/the thickness of the near-infrared cut filter 112=preferably (1/10) to (10/1), and more preferably (1/5) to (5/1).

The thickness of the near-infrared cut filter 112 is preferably 20 μm or less, more preferably 10 μm or less, and still more preferably 5 μm or less. The lower limit is not particularly limited, but can be 0.01 μm, for example.

The thickness of the color filter 111 is preferably 20 μm or less, more preferably 10 μm or less, and still more preferably 5 μm or less. The lower limit is not particularly limited, but can be 0.01 μm, for example.

A line width of the color filter 111 (in a case where the color filter 111 has a plurality of colored pixels, the line width of each colored pixel) is preferably 0.1 to 100.0 µm. The lower limit is preferably 0.1 µm or more, and more preferably 0.3 µm or more. The upper limit is preferably 50.0 µm or less, and more preferably 30.0 µm or less.

The thickness of the first pixels (the total thickness of the near-infrared cut filter 112, the color filter 111, and other layers in a case where such other layers are included, in addition to the near-infrared cut filter 112 and the color filter 111) is preferably 20 µm or less, more preferably 10 µm or less, and particularly preferably 5 µm or less.

The lower limit is not particularly limited, but can be 0.01 for example.

<<<Near-Infrared Cut Filter>>>

First, the near-infrared cut filter 112 used for the first pixels will be described.

(Near-Infrared Absorbing Colorant)

The near-infrared cut filter 112 includes a near-infrared absorbing colorant. The near-infrared absorbing colorant used in the present invention is at least one selected from a colorant compound having a cation and an anion in the same molecule, a colorant compound which is a salt of a cationic chromophore and a counter anion, or a colorant compound which is a salt of an anionic chromophore and a counter cation. Here, a case where the colorant compound has a cation and an anion in the same molecule means that the cation and the anion are present in the same molecule via a covalent bond to form a betaine structure (intramolecular salt structure). For example, a compound having the following structure is a colorant compound having a cation and an anion in the same molecule. In the structural formulae below, tBu is a tert-butyl group and iPr is an isopropyl group.

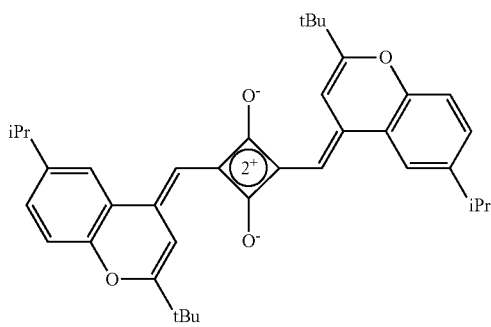

The near-infrared absorbing colorant is preferably a compound having a π-conjugated plane containing a monocyclic or fused aromatic ring. The number of atoms other than hydrogen constituting a π-conjugated plane contained in the near-infrared absorbing colorant is preferably 14 or more, more preferably 20 or more, still more preferably 25 or more, and particularly preferably 30 or more. The upper limit is, for example, preferably 80 or less, and more preferably 50 or less.

The π-conjugated plane contained in the near-infrared absorbing colorant preferably includes two or more monocyclic or fused aromatic rings, more preferably includes three or more monocyclic or fused aromatic rings, and still more preferably includes four or more monocyclic or fused aromatic rings. The upper limit is preferably 100 or less, more preferably 50 or less, and still more preferably 30 or less. Examples of the above-mentioned aromatic ring include a benzene ring, a naphthalene ring, an indene ring, an azulene ring, a heptalene ring, an indacene ring, a perylene ring, a pentacene ring, a quarterylene group, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, a pyran ring, a thiopyran ring, and a fused ring having such the rings.

The near-infrared absorbing colorant may be either a pigment or a dye.

In the present invention, the near-infrared absorbing colorant is preferably a compound having a maximum absorption wavelength in the wavelength range of 700 to 1,800 nm, more preferably a compound having a maximum absorption wavelength in the wavelength range of 700 to 1,300 nm, and still more preferably a compound having a maximum absorption wavelength in a range of 700 to 1,000 nm. Further, the near-infrared absorbing colorant has an Amax/A550 which is a ratio of an absorbance Amax at the maximum absorption wavelength to an absorbance A550 at a wavelength of 550 nm of preferably 50 to 500, and more preferably 100 to 400.

In the present invention, the near-infrared absorbing colorant is preferably at least one selected from a squarylium compound, a cyanine compound, a croconium compound, or an iminium compound, more preferably at least one selected from the squarylium compound, the cyanine compound, or the croconium compound, still more preferably the squarylium compound or the croconium compound, and particularly preferably the squarylium compound.

(Squarylium Compound)

As the squarylium compound, a compound represented by Formula (SQ1) is preferable.

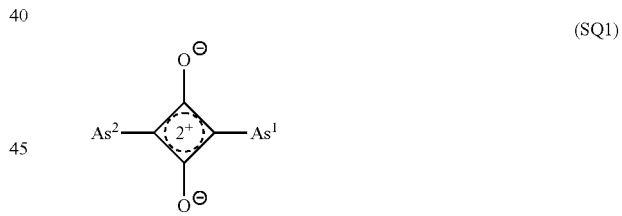
(SQ1)

In the formula, $As^1$ and $As^2$ each independently represent an aryl group, a heterocyclic group, or a group represented by Formula (As-1);

(As-1)

In the formula, * represents a bond,
$Rs^1$ to $Rs^3$ each independently represent a hydrogen atom or an alkyl group,
$As^3$ represents a heterocyclic group,
$n_{s1}$ represents an integer of 0 or more,
$Rs^1$ and $Rs^2$ may be bonded to each other to form a ring, Rs¹ and As³ may be bonded to each other to form a ring,
Rs² and Rs³ may be bonded to each other to form a ring, and in a case where $n_{s1}$ is 2 or more, a plurality of Rs²'s and Rs³'s may be the same as or different from each other.

The aryl group represented by each of As¹ and As² preferably has 6 to 48 carbon atoms, more preferably has 6 to 22 carbon atoms, and particularly preferably has 6 to 12 carbon atoms.

The heterocyclic group represented by each of As¹, As², and As³ is preferably a 5- or 6-membered heterocyclic group. Further, the heterocyclic group is preferably a monocyclic heterocyclic group or a fused-ring heterocyclic group having a fusion number of 2 to 8, more preferably the monocyclic heterocyclic group or a fused-ring heterocyclic group having a fusion number of 2 to 4, still more preferably a monocyclic heterocyclic group or a fused-ring heterocyclic group having a fusion number of 2 or 3, and particularly preferably the monocyclic heterocyclic group or the fused-ring heterocyclic group having a fusion number of 2. Examples of the heteroatom constituting the ring of the heterocyclic group include a nitrogen atom, an oxygen atom, and a sulfur atom, with the nitrogen atom or the sulfur atom being preferable. The number of heteroatoms constituting the ring of the heterocyclic group is preferably 1 to 3, and more preferably 1 or 2.

Rs¹ to Rs³ in Formula (As-1) each independently represent a hydrogen atom or an alkyl group. The alkyl group represented by each of Rs¹ to Rs³ preferably has 1 to 20 carbon atoms, more preferably has 1 to 15 carbon atoms, and still more preferably has 1 to 8 carbon atoms. The alkyl group may be in any of linear, branched, and cyclic forms, but is preferably linear or branched. Rs¹ to Rs³ are each preferably a hydrogen atom.

$n_{s1}$ in Formula (As-1) represents an integer of 0 or more. $n_{s1}$ is preferably an integer of 0 to 2, more preferably 0 or 1, and still more preferably 0.

In Formula (As-1), Rs¹ and Rs² may be bonded to each other to form a ring, Rs¹ and As³ may be bonded to each other to form a ring, and Rs² and Rs³ may be bonded to each other to form a ring. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the substituent T which will be described later.

In Formula (SQ1), the group represented by each of As¹ and As² preferably has a substituent. Examples of the substituent include the substituent T which will be described later.

In Formula (SQ1), it is preferable that As¹ and As² are each independently an aryl group or a heterocyclic group, or that As¹ and As² are each independently a group represented by Formula (As-1).

(Substituent T)

Examples of the substituent T include a halogen atom, a cyano group, a nitro group, an alkyl group, an alkenyl group, an alkynyl group, an aryl group, a heteroaryl group, —ORt¹, —CORt¹, —COORt¹, —OCORt¹, —NRt¹Rt², —NHCORt¹, —CONRt¹Rt², —NHCONRt¹Rt², —NHCOORt¹, —SRt¹, —SO₂Rt¹, —SO₂ORt¹, —NHSO₂Rt¹, or —SO₂NRt¹Rt². Rt¹ and Rt² each independently represent a hydrogen atom, an alkyl group, an alkenyl group, an alkynyl group, an aryl group, or a heteroaryl group. Rt¹ and Rt² may be bonded to each other to form a ring. Further, in a case where Rt¹ in —COORt¹ is hydrogen, the hydrogen atom may be dissociated and may be in the form of a salt. In addition, in a case where Rt¹ in —SO₂ORt¹ is a hydrogen atom, the hydrogen atom may be dissociated and may be in the form of a salt.

Examples of the halogen atom include a fluorine atom, a chlorine atom, a bromine atom, and an iodine atom.

The alkyl group preferably has 1 to 20 carbon atoms, more preferably 1 to 15, and still more preferably 1 to 8. The alkyl group may be in any of linear, branched, and cyclic forms, but is preferably linear or branched.

The alkenyl group preferably has 2 to 20 carbon atoms, more preferably has 2 to 12 carbon atoms, and particularly preferably has 2 to 8 carbon atoms. The alkenyl group may be linear, branched or cyclic, and is preferably linear or branched.

The alkynyl group preferably has 2 to 40 carbon atoms, more preferably has 2 to 30 carbon atoms, and particularly preferably has 2 to 25 carbon atoms. The alkynyl group may be in any of linear, branched, and cyclic forms, but is preferably linear or branched.

The aryl group preferably has 6 to 30 carbon atoms, more preferably has 6 to 20 carbon atoms, and particularly preferably has 6 to 12 carbon atoms.

The heteroaryl group is preferably a monocyclic heteroaryl group or a fused-ring heteroaryl group having a fusion number of 2 to 8, and more preferably a monocyclic heteroaryl group or a fused-ring heteroaryl group having a fusion number of 2 to 4. The number of heteroatoms constituting the ring of the heteroaryl group is preferably 1 to 3. The heteroatom constituting the ring of the heteroaryl group is preferably a nitrogen atom, an oxygen atom, or a sulfur atom. The heteroaryl group is preferably a 5- or 6-membered ring. The number of carbon atoms constituting the heteroaryl group is preferably 3 to 30, more preferably 3 to 18, and still more preferably 3 to 12.

The alkyl group, the alkenyl group, the alkynyl group, the aryl group, and the heteroaryl group may each have a substituent or may be unsubstituted. Examples of the substituent include the substituents described as the above-mentioned substituent T.

Moreover, the cation in Formula (SQ1) is present in the form of not being localized as below.

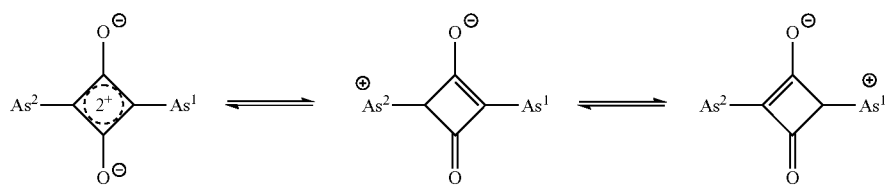

The squarylium compound is preferably a compound represented by Formula (SQ2) or a compound represented by Formula (SQ3).

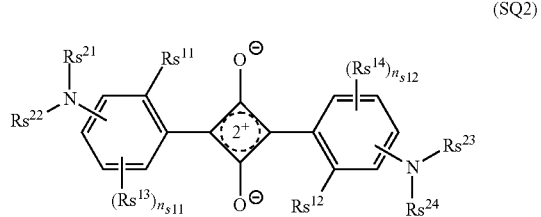

(SQ2)

$Rs^{11}$ and $Rs^{12}$ each independently represent a hydrogen atom or a substituent;
$Rs^{13}$ and $Rs^{14}$ each independently represent a substituent;
$n_{s11}$ and $n_{s12}$ each independently represent an integer of 0 to 3;
in a case where $n_{s11}$ is 2 or more, two $Rs^{13}$'s may be bonded to each other to form a ring;
in a case where $n_{s12}$ is 2 or more, two $Rs^{14}$'s may be bonded to each other to form a ring;
$Rs^{21}$ to $Rs^{24}$ each independently represent an alkyl group, an aryl group or a heteroaryl group; and
$Rs^{21}$ and $Rs^{22}$, $Rs^{23}$ and $Rs^{24}$, $Rs^{21}$ and $Rs^{13}$, $Rs^{22}$ and $Rs^{13}$, $Rs^{23}$ and $Rs^{14}$, $Rs^{24}$ and $Rs^{14}$, $Rs^{21}$ and a ring formed by mutual bonding of two $Rs^{13}$'s, and $Rs^{23}$ and a ring formed by mutual bonding of two $Rs^{14}$'s may be bonded to each other to form a ring.

In Formula (SQ2), as the substituent represented by each of $Rs^{11}$ and $Rs^{12}$, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable. R$^{X1}$ and R$^{X2}$ each independently represent a hydrogen atom or a substituent. Examples of the substituent represented by each of R$^{X1}$ and R$^{X2}$ include an alkyl group, an aryl group, and a heteroaryl group, with the alkyl group being preferable.

In Formula (SQ2), examples of the substituent represented by each of $Rs^{13}$ and $Rs^{14}$ include the above-mentioned substituent T.

In Formula (SQ2), $Rs^{21}$ to $Rs^{24}$ each independently represent an alkyl group, an aryl group, or a heteroaryl group. The alkyl group preferably has 1 to 20 carbon atoms, more preferably 1 to 15, and still more preferably 1 to 8. The alkyl group may be in any of linear, branched, and cyclic forms, but is preferably linear or branched. The aryl group preferably has 6 to 30 carbon atoms, more preferably has 6 to 20 carbon atoms, and particularly preferably has 6 to 12 carbon atoms. The heteroaryl group is preferably a monocyclic heteroaryl group or a fused-ring heteroaryl group having a fusion number of 2 to 8, and more preferably a monocyclic heteroaryl group or a fused-ring heteroaryl group having a fusion number of 2 to 4. The number of heteroatoms constituting the ring of the heteroaryl group is preferably 1 to 3. The heteroatom constituting the ring of the heteroaryl group is preferably a nitrogen atom, an oxygen atom, or a sulfur atom. The heteroaryl group is preferably a 5- or 6-membered ring. The number of carbon atoms constituting the heteroaryl group is preferably 3 to 30, more preferably 3 to 18, and still more preferably 3 to 12. The alkyl group, the aryl group, and the heteroaryl group may have a substituent or may be unsubstituted. Examples of the substituent include the substituents described as the above-mentioned substituent T.

In Formula (SQ2), $n_{s11}$ and $n_{s12}$ each independently represent an integer of 0 to 3, and preferably represent an integer of 0 to 2.

In Formula (SQ2), in a case where $n_{s11}$ is 2 or more, two $Rs^{13}$'s may be bonded to each other to form a ring, and in a case where $n_{s12}$ is 2 or more, two $Rs^{14}$'s may be bonded to each other to form a ring. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the above-mentioned substituent T.

In Formula (SQ2), $Rs^{21}$ and $Rs^{22}$, $Rs^{23}$ and $Rs^{24}$, $Rs^{21}$ and $Rs^{13}$, $Rs^{22}$ and $Rs^{13}$, $Rs^{23}$ and $Rs^{14}$, or $Rs^{24}$ and $Rs^{14}$ may be bonded to each other to form a ring. Further, in a case where two $Rs^{13}$'s are bonded to each other to form a ring, $Rs^{21}$ and a ring formed by bonding the two $Rs^{13}$'s may be bonded to each other to form a ring. In addition, in a case where two $Rs^{14}$'s are bonded to each other to form a ring, $Rs^{23}$ and a ring formed by bonding the two $Rs^{14}$'s to each other may further be bonded to each other to form a ring. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the above-mentioned substituent T. Further, a case where $Rs^{21}$ and a ring formed by mutual bonding of two $Rs^{13}$'s are bonded to each other to form a ring, the ring has, for example, the following structure. In the following, A1 is a ring formed by mutual bonding of two $Rs^{13}$'s, A2 is a ring formed by mutual bonding of a ring A1 and $Rs^{22}$, $Rs^{22}$ is an alkyl group, an aryl group, or a heteroaryl group, $Rs^{11}$ and $Rs^{13}$ are each a hydrogen atom or a substituent, and * is a bond. The same applies to a case where $Rs^{23}$ and a ring formed by mutual bonding of two $Rs^{14}$'s are bonded to each other to further form a ring.

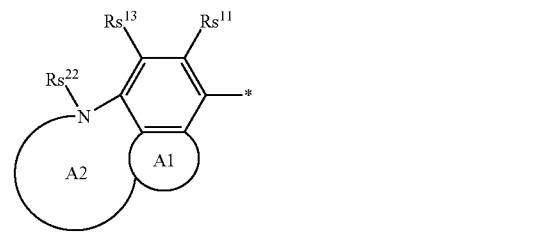

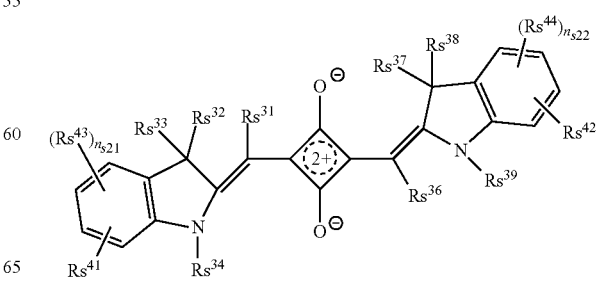

(SQ3)

Rs$^{31}$ to Rs$^{34}$ and Rs$^{36}$ to Rs$^{39}$ each independently represent a hydrogen atom or an alkyl group;

Rs$^{31}$ and Rs$^{32}$, Rs$^{31}$ and Rs$^{34}$, Rs$^{32}$ and Rs$^{33}$, Rs$^{36}$ and Rs$^{37}$, Rs$^{36}$ and Rs$^{39}$, or Rs$^{37}$ and Rs$^{38}$ may be bonded to each other to form a ring;

Rs$^{41}$ and Rs$^{42}$ each independently represent a hydrogen atom or a substituent;

Rs$^{43}$ and Rs$^{44}$ each independently represent a substituent;

$n_{s21}$ and $n_{s22}$ each independently represent an integer of 0 to 3;

in a case where $n_{s21}$ is 2 or more, two Rs$^{43}$'s may be bonded to each other to form a ring; and in a case where $n_{s22}$ is 2 or more, two Rs$^{44}$'s may be bonded to each other to form a ring.

In Formula (SQ3), the alkyl group represented by each of Rs$^{31}$ to Rs$^{34}$ and Rs$^{36}$ to Rs$^{39}$ preferably has 1 to 20 carbon atoms, more preferably has 1 to 15 carbon atoms, and still more preferably has 1 to 8 carbon atoms. The alkyl group may be in any of linear, branched, and cyclic forms, but is preferably linear or branched. These groups may have a substituent or may be unsubstituted. Examples of the substituent include the substituents described as the above-mentioned substituent T.

In Formula (SQ3), Rs$^{31}$ and Rs$^{32}$, Rs$^{31}$ and Rs$^{34}$, Rs$^{32}$ and Rs$^{33}$, Rs$^{36}$ and Rs$^{37}$, Rs$^{36}$ and Rs$^{39}$, or Rs$^{37}$ and Rs$^{38}$ may each be bonded to each other to form a ring. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the above-mentioned substituent T.

In Formula (SQ3), examples of the substituent represented by each of Rs$^{41}$ and Rs$^{42}$ and the substituent represented by each of Rs$^{43}$ and Rs$^{44}$ include the above-mentioned substituent T.

In Formula (SQ3), $n_{s21}$ and $n_{s22}$ each independently represent an integer of 0 to 3, and preferably an integer of 0 to 2.

In Formula (SQ3), in a case where $n_{s21}$ is 2 or more, two Rs$^{43}$'s may be bonded to each other to form a ring, and in a case where $n_{s22}$ is 2 or more, two Rs$^{44}$'s may be bonded to each other to form a ring. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the above-mentioned substituent T.

As the squarylium compound, a compound represented by Formula (SQ4) is preferable.

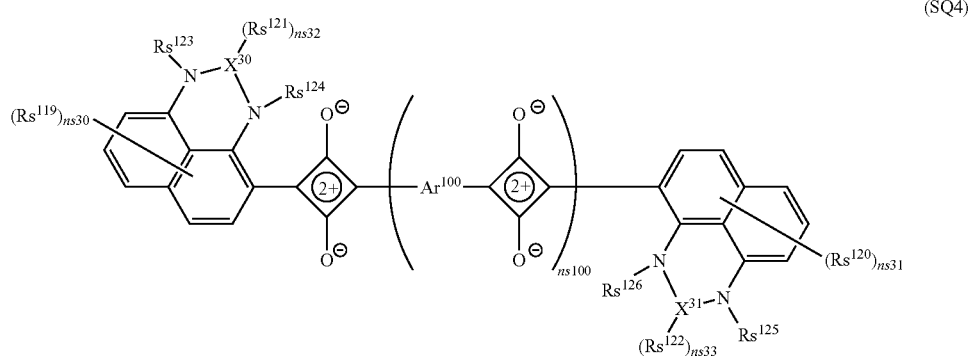

(SQ4)

In the formula, Rs$^{119}$ and Rs$^{120}$ each independently represent a substituent, Rs$^{121}$ to Rs$^{126}$ each independently represent a hydrogen atom or a substituent, X$^{30}$ and X$^{31}$ each independently represent a carbon atom, a boron atom, or C(=O), in a case where X$^{30}$ is a carbon atom, ns32 is 2, in a case where X$^{30}$ is a boron atom, ns32 is 1, and in a case where X$^{30}$ is C(=O), ns32 is 0, in a case where X$^{31}$ is a carbon atom, ns33 is 2, in a case where X$^{31}$ is a boron atom, ns33 is 1, and in a case where X$^{31}$ is C(=O), ns33 is 0, ns30 and ns31 each independently represent an integer of 0 to 5, in a case where ns30 is 2 or more, a plurality of Rs$^{119}$'s may be the same as or different from each other, and two Rs$^{119}$'s of the plurality of Rs$^{119}$'s may be bonded to each other to form a ring, in a case where ns31 is 2 or more, a plurality of Rs$^{120}$'s may be the same as or different from each other, and two Rs$^{120}$'s of the plurality of Rs$^{120}$'s may be bonded to each other to form a ring, in a case where ns32 is 2, two Rs$^{121}$'s may be the same as or different from each other, and two Rs$^{121}$'s may be bonded to each other to form a ring, in a case where ns33 is 2, two Rs$^{122}$'s may be the same as or different from each other, and two Rs$^{122}$'s may be bonded to each other to form a ring, and Ar$^{100}$ represents an aryl group or a heteroaryl group, and ns100 represents an integer of 0 to 2.

As the squarylium compound, a compound represented by Formula (SQ5) is preferable.

(SQ5)

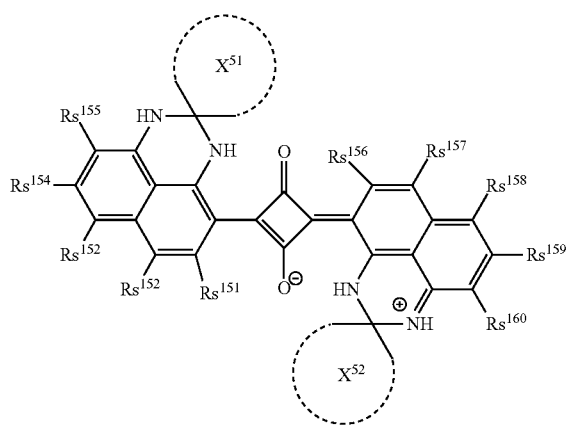

In the formula, $Rs^{151}$ to $Rs^{160}$ each independently represent a hydrogen atom, an alkyl group, a sulfo group, —$SO_3M^1$, or a halogen atom. $M^1$ represents an inorganic or organic cation. $X^{51}$ and $X^{52}$ each independently represent a ring structure. $Rs^{152}$ and $Rs^{153}$ may be bonded to each other to form a ring, and $Rs^{157}$ and $Rs^{158}$ may be bonded to each other to form a ring.

As the squarylium compound, a compound represented by Formula (SQ6) is preferable.

(SQ6)

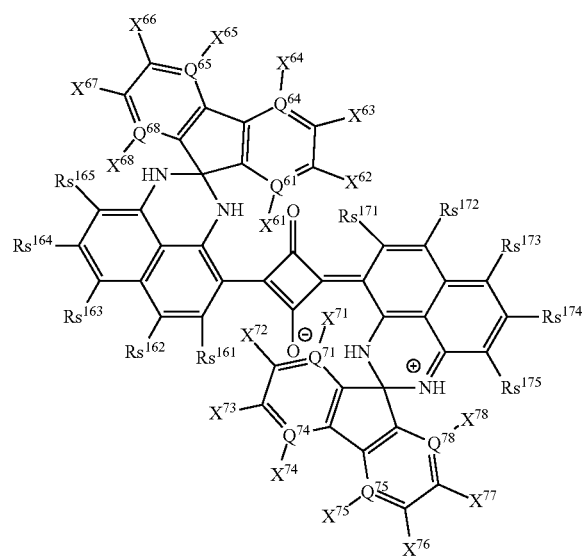

In the formula, $Q^{61}$, $Q^{64}$, $Q^{65}$, $Q^{68}$, $Q^{71}$, $Q^{74}$, $Q^{75}$, and $Q^{78}$ each independently represent a carbon atom or a nitrogen atom.

In a case where $Q^{61}$ is a nitrogen atom, $X^{61}$ is absent. In a case where $Q^{64}$ is a nitrogen atom, $X^{64}$ is absent. In a case where $Q^{65}$ is a nitrogen atom, $X^{65}$ is absent. In a case where $Q^{68}$ is a nitrogen atom, $X^{68}$ is absent. In a case where $Q^{71}$ is a nitrogen atom, $X^{71}$ is absent. In a case where $Q^{74}$ is a nitrogen atom, $X^{74}$ is absent. In a case where $Q^{75}$ is a nitrogen atom, $X^{75}$ is absent. In a case where $Q^{78}$ is a nitrogen atom, $X^{78}$ is absent.

$Rs^{161}$ to $Rs^{165}$ and $Rs^{171}$ to $Rs^{175}$ each independently represent a hydrogen atom, an alkyl group, a sulfo group, —$SOM^2$, or a halogen atom. $M^2$ represents an inorganic or organic cation, and $Rs^{162}$ and $Rs^{163}$, or $Rs^{172}$ and $Rs^{173}$ may be bonded to each other to form a ring.

$X^{61}$ to $X^{68}$ and $X^{71}$ to $X^{78}$ each independently represent a hydrogen atom, an alkyl group, an alkenyl group, an aryl group, an aralkyl group, an alkoxy group, an aryloxy group, a hydroxyl group, an amino group, —$NR^{a1}R^{a2}$, a sulfo group, —$SO_2NR^{a1}R^{a2}$, —$COOR^{a3}$, —$CONR^{a1}R^{a2}$, a nitro group, a cyano group, or a halogen atom. $R^{a1}$ to $R^{a3}$ each independently represent a hydrogen atom, an alkyl group, an aryl group, an acyl group, or a pyridinyl group. $R^{a1}$ and $R^{a2}$ may be bonded to each other to form a ring.

Adjacent groups among $X^{61}$ to $X^{68}$ and $X^{71}$ to $X^{78}$ may be bonded to each other to form a ring.

Specific examples of the squarylium compound include compounds having the following structures and compounds described in Examples which will be described later. Further, examples thereof include the compounds described in paragraph Nos. 0044 to 0049 of JP2011-208101A, the compounds described in paragraph Nos. 0060 and 0061 of JP6065169A, the compounds described in paragraph No. 0040 of WO2016/181987A, the compounds described in WO2013/133099A, the compounds described in WO2014/088063A, the compounds described in JP2014-126642A, the compounds described in JP2016-146619A, the compounds described in JP2015-176046A, the compounds described in JP2017-025311A, the compounds described in WO2016/154782A, the compounds described in JP5884953B, the compounds described in JP6036689B, the compounds described in JP5810604B, and the compounds described in JP2017-068120B, the contents of which are incorporated herein by reference.

SQ-1

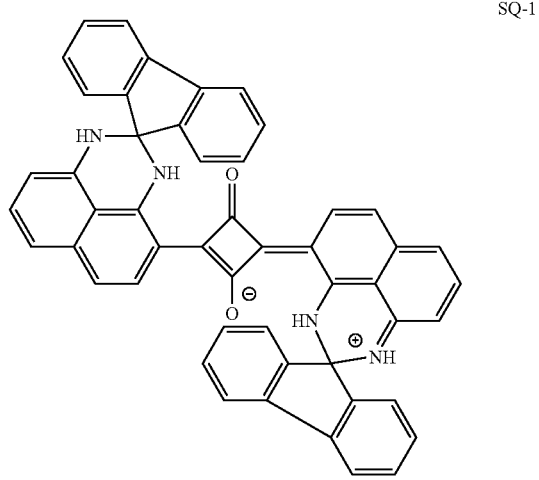

SQ-2
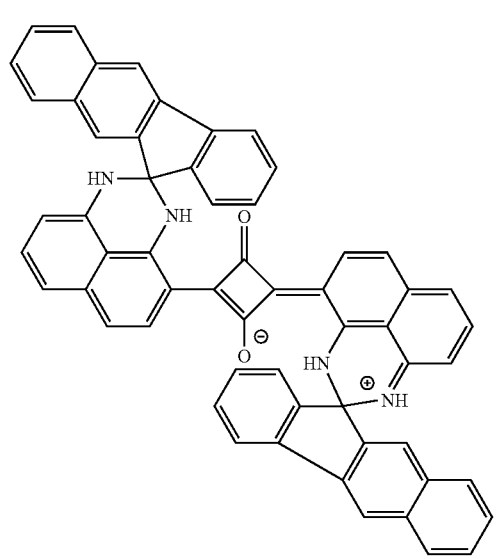
SQ-3
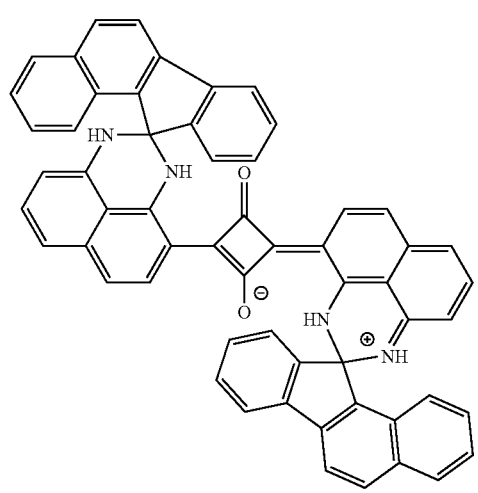
SQ-4
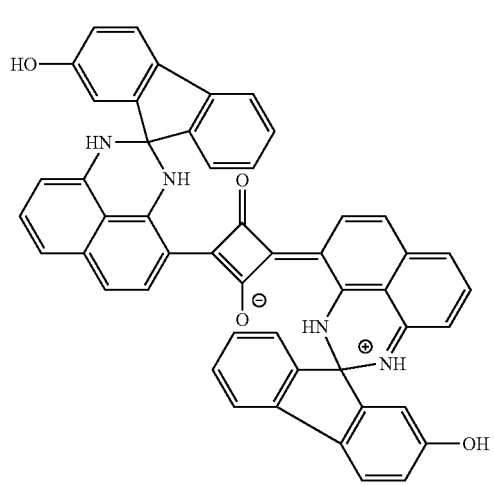
SQ-5
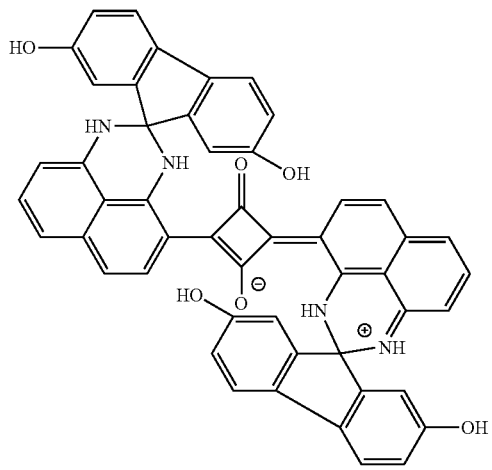
SQ-6
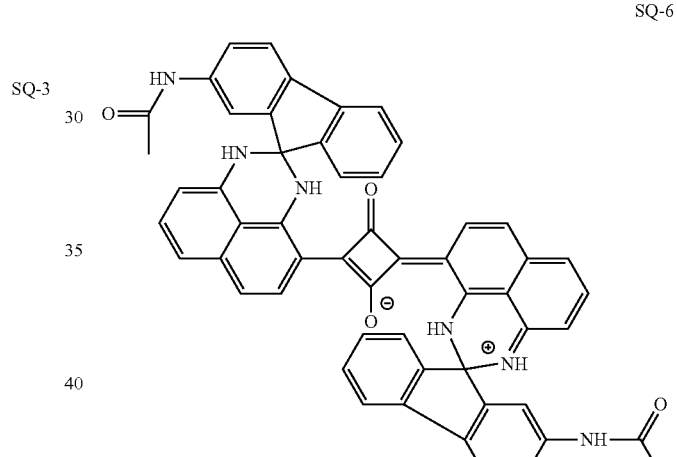
SQ-7
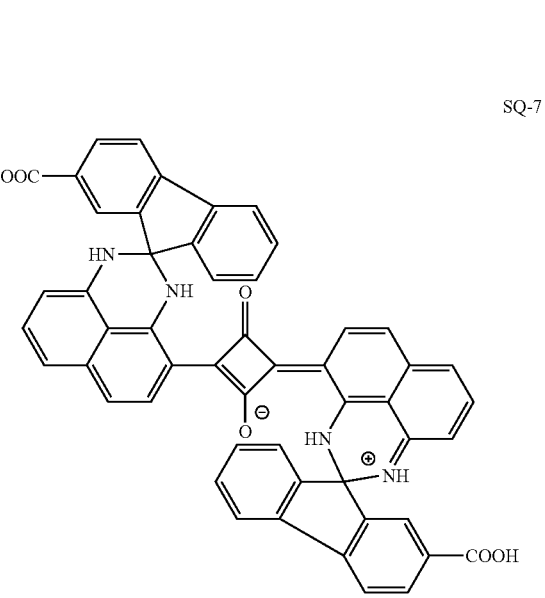

SQ-8
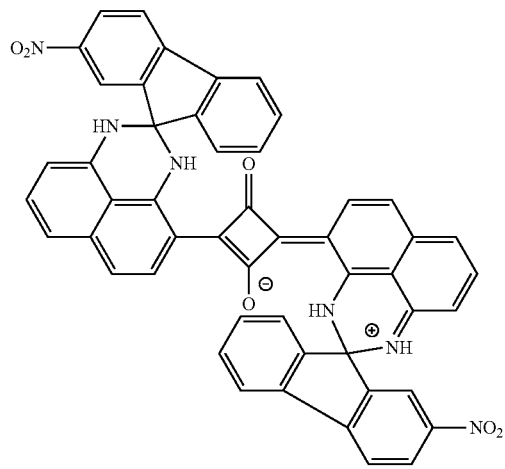
SQ-9
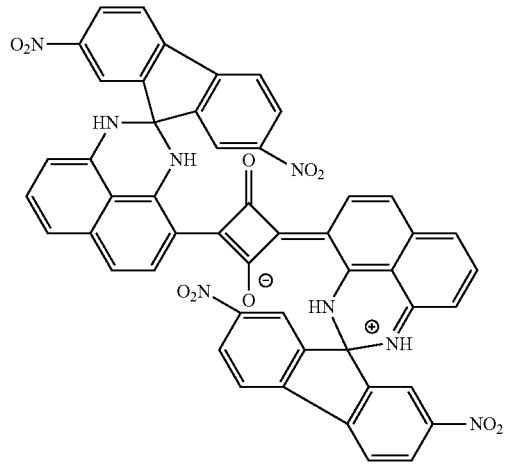
SQ-10
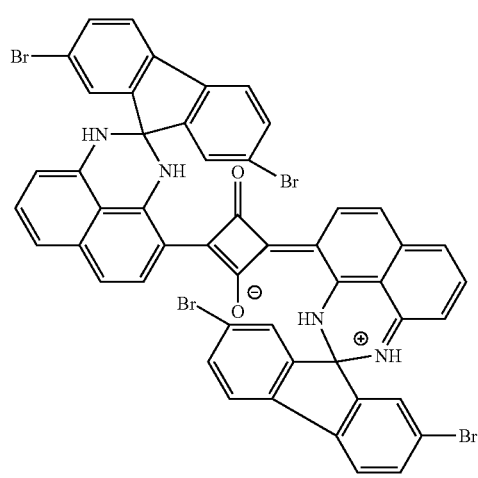
SQ-11
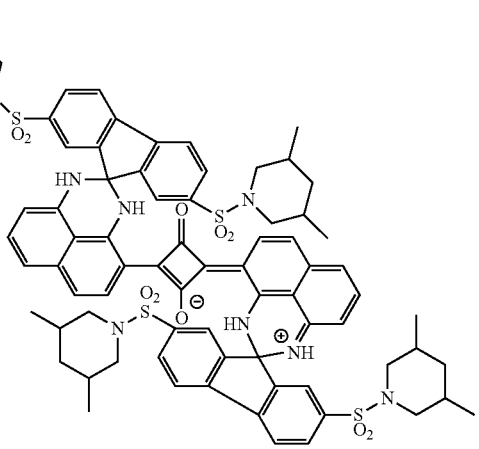
SQ-12
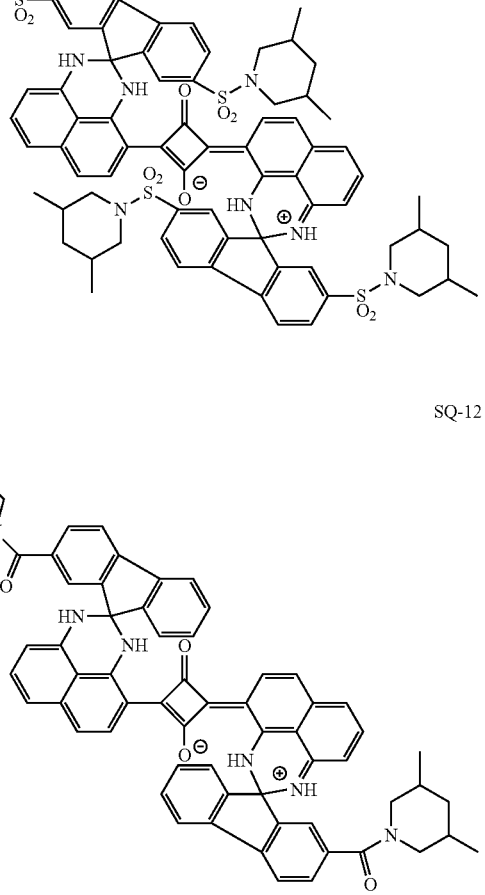
SQ-13
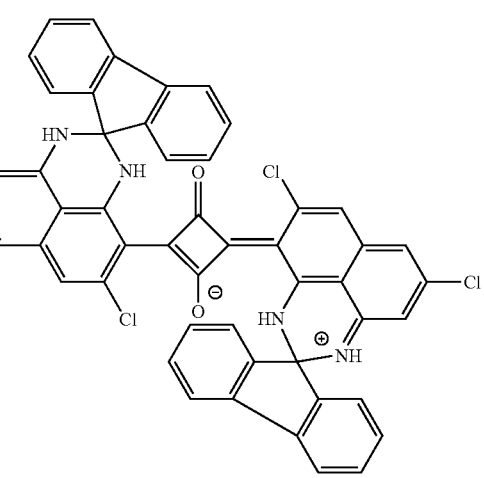

-continued
SQ-14
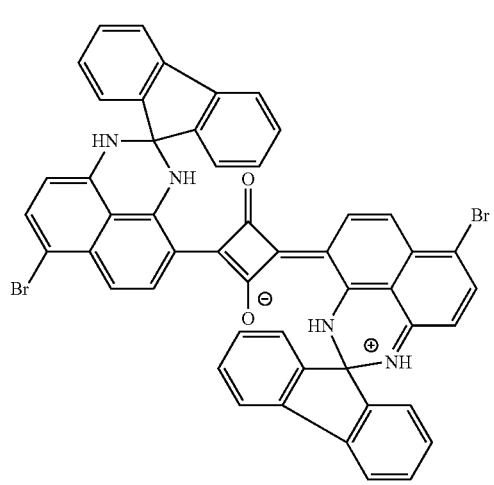
SQ-15
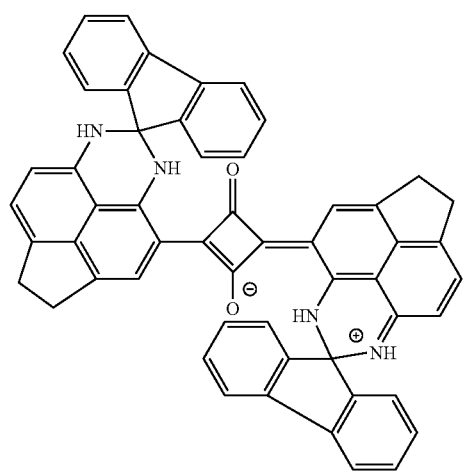
SQ-16
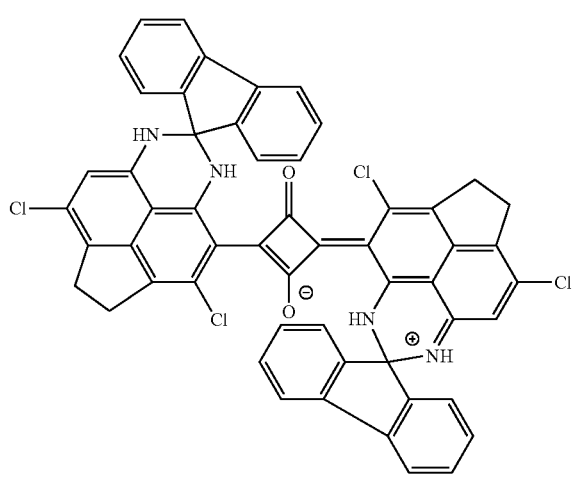
SQ-17
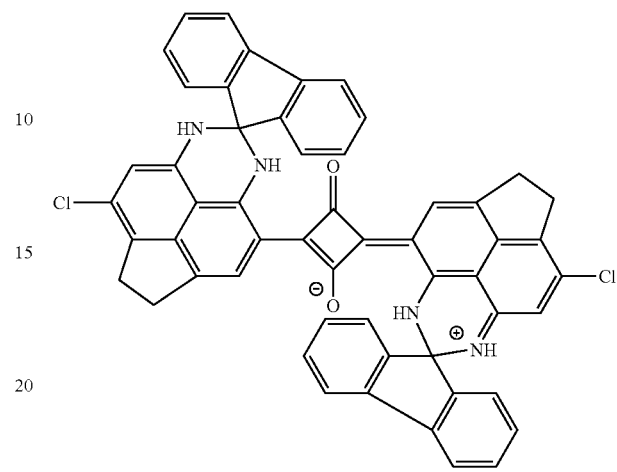
SQ-18
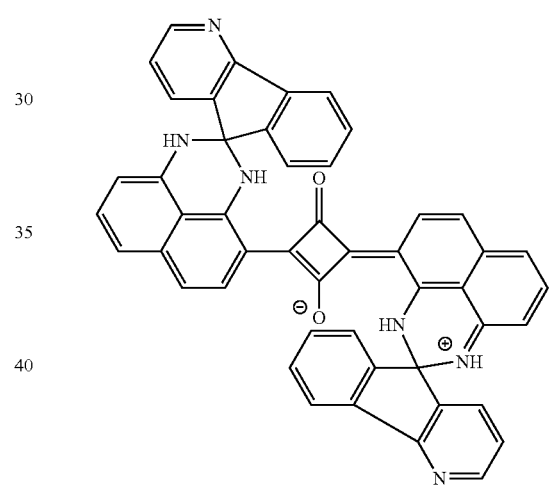
SQ-19
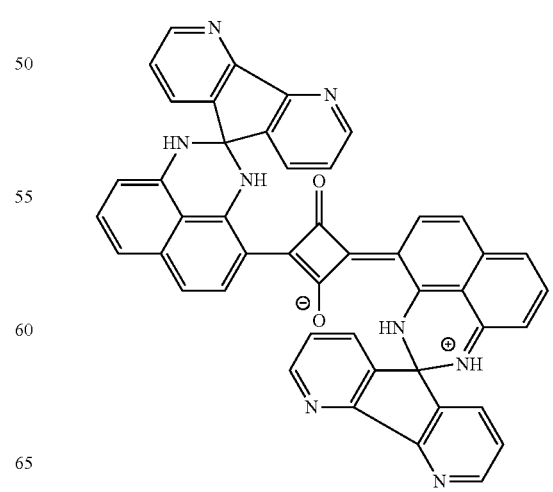

SQ-20
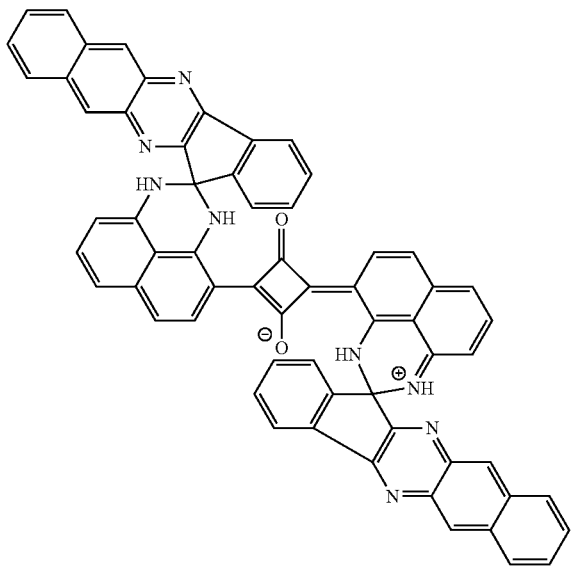
SQ-21
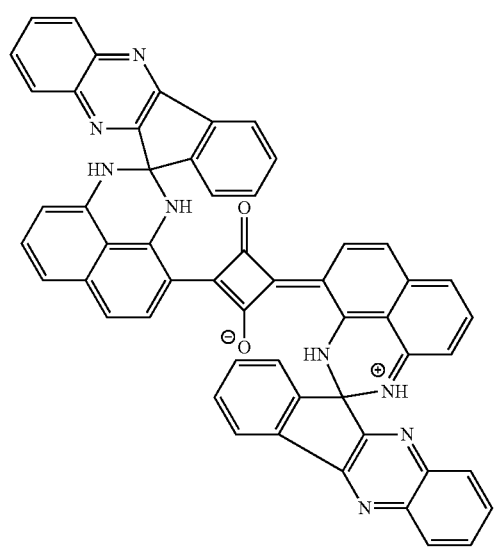
SQ-22
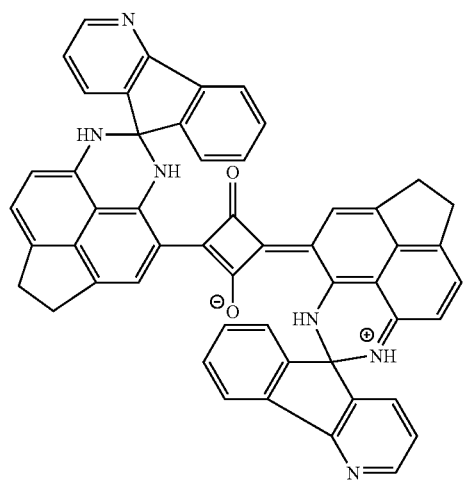
SQ-23
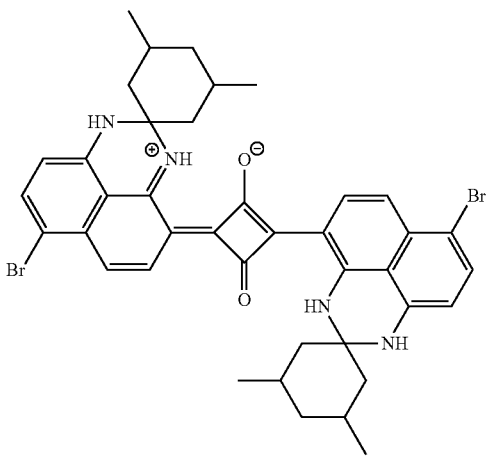
SQ-24
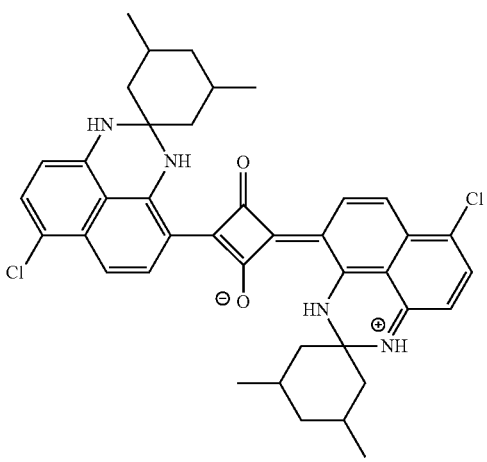
SQ-25
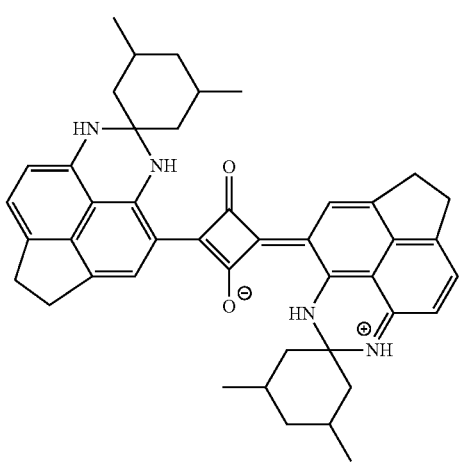

-continued
SQ-26
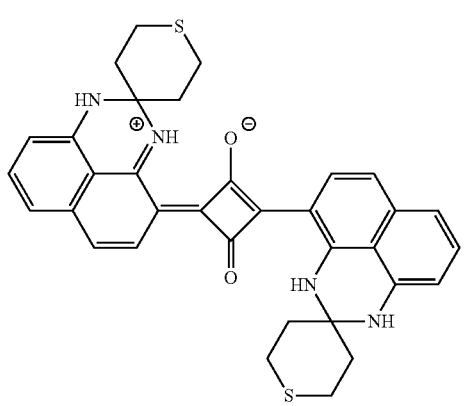
SQ-27
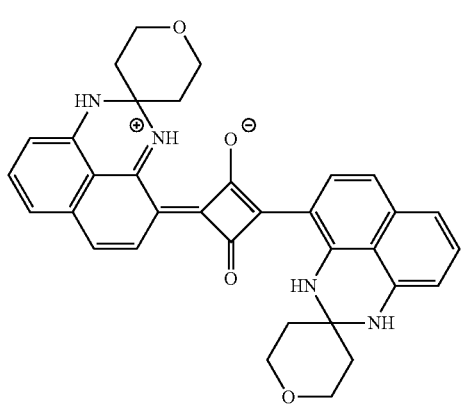
SQ-28
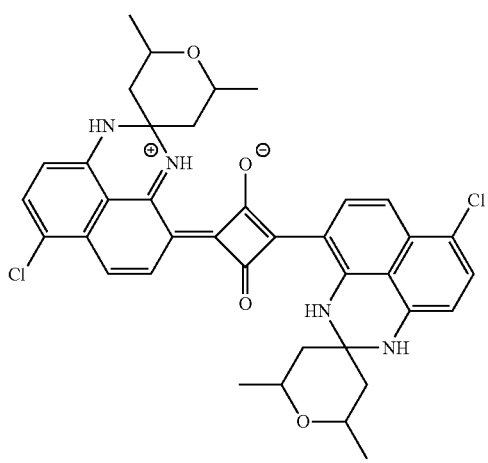
SQ-29
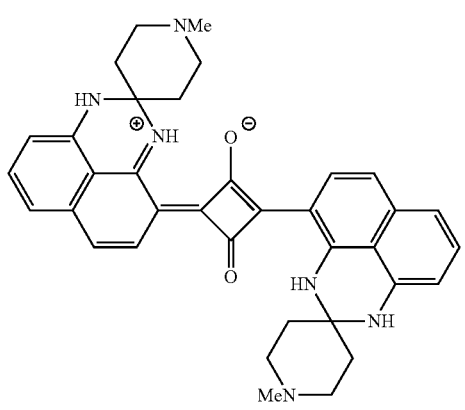
-continued
SQ-30
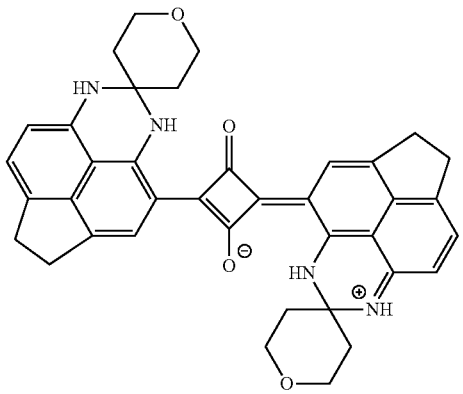
SQ-31
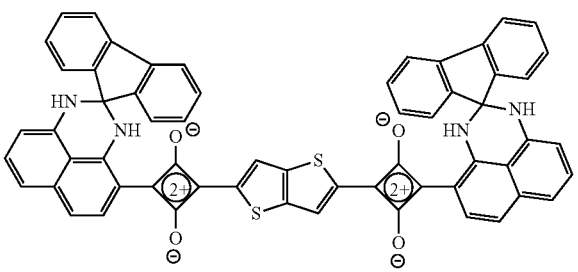
SQ-32
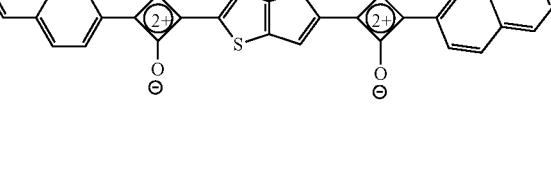
SQ-33
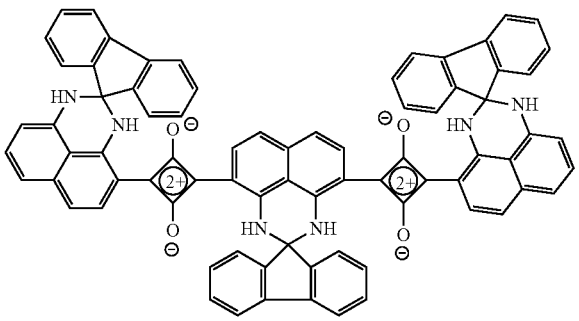

(Cyanine Compound)

The cyanine compound is preferably a compound represented by Formula (Cy1).

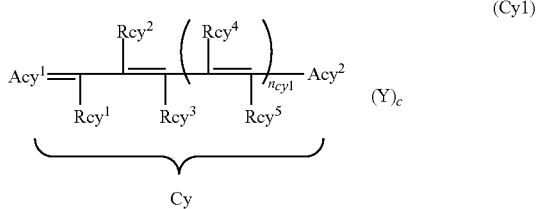

$Rcy^1$ to $Rcy^5$ each independently represent a hydrogen atom or a substituent, and two of $Rcy^1$ to $Rcy^5$ may be bonded to each other to form a ring. $n_{cy1}$ represents an integer of 0 to 2, and in a case where $n_{cy1}$ is 2, a plurality of $R_{cy4}$'s and $R_{cy5}$'s may be the same as or different from each other. $Acy^1$ and $Acy^2$ each independently represent an aryl group or a heterocyclic group. In a case where the moiety represented by Cy in the formula is a cationic moiety, Y represents a counter anion, and c represents a number necessary to balance the charge; in a case where the moiety represented by Cy in the formula is an anionic moiety, Y represents a counter cation, and c represents a number necessary to balance the charge; and in a case where the charge of the moiety represented by Cy in the formula is neutralized in the molecule, c is 0.

$Rcy^1$ and $Rcy^5$ each independently represent a hydrogen atom or a substituent. Examples of the substituent include the above-mentioned substituent T. In Formula (Cy1), two of $Rcy^1$ to $Rcy^5$ may be bonded to each other to form a ring. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the above-mentioned substituent T.

$n_{cy1}$ represents an integer of 0 to 2, and is preferably 0 or 1. In a case where $n_{cy1}$ is 2, a plurality of $Rcy^4$'s and $Rcy^5$'s may be the same as or different from each other.

The aryl group represented by each of $Acy^1$ and $Acy^2$ preferably has 6 to 48 carbon atoms, more preferably has 6 to 22 carbon atoms, and particularly preferably has 6 to 12 carbon atoms. The heterocyclic group represented by each of $Acy^1$ and $Acy^2$ is preferably a 5- or 6-membered heterocyclic group. Further, the heterocyclic group is preferably a monocyclic heterocyclic group or a fused-ring heterocyclic group having a fusion number of 2 to 8, more preferably the monocyclic heterocyclic group or a fused-ring heterocyclic group having a fusion number of 2 to 4, still more preferably a monocyclic heterocyclic group or a fused-ring heterocyclic group having a fusion number of 2 or 3, and particularly preferably the monocyclic heterocyclic group or the fused-ring heterocyclic group having a fusion number of 2. Examples of the heteroatom constituting the ring of the heterocyclic group include a nitrogen atom, an oxygen atom, and a sulfur atom, with the oxygen atom or the sulfur atom being preferable. The number of heteroatoms constituting the ring of the heterocyclic group is preferably 1 to 3, and more preferably 1 or 2. The groups represented by each of $Acy^1$ and $Acy^1$ may have a substituent. Examples of the substituent include the above-mentioned substituent T.

In Formula (Cy1), in a case where the moiety represented by Cy in the formula is a cationic moiety, Y represents a counter anion, and c represents a number necessary to balance the charge. Examples of the counter anion include a halide ion ($Cl^-$, $Br^-$, or $I^-$), a p-toluenesulfonate ion, an ethyl sulfate ion, $PF_6^-$, $BF_4^-$, $ClO_4^-$, a tris(halogenoalkylsulfonyl) methide anion (for example, $(CF_3SO_2)_3C^-$), a di(halogenoalkylsulfonyl)imide anion (for example, $(CF_3SO_2)_2N^-$), and a tetracyanoborate anion.

In Formula (Cy1), in a case where the moiety represented by Cy in the formula is an anionic moiety, Y represents a counter cation and c represents a number necessary to balance the charge. Examples of the counter cation include an alkali metal ion ($Li^+$, $Na^+$, $K^+$, or the like), an alkaline earth metal ion ($Mg^{2+}$, $Ca^{2+}$, $Ba^{2+}$, $Sr^{2+}$, or the like), a transition metal ion ($Ag^+$, $Fe^{2+}$, $Co^{2+}$, $Ni^{2+}$, $Cu^{2+}$, $Zn^{2+}$, or the like), other metal ions ($Al^{3+}$ or the like), an ammonium ion, a triethylammonium ion, a tributylammonium ion, a pyridinium ion, a tetrabutylammonium ion, a guanidinium ion, a tetramethylguanidium ion, and diazabicycloundecenium ion.

In Formula (Cy1), in a case where the charge at the moiety represented by Cy is neutralized in the molecule, Y is not present. That is, c is 0.

Specific examples of the cyanine compound include the compounds described in Examples below. Further, examples of the cyanine compound include the compounds described in paragraph Nos. 0044 and 0045 of JP2009-108267A, the compounds described in paragraph Nos. 0026 to 0030 of JP2002-194040A, the compounds described in JP2015-172004A, the compounds described in JP2015-172102A, the compounds described in JP2008-088426A, and the compounds described in JP2017-031394A, the contents of which are incorporated herein by reference. In addition, examples of commercially available cyanine compounds include Daito chmix 1371F (manufactured by Daito Chemix Co., Ltd.), and NK series such as NK-3212 and NK-5060 (manufactured by Hayashibara Co., Ltd.).

(Croconium Compound)

The croconium compound is preferably a compound represented by Formula (Cr1).

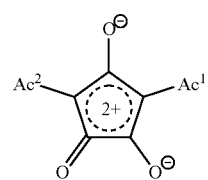

In the formula, $Ac^1$ and $Ac^2$ each independently represent an aryl group, a heterocyclic group, or a group represented by Formula (Ac-1);

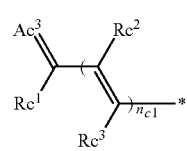

In the formula, * represents a bond,
$Rc^1$ to $Rc^3$ each independently represent a hydrogen atom or an alkyl group,
$Ac^3$ represents a heterocyclic group,
$n_{c1}$ represents an integer of 0 or more,
$Rc^1$ and $Rc^2$ may be bonded to each other to form a ring,
$Rc^1$ and $Ac^3$ may be bonded to each other to form a ring, Rc² and Rc³ may be bonded to each other to form a ring, and in a case where $n_{c1}$ is 2 or more, a plurality of Rc² and Rc³ may be the same as or different from each other.

The aryl group represented by each of Ac¹ and Ac² preferably has 6 to 48 carbon atoms, more preferably has 6 to 22 carbon atoms, and particularly preferably has 6 to 12 carbon atoms.

The heterocyclic group represented by each of Ac¹, Ac², and Ac³ is preferably a 5- or 6-membered heterocyclic group. Further, the heterocyclic group is preferably a monocyclic heterocyclic group or a fused-ring heterocyclic group having a fusion number of 2 to 8, more preferably the monocyclic heterocyclic group or a fused-ring heterocyclic group having a fusion number of 2 to 4, still more preferably a monocyclic heterocyclic group or a fused-ring heterocyclic group having a fusion number of 2 or 3, and particularly preferably the monocyclic heterocyclic group or the fused-ring heterocyclic group having a fusion number of 2. Examples of the heteroatom constituting the ring of the heterocyclic group include a nitrogen atom, an oxygen atom, and a sulfur atom, with the nitrogen atom or the sulfur atom being preferable. The number of heteroatoms constituting the ring of the heterocyclic group is preferably 1 to 3, and more preferably 1 or 2.

Rc¹ to Rc³ in Formula (Ac-1) each independently represent a hydrogen atom or an alkyl group. The alkyl group represented by each of Rc¹ and Rc³ preferably has 1 to 20 carbon atoms, more preferably has 1 to 15 carbon atoms, and still more preferably has 1 to 8 carbon atoms. The alkyl group may be in any of linear, branched, and cyclic forms, but is preferably linear or branched. Rc¹ to Rc³ are each preferably a hydrogen atom.

$n_{c1}$ in Formula (Ac-1) represents an integer of 0 or more. $n_{c1}$ is preferably an integer of 0 to 2, more preferably 0 or 1, and still more preferably 1.

In Formula (Ac-1), Rc¹ and Rc² may be bonded to each other to form a ring, Rc¹ and Ac³ may be bonded to each other to form a ring, and Rc² and Rc³ are bonded to each other. As the linking group in a case of forming the ring, a divalent linking group selected from the group consisting of —CO—, —O—, —NH—, an alkylene group having 1 to 10 carbon atoms, and a combination thereof is preferable. The alkylene group as the linking group may be unsubstituted or may have a substituent. Examples of the substituent include the above-mentioned substituent T.

In Formula (Cr1), the group represented by each of Ac¹ and Ac² preferably has a substituent. Examples of the substituent include the above-mentioned substituent T.

In Formula (Cr1), it is preferable that Ac¹ and Ac² are each independently an aryl group or a heterocyclic group, or that Ac¹ and Ac² are each independently a group represented by Formula (Ac-1).

Moreover, the cation in Formula (Cr1) is present in the form of not being localized as below.

Furthermore, examples of the croconium compound also include the compounds described in JP1993-155145A (JP-H05-155145A) and the compounds described in JP2007-031644A, the contents of which are incorporated herein by reference.

(Iminium Compound)

As the iminium compound, a compound represented by Formula (Im) is preferable.

Formula (Im)

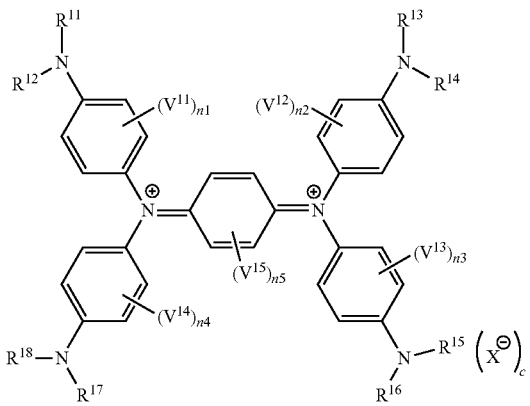

In the formula, R¹¹ to R¹⁸ each independently represent an alkyl group or an aryl group, V¹¹ to V¹⁵ each independently represent an alkyl group, an aryl group, a halogen atom, an alkoxy group, or a cyano group, and X is a counter anion, c represents a number necessary to balance the charge, and n1 to n5 are each independently 0 to 4.

R¹¹ to R¹⁸ each independently represent an alkyl group or an aryl group. The alkyl group preferably has 1 to 20 carbon atoms, more preferably has 1 to 12 carbon atoms, and particularly preferably has 1 to 8 carbon atoms. The alkyl group may be in any of linear, branched, and cyclic forms, but is preferably linear or branched. The aryl group preferably has 6 to 25 carbon atoms, more preferably has 6 to 15 carbon atoms, and still more preferably has 6 to 12 carbon atoms. The alkyl group and the aryl group may have a substituent or may be unsubstituted. Examples of the substituent include the substituents described for the above-mentioned substituent T.

V¹¹ to V¹⁵ each independently represent an alkyl group, an aryl group, a halogen atom, an alkoxy group, or a cyano group. Examples of the halogen atom include a fluorine atom, a chlorine atom, a bromine atom, and an iodine atom. The alkyl group preferably has 1 to 20 carbon atoms, more preferably has 1 to 12 carbon atoms, and particularly preferably has 1 to 8 carbon atoms. The alkyl group may be in any of linear, branched, and cyclic forms, but is preferably linear or branched, and particularly preferably linear. The

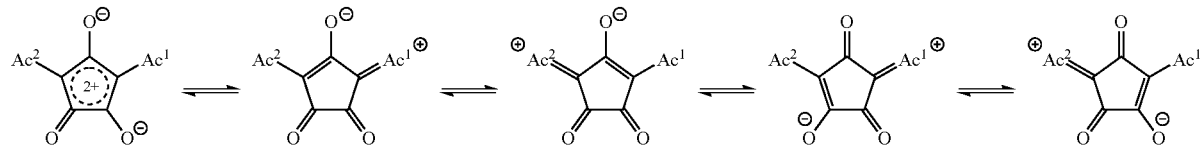

Specific examples of the croconium compound include the compounds described in Examples below.

aryl group preferably has 6 to 25 carbon atoms, more preferably has 6 to 15 carbon atoms, and still more preferably has 6 to 12 carbon atoms. The alkoxy group preferably has 1 to 20 carbon atoms, more preferably has 1 to 12 carbon atoms, and particularly preferably has 1 to 8 carbon atoms. The alkoxy group may be in any of linear, branched, and cyclic forms, but is preferably linear or branched, and particularly preferably linear.

n1 to n5 are each independently 0 to 4. n1 to n4 are preferably 0 to 2, and more preferably 0 or 1. n5 is preferably 0 to 3, and more preferably 0 to 2.

X represents a counter anion. Examples of the counter anion include a halide ion ($Cl^-$, $Br^-$, or $I^-$), a para-toluenesulfonate ion, an ethyl sulfate ion, $SbF_6^-$, $PF_6^-$, $BF_4^-$, $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyanoborate anion.

c represents a number necessary to balance the charge, and is preferably, for example, 2.

Examples of the iminium compound include the compounds described in JP2008-528706A, the compounds described in JP2012-012399A, the compounds described in JP2007-092060A, and the compounds described in WO2010/095676A, the contents thereof are incorporated herein by reference.

These near-infrared absorbers may be used in the form of a dye multimer. In that case, a polymer to be polymerized is preferably linear, star-shaped, comb-shaped, or the like.

A content of the near-infrared absorbing colorant in the near-infrared cut filter 112 is preferably 5% by mass or more, more preferably 10% by mass or more, still more preferably 12% by mass or more. The upper limit is preferably 90% by mass or less, more preferably 80% by mass or less, and still more preferably 70% by mass or less.

(Other Near-Infrared Absorbers)

The near-infrared cut filter 112 may further include near-infrared absorbers (also referred to other near-infrared absorbers) other than the above-mentioned near-infrared absorbing colorant. Examples of such other near-infrared absorbers include pyrrolopyrrole compounds, phthalocyanine compounds, naphthalocyanine compounds, quaterrylene compounds, tungsten compounds, and metal borides.

Further, examples of the pyrrolopyrrole compound include the compounds described in paragraph Nos. 0016 to 0058 of JP2009-263614A, the compounds described in paragraph Nos. 0037 to 0052 of JP2011-068731A, paragraph Nos. 0014 to 0027 of JP2014-130343A, and the compounds described in paragraph Nos. 0010 to 0033 of WO2015/166873A, the contents of which are incorporated herein by reference.

Examples of the phthalocyanine compound include compounds described in JP1985-224589A (JP-S60-224589A), JP2005-537319A, JP1992-023868A (JP-H04-023868A), JP1992-039361A (JP-H04-039361A), JP1993-078364A (JP-H05-078364A), JP1993-222047A (JP-H05-222047A), JP1993-222301A (JP-H05-222301A), JP1993-222302A (JP-H05-222302A), JP1993-345861A (JP-H05-345861A), JP1994-025548A (JP-H05-025548A), JP1994-107663A (JP-H06-107663A), JP1994-192584A (JP-H06-192584A), JP1994-228533A (JP-H06-228533A), JP1995-118551A (JP-H07-118551A), JP1995-118552A (JP-H07-118552A), JP1996-120186A (JP-H08-120186A), JP1996-225751A (JP-H08-225751A), JP1997-202860A (JP-H09-202860A), JP1998-120927A (JP-H10-120927A), JP1998-182995A (JP-H10-182995A), JP1999-035838A (JP-H11-035838A), JP2000-026748A, JP2000-063691A, JP2001-106689A, JP2004-018561A, JP2005-220060A, JP2007-169343A, and paragraph Nos. 0026 and 0027 of JP2013-195480A, the contents of which are incorporated herein by reference.

Examples of a commercially available product of the phthalocyanine compound include FB series such as FB-22 and FB-24 (manufactured by Yamada Chemical Co., Ltd.); Excolor series such as Excolor TX-EX720 and Excolor 708K (manufactured by Nippon Shokubai Co., Ltd.); Lumogen IR788 (manufactured by BASF SE); ABS643, ABS654, ABS667, ABS670T, IRA693N, and IRA735 (manufactured by Exciton Inc.); SDA3598, SDA6075, SDA8030, SDA8303, SDA8470, SDA3039, SDA3040, SDA3922, and SDA7257 (manufactured by H. W. Sands Corporation); and TAP-15 and IR-706 (manufactured by Yamada Chemical Co., Ltd.).

Examples of the naphthalocyanine compound include the compounds described in JP1999-152413A (JP-H11-152413A), JP1999-152414A (JP-H11-152414A), JP1999-152415A (JP-H11-152415A), and paragraph Nos. 0046 to 0049 of JP2009-215542A, the contents of which are incorporated herein by reference.

Examples of the quaterrylene compound include the compounds described in paragraph Nos. 0044 to 0049 of JP2011-208101A, the contents of which are incorporated herein by reference. Examples of a commercially available product of the quaterrylene compound include Lumogen IR765 (manufactured by BASF).

As the tungsten compound, a tungsten oxide compound is preferable, cesium tungsten oxide and rubidium tungsten oxide are more preferable, and cesium tungsten oxide is still more preferable. Examples of the composition formula of cesium tungsten oxide include $Cs_{0.33}WO_3$, and examples of the composition formula of rubidium tungsten oxide include $Rb_{0.33}WO_3$. The tungsten oxide compound is also available as a dispersion of tungsten particles such as YMF-02A manufactured by Sumitomo Metal Mining Co., Ltd. With regard to the details of the tungsten oxide, reference can be made to the description in paragraph No. 0080 of JP2016-006476A, the contents of which are incorporated herein by reference.

Examples of the metal boride include the compounds described in paragraph 0049 of JP2012-068418A, the contents of which are incorporated herein by reference. Among those, examples of a commercially available product of lanthanum boride include $LaB_6$—F (manufactured by Nippon Shinkin Co., Ltd.) and KHS-5AH (manufactured by Sumitomo Metal Mining Co., Ltd., $LaB_6$ dispersion liquid).

A content of such other near-infrared absorbers in the near-infrared cut filter 112 is preferably 80% by mass or less, more preferably 70% by mass or less, and still more preferably 50% by mass or less.

In addition, the content of such other near-infrared absorbers is preferably 1,500 parts by mass or less, more preferably 1,000 parts by mass or less, and 500 parts by mass or less, with respect to 100 parts by mass of the above-mentioned near-infrared absorbing colorant.

Moreover, it is also preferable that the near-infrared cut filter 112 does not substantially contain such other near-infrared absorbers. According to this aspect, more excellent heat resistance can be easily obtained. In addition, a case where the near-infrared cut filter 112 does not substantially contain such other near-infrared absorbers means that a content of such other near-infrared absorbers in the near-infrared cut filter 112 is 0.5% by mass or less, the content is more preferably 0.1% by mass or less, and it is still more preferable that such other near-infrared absorbers are not contained.

(Resin)

The near-infrared cut filter 112 includes a resin. In the present invention, the resin included in the near-infrared cut filter 112 includes a resin having a glass transition temperature of 100° C. or higher (the resin having a glass transition temperature of 100° C. or higher is hereinafter also referred to as a resin A).

Moreover, In a case where the near-infrared cut filter 112 includes two or more kinds of resins, at least one of the two or more kinds of the resins included in the near-infrared cut filter 112 may be the resin A, and the resin included in the near-infrared cut filter 112 is preferably the resin A. Further, in a case where two or more kinds of the resins are included in the near-infrared cut filter 112, it is also preferable that the mass-average value of glass transition temperatures of the two or more kinds of the resins included in the near-infrared cut filter 112 is 100° C. or higher. Here, the mass-average value of the glass transition temperatures of the two or more resins means the following.

$$Tg_{ave} = \sum_{i=1}^{n} (M_i \times Tg_i)$$

$Tg_{ave}$ is a mass-average value of the glass transition temperatures of two or more kinds (n kinds) resins, $M_i$ is a mass ratio of the resin i in the total amount of the resins included in the near-infrared cut filter (the mass of resin i/the mass of all the resins), $Tg_i$ is the glass transition temperature of the resin i, and n is an integer of 2 or more.

Moreover, in the present specification, a measured value (hereinafter also referred to as a measured Tg) is applied to the glass transition temperature (Tg) of the resin. Specifically, as the measured Tg, a value measured under normal measurement conditions using a differential scanning calorimeter (DSC), EXSTAR 6220 manufactured by SII Nano Technology Inc., can be used. It should be noted that in a case where it is difficult to measure the glass transition temperature due to decomposition of a polymer, the calculated value calculated by the following calculation equation (hereinafter also referred to as a calculated Tg) is applied.

$$1/Tg_{cal} = \sum_{i=1}^{n} (X_i / Tgm_i)$$

Here, it is assumed that the resin to be calculated is a copolymer of n kinds of monomer components. $Tg_{cal}$ is a calculated Tg (unit: K) of the resin, $X_i$ is a mass fraction of the i-th monomer ($\Sigma X_i = 1$), $Tgm_i$ is a glass transition temperature (unit: K) of a homopolymer of the i-th monomer, and n is an integer of 1 or more. As a value of the glass transition temperature ($Tgm_i$) of the homopolymer of each monomer, the value described in Polymer Handbook (3rd Edition) (edited by J. Brandrup, E. H. Immergut (Wiley-Interscience, 1989)) is adopted.

The glass transition temperature of the resin A included in the near-infrared cut filter 112 is preferably 130° C. or higher, and more preferably 150° C. or higher. The upper limit is preferably 500° C. or lower, more preferably 450° C. or lower, and still more preferably 400° C. or lower for a reason that generation of cracks is easily suppressed.

Furthermore, in a case where the near-infrared cut filter 112 includes two or more kinds of resins, a mass-average value of the glass transition temperature of the resin having the highest glass transition temperature and a glass transition temperature of the resin having the lowest glass transition temperature is preferably 100° C. or higher, more preferably 130° C. or higher, and still more preferably 150° C. or higher.

Examples of the kinds of the resin used for the near-infrared cut filter 112 include a (meth)acrylic resin, a (meth)acrylamide resin, a maleimide resin, a styrene resin, an epoxy resin, a polyester resin, a polycarbonate resin, a polyether resin, a polyarylate resin, a polysulfone resin, a polyether sulfone resin, a polyphenylene ether resin, a polyphenylene oxide resin, a polyphenylene sulfide resin, a polyimide resin, a polybenzoxazole resin, and a cyclic olefin resin, the (meth)acrylic resin, the (meth)acrylamide resin, the cyclic olefin resin, or the polyimide resin is preferable, and for a reason that the effects of the present inventions can be more remarkably obtained, the cyclic olefin resin is more preferable, and a norbornene resin is particularly preferable. Further, the glass transition temperature of the cyclic olefin resin is preferably 100° C. or higher, more preferably 130° C. or higher, and still more preferably 150° C. or higher. The upper limit is preferably 500° C. or lower, more preferably 450° C. or lower, and still more preferably 400° C. or lower for a reason that generation of cracks is easily suppressed.

As the cyclic olefin resin, a resin having a repeating unit derived from at least one kind of monomer selected from the group consisting of a monomer represented by Formula ($X_0$) and a monomer represented by Formula ($Y_0$), and a resin obtained by hydrogenation of the resin, and the resin having a repeating unit derived from the monomer represented by Formula ($X_0$) and the resin obtained by hydrogenating the resin are preferable. Specific examples of the resin having the monomer represented by Formula ($X_0$) and the resin having the monomer represented by Formula ($Y_0$) include the compounds described in paragraph No. 0064 of JP2011-100084A.

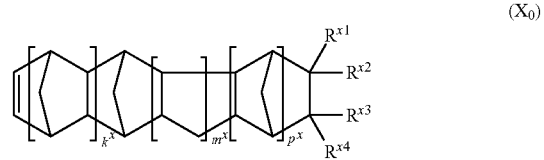

In Formula ($X_0$), $R^{x1}$ to $R^{x4}$ each independently represent a hydrogen atom or a substituent, and $k^x$, $m^x$, and $p^x$ each independently represent 0 or a positive integer. Two groups of $R^{x1}$ to $R^{x4}$ may be bonded to each other to form a ring.

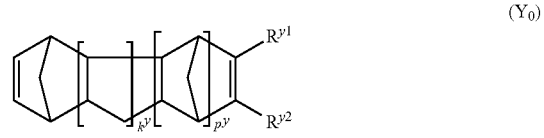

In Formula ($Y_0$), $R^{y1}$ and $R^{y2}$ each independently represent a hydrogen atom or a substituent, and $k^y$ and $p^y$ each independently represent 0 or a positive integer. $R^{y1}$ and $R^{y2}$ may be bonded to each other to form a ring.

Examples of the substituent represented by each of $R^{x1}$ to $R^{x4}$, $R^{y1}$, and $R^{y2}$ include a halogen atom, a cyano group, a nitro group, an alkyl group, an alkenyl group, an alkynyl group, an aryl group, a heteroaryl group, an aralkyl group, an alkoxy group, an aryloxy group, a heteroaryloxy group, an alkylthio group, an arylthio group, a heteroarylthio group, —NR$^{a1}$R$^{a2}$, —COR$^{a3}$, —COOR$^{a4}$, —OCOR$^{a5}$, —NHCOR$^{a6}$, —CONR$^{a7}$R$^{a8}$, —NHCONR$^{a9}$R$^{a10}$, —NHCOOR$^{a11}$, —SO$_2$R$^{a12}$, —SO$_2$OR$^{a13}$, —NHSO$_2$R$^{a14}$, and —SO$_2$NR$^{a15}$R$^{a16}$. R$^{a1}$ to R$^{a16}$ each independently represent a hydrogen atom, an alkyl group, an alkenyl group, an alkynyl group, an aryl group, or a heteroaryl group.

As the cyclic olefin resin, a resin including a repeating unit represented by Formula (CO-1) is preferable.

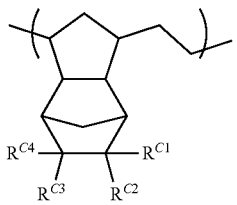
(CO-1)

In the formula, R$^{C1}$ to R$^{C4}$ each independently represent a hydrogen atom or a substituent. Two groups of R$^{C1}$ to R$^{C4}$ may be bonded to each other to form a ring. Examples of the substituent represented by each of R$^{C1}$ to R$^{C4}$ include the above-mentioned substituents.

R$^{C3}$ and R$^{C4}$ are each preferably a hydrogen atom. Further, at least one of R$^{C1}$ or R$^{C2}$ is preferably a substituent, and more preferably a halogen atom, an alkyl group, —NR$^{a1}$R$^{a2}$, —COR$^{a3}$, —COOR$^{a4}$, —OCOR$^{a5}$, or —SO$_2$R$^{a13}$. R$^{a1}$ to R$^{a5}$, and R$^{a13}$ are each preferably a hydrogen atom, an alkyl group, or an aryl group, and more preferably the hydrogen atom or the alkyl group.

Examples of a commercially available product of the resin including the repeating unit represented by Formula (CO-1) include ARTON F4520 (manufactured by JSR Corporation). Further, with regard to details of the resin having the repeating unit represented by Formula (CO-1), reference can be made to the descriptions in paragraph Nos. 0053 to 0075 and 0127 to 0130 of JP2011-100084A, the contents of which are Incorporated herein by reference.

The resin having a glass transition temperature of 100° C. or higher included in the near-infrared cut filter 112 may include a resin obtained by using a precursor of a resin having a glass transition temperature of 100° C. or higher. Examples of the above-mentioned precursor include a polyamide precursor and a polybenzoxazole precursor.

The polyimide resin is not particularly limited. For example, a polyimide resin represented by Formula (PI-1) can be used. This can be obtained, for example, by subjecting a polyimide precursor represented by Formula (PI-2) to imide ring closure (imidization reaction). The imidization reaction method is not particularly limited, and examples thereof include thermal imidization and chemical imidization. Among these, the thermal imidization is preferable from the viewpoint of heat resistance.

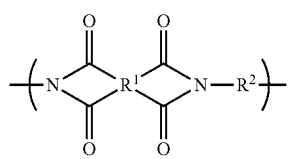
(PI-1)

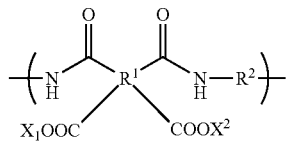
(PI-2)

In Formulae (PI-1) and (PI-2), R$^1$ represents a tetravalent organic group, and R$^2$ represents a divalent organic group. X$^1$ and X$^2$ each independently represent a hydrogen atom or a monovalent organic group having 1 to 10 carbon atoms.

Examples of the tetravalent organic group represented by R$^1$ in Formulae (PI-1) and (PI-2) include an acid dianhydride and a derivative residue thereof. The acid dianhydride is not particularly limited, and examples thereof include an aromatic acid dianhydride, an alicyclic acid dianhydride, and an aliphatic acid dianhydride.

Examples of the aromatic acid dianhydrides include, but are not limited to pyromellitic dianhydride, 3,3',4,4'-biphenyl tetracarboxylic dianhydride and 2,3,3',4'-biphenyl tetracarboxylic dianhydride, 2,2',3,3'-biphenyl tetracarboxylic dianhydride, 3,3',4,4'-terphenyl tetracarboxylic dianhydride, 3,3',4,4'-oxyphthalic dianhydride, 2,3,3',4'-oxyphthalic dianhydride, 2,3,2',3'-oxyphthalic dianhydride, diphenyl sulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis-(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoxy)benzene dianhydride, bis(1,3-dioxo-1,3-dihydroisobenzofuran-5-carboxylic acid) 1,4-phenylene-2, 2-bis(4-(4-aminophenoxy)phenyl)propane, 1,2,5,6-naphthalene tetracarboxylic dianhydride, 2,3,6,7-naphthalene tetracarboxylic dianhydride, 9,9-bis(3,4-dicarboxyphenyl)fluorene dianhydride, 2,3,5,6-pyridine tetracarboxylic dianhydride, 3,4,9,10-perylene tetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropyromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis[(dicarboxyphenoxy)phenyl]propane dianhydride, 2,2'-bis[(dicarboxyphenoxy)phenyl]hexafluoropropane dianhydride, or an acid dianhydride compound obtained by substituting such the aromatic ring with an alkyl group, an alkoxy group, a halogen atom, or the like.

Examples of the alicyclic acid dianhydride include, but are not limited to, 1,2,3,4-cyclobutane tetracarboxylic dianhydride, 1,2,4,5-cyclohexane tetracarboxylic dianhydride, 1,2,3,4-cyclopentane tetracarboxylic dianhydride, 1,2,3,4-tetramethyl-1,2,3,4-cyclobutane tetracarboxylic dianhydride, 1,2-dimethyl-1,2,3,4-cyclobutane tetracarboxylic dianhydride, 1,3-dimethyl-1,2,3,4-cyclobutane tetracarboxylic dianhydride, 1,2,3,4-cycloheptane tetracarboxylic dianhydride, 2,3,4,5-tetrahydrofuran tetracarboxylic dianhydride, 3,4-dicarboxy-1-cyclohexyl succinic dianhydride, 2,3,5-tricarboxycyclopentyl acetic dianhydride, 3,4-dicarboxy-1,2,3,4-tetrahydro-1-naphthalene succinic dianhydride, bicyclo[3,3,0]octane-2,4,6,8-tetracarboxylic dianhydride, bicyclo[4,3,0]nonane-2,4,7,9-tetracarboxylic dianhydride, bicyclo[4,4,0]decane-2,4,7,9-tetracarboxylic dianhydride, bicyclo[4,4,0]decane-2,4,8,10-tetracarboxylic dianhydride, tricyclo[6,3,0,0<2,6>]undecane-3,5,9,11-tetracarboxylic dianhydride, bicyclo[2,2,2]octane-2,3,5,6-tetracarboxylic dianhydride, bicyclo[2,2,2]oct-7-ene-2,3,5,6-tetracarboxylic dianhydride, bicyclo[2,2,1]heptane tetracarboxylic dianhydride, bicyclo[2,2,1]heptane-5-carboxymethyl-2,3,6-tricarboxylic dianhydride, 7-oxabicyclo[2,2,1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexane tetracarboxylic dianhydride, 3,3',4,4'-oxydicyclohexane tetracarboxylic dianhydride, 5-(2,5-dioxotetrahydro-3-furanyl)-3-methyl-3-cyclohexene-1,2-dicarboxylic anhydride, "Ricacid" (registered trademark) BT-100 (trade name, manufactured by Shin Nippon Rika Co., Ltd.) and derivatives thereof, or acid dianhydride compounds in which these alicyclic rings are substituted with an alkyl group, an alkoxy group, a halogen atom, or the like.

Examples of the aliphatic acid dianhydride include, but are not limited to, 1,2,3,4-butane tetracarboxylic dianhydride, 1,2,3,4-pentane tetracarboxylic dianhydride, and derivatives thereof.

Among these, from the viewpoints of commercial availability, high availability, and reactivity, pyromellitic dianhydride, 3,3',4,4'-biphenyl tetracarboxylic dianhydride, 3,3',4,4'-oxyphthalic dianhydride, 2,2-bis(3,4-dicarboxyphenyl)hexafluoropropane dianhydride, 2,2'-bis[(dicarboxyphenoxy)phenyl]propane dianhydride, 2,3,6,7-naphthalene tetracarboxylic dianhydride, 1,2,4,5-cyclohexane tetracarboxylic dianhydride, 3,3',4,4'-dicyclohexane tetracarboxylic dianhydride, or 1,2,3,4-cyclobutane tetracarboxylic dianhydride is preferable. In addition, from the viewpoints of heat resistance and prevention of coloration during sintering, it is more preferable to use 3,3',4,4'-biphenyl tetracarboxylic dianhydride, 3,3,4',4'-oxyphthalic dianhydride, 2-bis(3,4-dicarboxyphenyl)hexafluoropropane dianhydride, or 2,2'-bis[(dicarboxyphenoxy)phenyl]propane dianhydride.

Examples of the divalent organic group represented by $R^2$ in Formulae (PI-1) and (PI-2) include a diamine and a derivative residue thereof. The diamine is not particularly limited, and examples thereof include an aromatic diamine compound, an alicyclic diamine compound, and an aliphatic diamine compound.

Examples of the aromatic diamine compounds include, but is not limited to, 3,4'-diaminodiphenyl ether, 4,4'-diaminodiphenyl ether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfone, 4,4'-diaminodiphenylsulfone, 1,4-bis(4-aminophenoxy)benzene, benzidine, 2,2'-bis(trifluoromethyl)benzidine, 3,3'-bis(trifluoromethyl)benzidine, 2,2'-dimethylbenzidine, 3,3'-dimethylbenzidine, 2,2'3,3'-tetramethylbenzidine, 2,2'-dichlorobenzidine, 3,3'-dichlorobenzidine, 2,2'3,3'-tetrachlorobenzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis[4-(3-aminophenoxy)phenyl]sulfone, bis(4-aminophenoxy)biphenyl, bis{4-(4-aminophenoxy)phenyl}ether, 1,4-bis(4-aminophenoxy)benzene, 9,9-bis(4-aminophenyl)fluorene, 2,2'-bis[3-(3-aminobenzamido)-4-hydroxyphenyl]hexafluoropropane, or a diamine compound obtained by substituting such the aromatic ring with an alkyl group, an alkoxy group, a halogen atom, or the like.

Examples of the alicyclic diamine compound include, but are not limited to, cyclobutanediamine, isophoronediamine, bicyclo[2,2,1]heptanebismethylamine, tricyclo[3,3,1,13,7]decane-1,3-diamine, 1,2-cyclohexyldiamine, 1,3-cyclohexyldiamine, 1,4-cyclohexyldiamine, trans-1,4-diaminocyclohexane, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'-diaminodicyclohexylmethane, 3,3',5,5'-tetraethyl-4,4'-diaminodicyclohexylmethane, 3,5-diethyl-3',5'dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl)propane, 2,2-bis(3-methyl-4-aminocyclohexyl)propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl)propane, 2,2-(3,5-diethyl-3',5'-dimethyl-4,4'-diaminodicyclohexyl)propane, and a diamine compound obtained by substituting such the alicyclic ring an alicyclic ring with an alkyl group, an alkoxy group, a halogen atom, or the like.

Examples of the aliphatic diamine compound include, but are not limited to, alkylene diamines such as ethylene diamine, 1,3-diaminopropane, 1,4-diaminobutane, 1,5-diaminopentane, 1,6-diaminohexane, 1,7-diaminoheptane 1,8-diaminooctane, 1,9-diaminononane, and 1,10-diaminodecane, ethylene glycol diamines such as bis(aminomethyl) ether, bis(2-aminoethyl) ether, and bis(3-aminopropyl) ether, and siloxane diamines such as 1,3-bis(3-aminopropyl)tetramethyldisiloxane, 1,3-bis(4-aminobutyl)tetramethyldisiloxane, and α,ω(3-aminopropyl)polydimethyl siloxane.

$X^1$ and $X^2$ in Formula (PI-2) each independently represent a hydrogen atom or a monovalent organic group having 1 to 10 carbon atoms. Examples of the monovalent organic group having 1 to 10 carbon atoms include a saturated hydrocarbon group, an unsaturated hydrocarbon group, and an aromatic group. Examples of the saturated hydrocarbon group include alkyl groups such as a methyl group, an ethyl group, and a butyl group. Examples of the unsaturated hydrocarbon group include a vinyl group, an ethynyl group, a biphenyl group, and a phenylethynyl group. The saturated hydrocarbon group may be further substituted with a halogen atom. Examples of the aromatic group include a phenyl group. The aromatic group may be further substituted with a saturated hydrocarbon group, an unsaturated hydrocarbon group, or a halogen atom.

Examples of a commercially available product of the polyimide resin include Neopulim S-200 (manufactured by Mitsubishi Gas Chemical Company).

A content of the resin in the near-infrared cut filter 112 is preferably 10% by mass or more, more preferably 20% by mass or more, and still more preferably 40% by mass or more. The upper limit is preferably 95% by mass or less, more preferably 90% by mass or less, and still more preferably 85% by mass or less.

Furthermore, in a case where the near-infrared cut filter 112 includes two or more kinds of resins, the content of the resin A (resin having a glass transition temperature of 100° C. or higher) in the total amount of the resins included in the near-infrared cut filter 112 is preferably 25% by mass or more, more preferably 50% by mass or more, and still more preferably 75% by mass or more. The upper limit can be 100% by mass. Furthermore, the content of the resin A (resin having a glass transition temperature of 100° C. or higher)

in the near-infrared cut filter 112 is preferably 5% by mass or more, more preferably 10% by mass or more, and still more preferably 20% by mass or more. The upper limit is preferably 95% by mass or less, more preferably 90% by mass or less, and still more preferably 85% by mass or less.

(Surfactant)

The near-infrared cut filter 112 includes a surfactant. As the surfactant, various surfactants such as a fluorine-based surfactant, a nonionic surfactant, a cationic surfactant, an anionic surfactant, and a silicon-based surfactant can be used, and for a reason that more excellent heat resistance and an effect of suppressing voids are easily obtained, the fluorine-based surfactant is preferable.

A fluorine content in the fluorine-based surfactant is preferably 3% to 40% by mass, more preferably 5% to 30% by mass, and still more preferably 7% to 25% by mass. In a case where the fluorine-based surfactant has a fluorine content within this range, the effects of the present invention can be more remarkably obtained.

Examples of the fluorine-based surfactant include the surfactants described in paragraph Nos. 0060 to 0064 of JP2014-041318A (paragraph Nos. 0060 to 0064 of the corresponding WO2014/017669A) and the surfactants described in paragraph Nos. 0117 to 0132 of JP2011-132503A, the contents of which are incorporated herein by reference. Examples of a commercially available product of the fluorine-based surfactant include MEGAFACE F171, F172, F173, F176, F177, F141, F142, F143, F144, R30, F437, F475, F479, F482, F554, and F780 (all of which are manufactured by DIC Corporation), FLUORAD FC430, FC431, and FC171 (all of which are manufactured by Sumitomo 3M Ltd.), SURFLON S-382, SC-101, SC-103, SC-104, SC-105, SC-1068, SC-381, SC-383, S-393, and KH-40 (all of which are manufactured by Asahi Glass Co., Ltd.), FTX-218 (manufactured by NEOS Co., Ltd.), and PolyFox PF636, PF656, PF6320, PF6520, and PF7002 (all of which are manufactured by OMNOVA Solutions Inc.).

Moreover, as the fluorine-based surfactant, an acrylic compound having a molecular structure containing a functional group having a fluorine atom, in which the functional group containing a fluorine atom is cut by application of heat to volatilize the fluorine atom can also be suitably used. Examples of such the fluorine-based surfactant include MEGAFACE DS series manufactured by DIC Corporation (The Chemical Daily, Feb. 22, 2016) (Nikkei Business Daily, Feb. 23, 2016), for example, MEGAFACE DS-21.

Furthermore, it is also preferable to use a polymer of a fluorine atom-containing vinyl ether compound having a fluorinated alkyl group or a fluorinated alkylene ether group and a hydrophilic vinyl ether compound as the fluorine-based surfactant. With regard to the fluorine-based surfactant, reference can be made to the description in JP2016-216602A, the contents of which are incorporated herein by reference.

As the fluorine-based surfactant, a block polymer can also be used. Examples thereof include the compounds described in JP2011-089090A. The fluorine-based surfactant includes a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) having a fluorine atom can also be preferably used. The following compound is also exemplified as the fluorine-based surfactant used in the present invention.

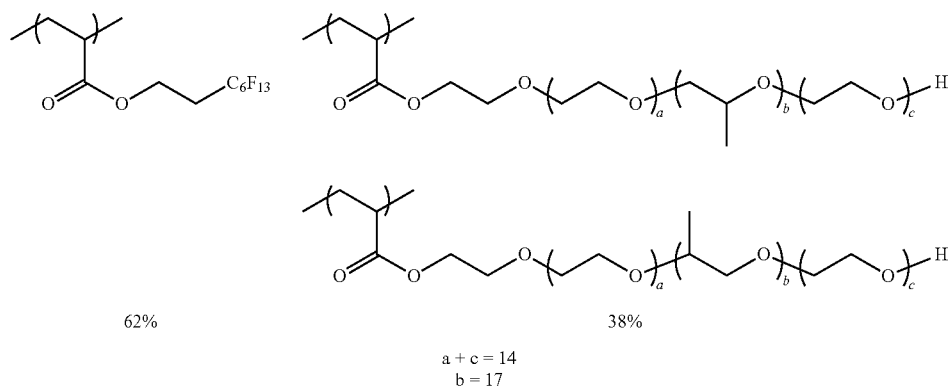

62%    38% a + c = 14
b = 17

The weight-average molecular weight of the compound is preferably 3,000 to 50,000, and is, for example 14,000. In the compound, % representing a ratio of the repeating units is % by mole.

Moreover, a fluorine-based colorant having an ethylenically unsaturated group in a side chain can also be used as the fluorine-based surfactant. Specific examples thereof include the compounds described in paragraph Nos. 0050 to 0090 and paragraph Nos. 0289 to 0295 of JP2010-164965A, for example, MEGAFACE RS-101, RS-102, RS-718K, and RS-72-K, manufactured by DIC Corporation. As the fluorine-based surfactant, the compounds described in paragraph Nos. 0015 to 0158 of JP2015-117327A can also be used.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Examples of the silicone-based surfactant include surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), (KP-341, KF-6001, and KF-6002 all manufactured by Shin-Etsu Chemical Co., Ltd.), and BYK307, BYK323, and BYK330 (all manufactured by BYK Chemie).

A content of the surfactant in the near-infrared cut filter 112 is preferably 10 to 10,000 ppm by mass. The upper limit is preferably 8,000 ppm by mass or less, more preferably 6,000 ppm by mass or less, and still more preferably 5,000 ppm by mass or less. The lower limit is preferably 50 ppm by mass or more, and more preferably 100 ppm by mass or more.

Furthermore, with regard to the concentration of the surfactant of the near-infrared cut filter 112, it is preferable that the concentration in the region in a range of 0% to 5% in the thickness direction from one surface of the near-infrared cut filter 112 is higher than the concentration in the region in a range of 60% to 70% in the thickness direction from the surface.

The content of the surfactant in the near-infrared cut filter 112 can be measured by diagonal cutting the near-infrared cut filter 112 with a surface/interface cutting device (DN-20S Model, manufactured by Daipla Wintes Co., Ltd.) to expose a cross-section thereof, and subjecting the cross-section thus formed to a measurement using an X-ray photoelectron spectroscopy analyzer (ESCA-3400, manufactured by Shimadzu Corporation).

The near-infrared cut filter 112 may further include a cured product derived from a polymerizable monomer, a cured product derived from an epoxy compound, an antioxidant, an ultraviolet absorber, and the like. These components will be described in the section of Composition for Near-Infrared Cut Filter which will be described later.

As the near-infrared cut filter 112 used in the first pixels, a filter having a maximum absorption wavelength in the wavelength range of 700 to 2,000 nm is preferable, a filter having a wavelength range of 700 to 1,300 nm is more preferable, and a filter having a range of 700 to 1,000 nm is still more preferable. Further, Absorbance Amax/Absorbance A550, which is a ratio of an absorbance Amax at the maximum absorption wavelength and an absorbance A550 at a wavelength of 550 nm, of the near-infrared cut filter 112 is preferably 20 to 500, more preferably 50 to 500, still more preferably 70 to 450, and particularly preferably 100 to 400.

The near-infrared cut filter 112 preferably satisfies at least one condition of (1) to (4) below, and more preferably satisfies all of the condition of (1) to (4).
 (1) A transmittance at a wavelength range of 400 nm is preferably 70% or more, more preferably 80% or more, still more preferably 85% or more, and particularly preferably 90% or more.
 (2) A transmittance at a wavelength range of 500 nm is preferably 70% or more, more preferably 80% or more, still more preferably 90% or more, and particularly preferably 95% or more.
 (3) A transmittance at a wavelength range of 600 nm is preferably 70% or more, more preferably 80% or more, still more preferably 90% or more, and particularly preferably 95% or more.
 (4) A transmittance at a wavelength range of 650 nm is preferably 70% or more, more preferably 80% or more, still more preferably 90% or more, and particularly preferably 95% or more.

A transmittance of the near-infrared cut filter 112 at any in a wavelength range of 400 to 650 nm is preferably 70% or more, more preferably 80% or more, and still more preferably 90% or more. Further, the transmittance at at least one point in a wavelength range of 700 to 2,000 nm is preferably 20% or less.

The near-infrared cut filter 112 can be formed by using a composition for a near-infrared cut filter which will be described later.

<<<Color Filter>>>

Next, the color filter 111 used for the first pixels will be described. Examples of the color filter 111 include a filter having colored pixels that transmit light at a specific wavelength, and a filter having at least one kind of colored pixel selected from red pixels, blue pixels, green pixels, yellow pixels, cyan color pixels, or magenta color pixels is preferable. The color filter 111 may be a filter consisting of only the colored pixels of a single color, but is preferably a filter having colored pixels of two or more colors. The color filter 111 can be formed using a composition including a chromatic coloring agent. In the embodiment shown in FIG. 1, the color filter 111 is constituted of colored pixels 111a, 111b, and 111c.

Examples of the chromatic coloring agent include a red coloring agent, a green coloring agent, a blue coloring agent, a yellow coloring agent, a purple coloring agent, and an orange coloring agent. The chromatic coloring agent may be either a pigment or a dye.

The pigment is preferably an organic pigment. Examples of the organic pigment include the following pigments.
 Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all of which are yellow pigments),
 C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments),
 C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all of which are red pigments),
 C. I. Pigment Green 7, 10, 36, 37, 58, 59, 62, 63, and the like (all of which are green pigments),
 C. I. Pigment Violet 1, 19, 23, 27, 32, 37, 42, and the like (all of which are violet pigments), and
 C. I. Pigment Blue 1, 2, 15, 15:1, 15:2, 15:3, 15:4, 15:6, 16, 22, 60, 64, 66, 79, 80, and the like (all of which are blue pigments).

In addition, as a yellow pigment, a metal azo pigment including at least one anion selected from an azo compound represented by Formula (I) or an azo compound having a tautomeric structure thereof, two or more metal ions, and a melamine compound can also be used.

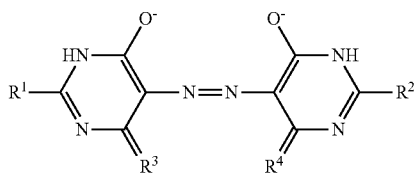

(I)

In the formula, $R^1$ and $R^2$ are each independently —OH or —$NR^5R^6$, $R^3$ and $R^4$ are each independently =O or $NR^7$, and $R^5$ to $R^7$ are each independently a hydrogen atom or an alkyl group. The alkyl group represented by each of $R^5$ to $R^7$ preferably has 1 to 10 carbon atoms, more preferably has 1 to 6 carbon atoms, and still more preferably has 1 to 4 carbon atoms. The alkyl group may be in any of linear, branched, and cyclic forms, but is preferably linear or branched, and more preferably linear.

The alkyl group may have a substituent. The substituent is preferably a halogen atom, a hydroxyl group, an alkoxy group, a cyano group, or an amino group.

In Formula (I), $R^1$ and $R^2$ are preferably —OH. Further, $R^3$ and $R^4$ are preferably =O.

The melamine compound in the metal azo pigment is preferably a compound represented by Formula (II).

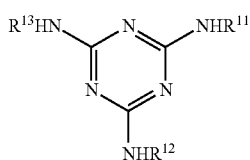

(II)

In the formula, $R^{11}$ to $R^{13}$ are each independently a hydrogen atom or an alkyl group. The alkyl group preferably has 1 to 10 carbon atoms, more preferably has 1 to 6 carbon atoms, and still more preferably has 1 to 4 carbon atoms. The alkyl group may be in any of linear, branched, and cyclic forms, but is preferably linear or branched, and more preferably linear. The alkyl group may have a substituent. The substituent is preferably a hydroxyl group. At least one of $R^{11}$, $R^{12}$, or $R^{13}$ is preferably a hydrogen atom, and more preferably all of $R^{11}$ to $R^{13}$ are hydrogen atoms.

The metal azo pigment is preferably a metal azo pigment in an aspect in which it includes at least one anion selected from the azo compound represented by Formula (I) and an azo compound having a tautomeric structure thereof, a metal ion including at least $Zn^{2+}$ and $Cu^{2+}$, and a melamine compound. In this aspect, a total content of $Zn^{2+}$ and $Cu^{2+}$ is preferably 95% to 100% by mole, more preferably 98% to 100% by mole, and still more preferably 99.9% to 100% by mole, and particularly preferably 100% by mole, with respect to 1 mole of all the metal ions of the metal azo pigment. In addition, the molar ratio of $Zn^{2+}$ to $Cu^{2+}$ in the metal azo pigment is preferably $Zn^{2+}:Cu^{2+}$=199:1 to 1:15, more preferably 19:1 to 1:1, and still more preferably 9:1 to 2:1.

Moreover, in this aspect, the metal azo pigment may further include a divalent or trivalent metal ion other than $Zn^{2+}$ and $Cu^{2+}$ (hereinafter also referred to as metal ion Me1). As the metal ion Me1, at least one selected from $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Se^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, $Ba^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, at least one selected from $Al^{3+}$, $e^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable, and at least one selected from $Al^{3+}$, $Fe^{2+}$, $Fe^{3+}$, $Co^{2+}$, or $Co^{3+}$ is particularly preferable. A content of the metal ion Me1 is preferably 5% by mole or less, more preferably 2% by mole or less, and still more preferably 0.1% by mole or less, with respect to 1 mole of all the metal ions of the metal azo pigment.

With regard to the metal azo pigments, reference can be made to the descriptions in paragraph Nos. 0011 to 0062 and 0137 to 0276 of JP2017-171912A, paragraph Nos. 0010 to 0062 and 0138 to 0235 of JP2017-171913A, paragraph Nos. 0011 to 0062 and 0139 to 0190 of JP2017-171914A, and paragraph Nos. 0010 to 0065 and 0142 to 0222 of JP2017-171915A, the contents of which are incorporated herein by reference.

Furthermore, as the red pigment, a compound having a structure in which an aromatic ring group with an aromatic ring to which a group having an oxygen atom, a sulfur atom, or a nitrogen atom bonded thereto is introduced is bonded to a diketopyrrolopyrrole skeleton can also be used. As such a compound, a compound represented by Formula (DPP1) is preferable, and a compound represented by Formula (DPP2) is more preferable.

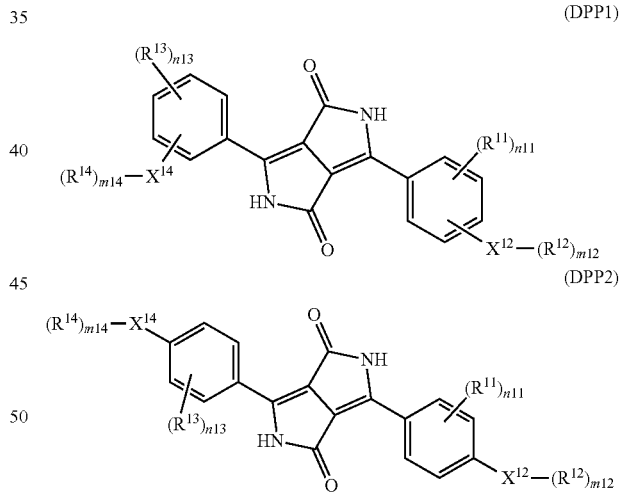

In Formula, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom; and in a case where $X^{12}$ is the oxygen atom or the sulfur atom, m12 represents 1, in a case where $X^{12}$ is the nitrogen atom, m12 represents 2, in a case where $X^{14}$ is the oxygen atom or the sulfur atom, m14 represents 1, and in a case where $X^{14}$ is the nitrogen atom, m14 represents 2. Specific preferred examples of the substituent represented by each of $R^{11}$ and $R^{13}$ include an alkyl group, an aryl group, a halogen atom, an acyl group, an alkoxycarbonyl group, an aryloxycarbonyl group, a heteroaryloxycarbonyl group, an amido group, a cyano group, a nitro group, a trifluoromethyl group, a sulfoxide group, and a sulfo group.

Moreover, as the green pigment, a halogenated zinc phthalocyanine pigment having 10 to 14 halogen atoms on average, 8 to 12 bromine atoms on average, and 2 to 5 chlorine atoms on average in one molecule can also be used. Specific examples thereof include the compounds described in WO2015/118720A.

In addition, an aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

The dye is not particularly limited and known dyes can be used. In terms of the chemical structures, a dye such as a pyrazole azo-based dye, an anilino azo-based dye, a triarylmethane-based dye, an anthraquinone-based dye, an anthrapyridone-based dye, a benzylidene-based dye, an oxonol-based dye, a pyrazolotriazole azo-based dye, a pyridone azo-based dye, a cyanine-based dye, a phenothiazine-based dye, a pyrrolopyrazole azomethine-based dye, a xanthene-based dye, a phthalocyanine-based dye, a benzopyran-based dye, an indigo-based dye, or a pyrromethene-based dye can be used. In addition, a multimer of such a dye may be used. In addition, the dyes described in JP2015-028144A or JP2015-034966A can also be used.

The color filter 111 preferably includes a surfactant. Examples of the surfactant include the above-mentioned surfactants, with the fluorine-based nonionic surfactant being preferable. By incorporating the surfactant into the color filter 111, the coating properties of the composition used for forming the color filter 111 can be improved. For example, as shown in FIG. 1, even in a case where the color filter 111 is formed on the near-infrared cut filter 112, the color filter 111 can be formed on the near-infrared cut filter 112 with good coating properties.

The color filter 111 preferably includes a resin. Examples of the kind of the resin include a (meth)acrylic resin, a (meth)acrylamide resin, a maleimide resin, a styrene resin, an epoxy resin, a polyester resin, a polycarbonate resin, a polyether resin, a polyarylate resin, a polysulfone resin, a polyethersulfone resin, a polyphenylene ether resin, a polyphenylene oxide resin, a polyphenylene sulfide resin, a polyimide resin, a polybenzoxazole resin, and a cyclic olefin resin.

An absolute value of the difference between the glass transition temperature of the resin included in the color filter 111 (a mass-average value of the glass transition temperatures of the two or more kinds of resins in a case where the number of kinds of resins included in the color filter 111 is 2 or more), and the glass transition temperature of the resin included in the near-infrared cut filter 112 (a mass-average value of the glass transition temperatures of the two or more kinds of resins in a case where the number of kinds of resins included in the near-infrared cut filter 112 is 2 or more) is preferably 5° C. to 600° C. The upper limit is preferably 450° C. or lower, and more preferably 500° C. or lower. The lower limit is preferably 10° C. or higher, and more preferably 50° C. or higher. In a case where the difference between the glass transition temperatures of the both is within the above range, an effect of suppressing the color transfer of the chromatic coloring agent to the near-infrared cut filter that is transparent to visible light can be expected.

The color filter 111 may further include a cured product derived from a polymerizable monomer, a cured product derived from an epoxy compound, an antioxidant, an ultraviolet absorber, and the like.

<<Second Pixels>>

Next, the second pixels will be described. The second pixels are pixels including the near-infrared transmitting filter 120. The second pixels may be constituted of only the near-infrared transmitting filter 120 or may have another layer in addition to the near-infrared transmitting filter 120. Incidentally, in the present invention, the near-infrared transmitting filter is a filter that transmits at least a part of the near-infrared rays. The near-infrared transmitting filter may be a filter (transparent film) that transmits both visible light and near-infrared rays, or may also be a filter that shields at least a part of visible light and transmits at least a part of near-infrared rays. It is preferable that the near-infrared transmitting filter is a filter that shields at least a part of visible light and transmits at least a part of near-infrared rays for a reason that the accuracy in sensing using near-infrared rays is more easily increased. Further, in a case where the near-infrared transmitting filter is a filter that shields at least a part of visible light and transmits at least a part of near-infrared rays, the near-infrared transmitting filter may be constituted only with a single-layer film, or may also be constituted of a laminate (multilayer film) of the films with two or more layers. In a case where the near-infrared transmitting filter is constituted of a laminate (multilayer film) of the films with two or more layers, the entire multilayer film only needs to have the spectral characteristics as described later, and it is not necessary that the film itself with a single layer has the spectral characteristics as described later, respectively.

It is preferable that the near-infrared transmitting filter 120 satisfies the spectral characteristics that the maximum value of the transmittance in the wavelength range of 400 to 640 nm is 20% or less and the minimum value of the transmittance in the wavelength range of 1,100 to 1,300 nm is 70% or more. The maximum value of the transmittance in the wavelength range of 400 to 640 nm is preferably 15% or less, and more preferably 10% or less. The minimum value of the transmittance in a wavelength range of 1,100 to 1,300 nm is preferably 75% or more, and more preferably 80% or more.

It is more preferable that the near-infrared transmitting filter 120 satisfies spectral characteristics of any one of (1) to (4) below.

(1): An aspect in which the maximum value of the transmittance in a wavelength range of 400 to 640 nm is 20% or less (preferably 15% or less, and more preferably 10% or less) and the minimum value of the transmittance in a wavelength range of 800 to 1,300 nm is 70% or more (preferably 75% or more, and more preferably 80% or more). According to this aspect, it is possible to use a filter capable of shielding light in a wavelength range of 400 to 640 nm and transmitting light at a wavelength of more than 670 nm.

(2): An aspect in which the maximum value of the transmittance in a wavelength range of 400 to 750 nm is 20% or less (preferably 15% or less, and more preferably 10% or less) and the minimum value of the transmittance in a wavelength range of 900 to 1,300 nm is 70% or more (preferably 75% or more, and more preferably 80% or more). According to this aspect, it is possible to use a filter capable of shielding light in a wavelength range of 400 to 750 nm and transmitting light at a wavelength of more than 850 nm.

(3): An aspect in which the maximum value of the transmittance in a wavelength range of 400 to 830 nm is 20% or less (preferably 15% or less, and more preferably 10% or less) and the minimum value of the transmittance in a wavelength range of 1,000 to 1,300 nm is 70% or more (preferably 75% or more, and more preferably 80% or more). According to this aspect, it is possible to use a filter capable of shielding light in a wavelength range of 400 to 830 nm and transmitting light at a wavelength of more than 940 nm.

(4): An aspect in which the maximum value of the transmittance in a wavelength range of 400 to 950 nm is 20% or less (preferably 15% or less, and more preferably 10% or less) and the minimum value of the transmittance in a wavelength range of 1,100 to 1,300 nm is 70% or more (preferably 75% or more, and more preferably 80% or more). According to this aspect, it is possible to use a filter capable of shielding light in a wavelength range of 400 to 950 nm and transmitting light at a wavelength of more than 1,040 nm.

The near-infrared transmitting filter 120 preferably contains a color material that transmits at least a part of light in the near-infrared region and shields light in the visible region (hereinafter also referred to as a color material that shields visible light). The color material that shields visible light is preferably a material that absorbs light in a wavelength range from violet to red. Further, the color material that shields visible light is preferably a color material that shields visible light is a color material that shields light in a wavelength range of 400 to 640 nm. In addition, the color material that shields visible light is preferably a material that transmits light at a wavelength of 1,000 to 1,100 nm. Further, the color material that shields visible light preferably satisfies the following requirements (A) or (B).

(A): Two or more kinds of chromatic coloring agents are included and a combination of the two or more chromatic coloring agents forms black.

(B): An organic black coloring agent is included.

Examples of the chromatic coloring agent include the above-mentioned chromatic coloring agents. The chromatic coloring agent used for the color material that shields visible light may be a pigment or a dye.

Examples of the organic black coloring agent include a bisbenzofuranone compound, an azomethine compound, a perylene compound, and an azo-based compound, and the bisbenzofuranone compound or the perylene compound is preferable. Examples of the bisbenzofuranone compound include those described in JP2010-534726A, JP2012-515233A, JP2012-515234A, WO2014/208348A, JP2015-525260A, and the like, and are available as, for example, "Irgaphor Black" manufactured by BASF. Examples of the perylene compound include C. I. Pigment Black 31 and 32. Examples of the azomethine compound include those described in JP1989-170601A (JP-H01-170601A), JP1990-034664A (JP-H02-034664A), and the like, and are available as, for example, "CHROMOFINE BLACK A1103" manufactured by Dainichiseika Color & Chemicals Mfg. Co., Ltd.

The bisbenzofuranone compound is preferably a compound represented by each of Formulae (BF-1) to (BF-3).

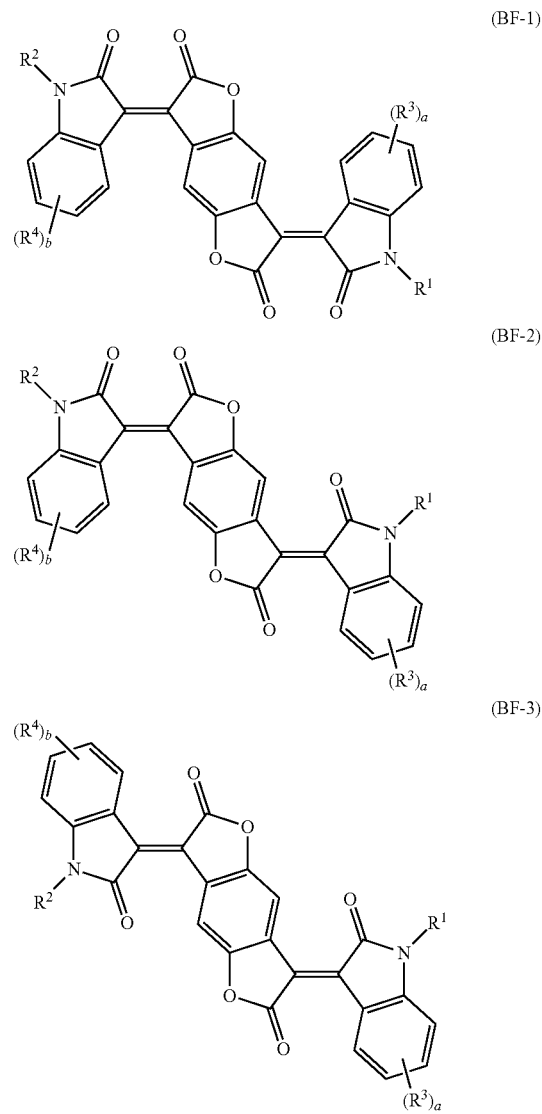

In the formulae, $R^1$ and $R^2$ each independently represent a hydrogen atom or a substituent, $R^3$ and $R^4$ each independently represent a substituent, and a and b each independently represent an integer of 0 to 4; and in a case where a is 2 or more, a plurality of $R^3$'s may be the same as or different from each other and the plurality of $R^3$'s may be bonded to each other to form a ring, and in a case where b is 2 or more, a plurality of $R^4$'s may be the same as or different from each other and the plurality of $R^4$'s may be bonded to each other to form a ring.

The substituent represented by each of $R^1$ to $R^4$ represents a halogen atom, a cyano group, a nitro group, an alkyl group, an alkenyl group, alkynyl group, an aralkyl group, an aryl group, a heteroaryl group, $-OR^{301}$, $-COR^{302}$, $-COOR^{303}$, $-OCOR^{304}$, $-NR^{305}R^{306}$, $-NHCOR^{307}$, $-CONR^{308}R^{309}$, $-NHCONR^{310}R^{311}$, $-NHCOOR^{312}$, $-SR^{313}$, $-SO_2R^{314}$, $-SO_2OR^{315}$, $-NHSO_2R^{316}$, or $-SO_2NR^{317}R^{318}$, and $R^{301}$ to $R^{318}$ each independently represent a hydrogen atom, an alkyl group, an alkenyl group, an alkynyl group, an aryl group, or a heteroaryl group.

With regard to details of the bisbenzofuranone compounds, reference can be made to the descriptions in paragraph Nos. 0014 to 0037 of JP2010-534726A, the contents of which are incorporated herein by reference.

Examples of the perylene compound include compounds represented by Formulae (Per1) to (Per3).

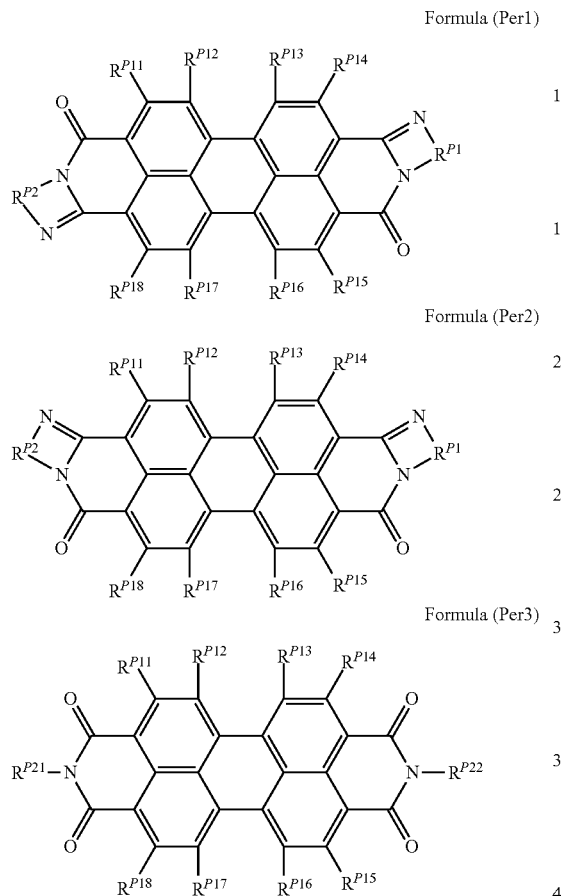

In the formulae, $R^{P1}$ and $R^{P2}$ each independently represent phenylene, naphthylene, or pyridylene.

The phenylene, the naphthylene, and the pyridylene represented by each of $R^{P1}$ and $R^{P2}$ may be unsubstituted or may have a substituent. Examples of the substituent include a halogen atom, a cyano group, a nitro group, an alkyl group, an alkenyl group, an alkynyl group, an aralkyl group, an aryl group, a heteroaryl group, —$OR^{P101}$, —$COR^{P102}$, —CO-$OR^{P103}$, —$OCOR^{P104}$, —$NR^{P105}R^{P106}$, —$NHCOR^{P107}$, —$CONR^{P108}R^{P109}$, —$NHCONR^{P110}R^{P111}$, —NHCO-$OR^{P112}$, —$SR^{P113}$, —$SO_2R^{P114}$, —$SO_2OR^{P115}$, —$NHSO_2R^{P116}$, and —$SO_2NR^{P117}R^{P118}$, and the alkyl group, the alkoxy group, the hydroxyl group, the nitro group, and the halogen atom are preferable. $R^{P101}$ to $R^{P118}$ each independently represent a hydrogen atom, an alkyl group, an alkenyl group, an alkynyl group, an aryl group, or a heteroaryl group. In a case where these groups are further substitutable groups, they may further have a substituent. Examples of the substituent include the above-mentioned substituents.

$R^{P11}$ to $R^{P18}$ each independently represent a hydrogen atom or a substituent. Examples of the substituent represented b each of $R^{P11}$ to $R^{P18}$ include the above-mentioned substituents, and the halogen atom is preferable. As the halogen atom, F, Cl, or Br is preferable.

$R^{P21}$ and $R^{P22}$ each independently represent a substituent. Examples of the substituent represented by each of $R^{P21}$ and $R^{P22}$ include the above-mentioned substituents, and the aralkyl group is preferable. The aralkyl group may further have the above-mentioned substituent.

Specific examples of the perylene compound include compounds having the following structures. As the perylene compound, C. I. Pigment Black 31 and 32 can also be used.

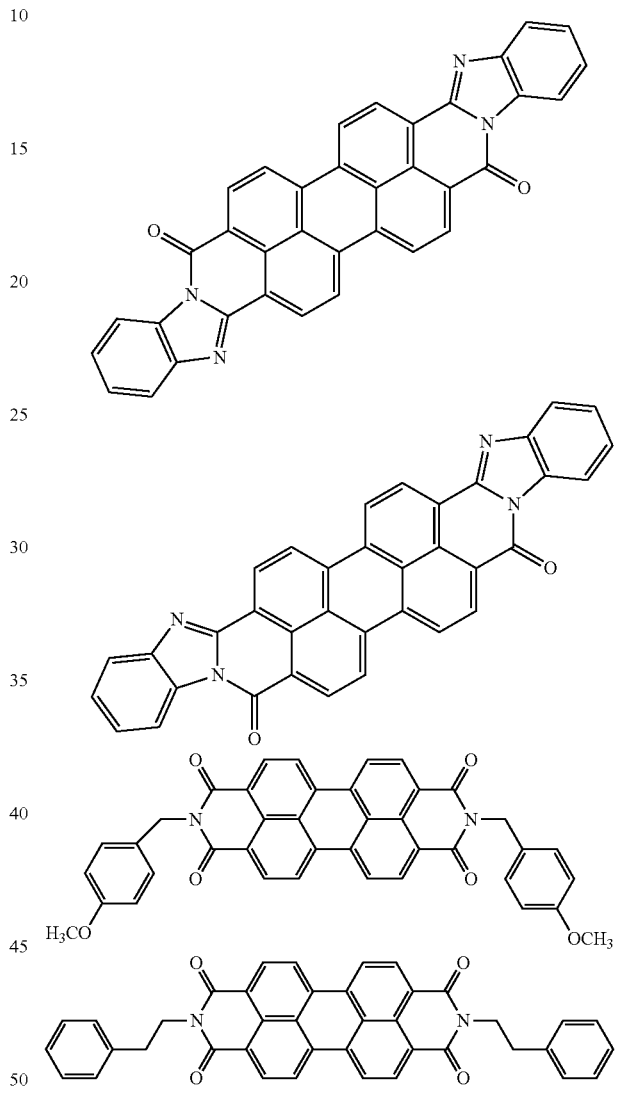

Examples of preferred combinations of the chromatic coloring agent in the aspect (A) include the following ones.
- (A-1) An aspect in which a red coloring agent and a blue coloring agent are contained.
- (A-2) An aspect in which a red coloring agent, a blue coloring agent, and a yellow coloring agent are contained.
- (A-3) An aspect in which a red coloring agent, a blue coloring agent, a yellow coloring agent, and a violet coloring agent are contained.
- (A-4) An aspect in which a red coloring agent, a blue coloring agent, a yellow coloring agent, a violet coloring agent, and a green coloring agent are contained.
- (A-5) An aspect in which a red coloring agent, a blue coloring agent, a yellow coloring agent, and a green coloring agent are contained.

(A-6) An aspect in which a red coloring agent, a blue coloring agent, and a green coloring agent are contained.

(A-7) An aspect in which a yellow coloring agent and a violet coloring agent are contained.

In the aspect of (A-1), the mass ratio of the red coloring agent to the blue coloring agent in terms of red coloring agent:blue coloring agent is preferably 20 to 80:20 to 80, more preferably 20 to 60:40 to 80, and still more preferably 20 to 50:50 to 80.

In the aspect of (A-2), the mass ratio of the red coloring agent to the blue coloring agent to the yellow coloring agent in terms of red coloring agent:blue coloring agent:yellow coloring agent is preferably 10 to 80:20 to 80:10 to 40, more preferably 10 to 60:30 to 80:10 to 30, and still more preferably 10 to 40:40 to 80:10 to 20.

In the aspect of (A-3), the mass ratio of the red coloring agent to the blue coloring agent to the yellow coloring agent to the violet coloring agent in terms of red coloring agent:blue coloring agent:yellow coloring agent:violet coloring agent is preferably 10 to 80:20 to 80:5 to 40:5 to 40, more preferably 10 to 60:25 to 80:5 to 30:5 to 30, and still more preferably 10 to 40:25 to 50:10 to 30:10 to 30.

In the aspect of (A-4), the mass ratio of the red coloring agent to the blue coloring agent to the yellow coloring agent to the violet coloring agent to the green coloring agent in terms of red coloring agent:blue coloring agent:yellow coloring agent:violet coloring agent:green coloring agent is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the aspect of (A-5), the mass ratio of the red coloring agent to the blue coloring agent to the yellow coloring agent to the green coloring agent in terms of red coloring agent:blue coloring agent:yellow coloring agent:green coloring agent is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect of (A-6), the mass ratio of the red coloring agent to the blue coloring agent to the green coloring agent in terms of red coloring agent:blue coloring agent:green coloring agent is preferably 10 to 80:20 to 80:10 to 40, more preferably 10 to 60:30 to 80:10 to 30, and still more preferably 10 to 40:40 to 80:10 to 20.

In the aspect of (A-7), the mass ratio of the yellow coloring agent to the violet coloring agent in terms of yellow coloring agent:violet coloring agent is preferably 10 to 50:40 to 80, more preferably 20 to 40:50 to 70, and still more preferably 30 to 40:60 to 70.

In the aspect of (B), it is also preferable that a chromatic coloring agent is further contained. By using the organic black coloring agent in combination of the chromatic coloring agent, excellent spectral characteristics are easily obtained. With regard to a mixing ratio of the chromatic coloring agent to the organic black coloring agent, the amount of the organic black coloring agent is preferably 10 to 200 parts by mass, and more preferably 15 to 150 parts by mass, with respect to 100 parts by mass of the organic black coloring agent.

Examples of the chromatic coloring agent which is used in combination with the organic black coloring agent include a red coloring agent, a blue coloring agent, a yellow coloring agent, a green coloring agent, and a violet coloring agent. By way of an example, an aspect in which one or more coloring agents B1 selected from the blue coloring agent and the green coloring agent, and one or more coloring agents B2 selected from the yellow coloring agent and the red coloring agent are used in combination may be mentioned. The coloring agent B1 is preferably the blue coloring agent. The coloring agent B2 is preferably the yellow coloring agent. In this aspect, a mass ratio of the organic black coloring agent to the coloring agent B1 to the coloring agent B2 is preferably as follows: Organic black coloring agent:Coloring agent B1:Coloring agent B2=40 to 80:10 to 40:10 to 40.

Further, the organic black coloring agent used in the aspect (B) may be used singly or in combination of two or more kinds thereof. In a case where two or more kinds of the organic black coloring agents are used in combination, it is preferable to use a perylene compound and a bisbenzofuranone compound in combination. In this case, a content of the bisbenzofuranone compound in the total amount of the perylene compound and the bisbenzofuranone compound is preferably 10% to 70% by mass, and more preferably 20% to 60% by mass.

In the present invention, a content of the pigment in the color material that shields visible light is preferably 95% by mass or more, more preferably 97% by mass or more, and still more preferably 99% by mass or more, with respect to the total mass of the color material that shields visible light.

A content of the color material that shields visible light in the near-infrared transmitting filter 120 is preferably 10% to 70% by mass. The lower limit is preferably 30% by mass or more, and more preferably 40% by mass or more.

The near-infrared transmitting filter 120 can contain a near-infrared absorber. In the near-infrared transmitting filter, the near-infrared absorber plays a role in limiting transmissive light (near-infrared rays) to a longer wavelength side.

As the near-infrared absorber, a compound having a maximum absorption wavelength in the near-infrared region (preferably at a wavelength of 700 to 1,800 nm, more preferably at a wavelength of 700 to 1,300 nm, and still more preferably at a wavelength of 700 to 1,000 nm) can be preferably used. Examples of the near-infrared absorber include the near-infrared absorbing colorants described in the above-mentioned section of Near-Infrared Cut Filter, and other near-infrared absorbers.

In a case where the near-infrared transmitting filter 120 contains a near-infrared absorber, a content of the near-infrared absorber is preferably 1% to 30% by mass in the near-infrared transmitting filter 120. The upper limit is preferably 20% by mass or less, and more preferably 10% by mass or less. The lower limit is preferably 3% by mass or more, and more preferably 5% by mass or more.

Furthermore, a total content of the near-infrared absorber and the color material that shields visible light is preferably 10% to 70% by mass in the near-infrared transmitting filter 120. The lower limit is preferably 20% by mass or more, and more preferably 25% by mass or more. Further, the content of the near-infrared absorber in the total amount of the near-infrared absorber and the color material that shields visible light is preferably 5% to 40% by mass.

The upper limit is preferably 30% by mass or less, and more preferably 25% by mass or less. The lower limit is preferably 10% by mass or more, and more preferably 15% by mass or more.

The near-infrared transmitting filter 120 preferably includes a resin. Examples of the kind of the resin include a (meth)acrylic resin, a (meth)acrylamide resin, a maleimide resin, a styrene resin, an epoxy resin, a polyester resin, a polycarbonate resin, a polyether resin, a polyarylate resin, a polysulfone resin, a polyethersulfone resin, a polyphenylene ether resin, a polyphenylene oxide resin, a polyphenylene sulfide resin, a polyimide resin, a polybenzoxazole resin, and a cyclic olefin resin.

An absolute value of the difference between the glass transition temperature of the resin included in the near-infrared transmitting filter 120 (a mass-average value of the glass transition temperatures of two or more kinds of resins in a case where the number of kinds of resins included in the near-infrared transmitting filter 120 is 2 or more), and the glass transition temperature of the resin included in the near-infrared cut filter 112 (a mass-average value of the glass transition temperatures of two or more kinds of resins in a case where the number of kinds of resins included in the near-infrared cut filter 112 is 2 or more) is preferably 5° C. to 600° C. The upper limit is preferably 550° C. or lower, and more preferably 500° C. or lower. The lower limit is preferably 10° C. or higher, and more preferably 50° C. or higher. In a case where the difference between the glass transition temperatures of the both is within the above range, an effect of suppressing the color transfer of the chromatic coloring agent to the near-infrared cut filter that is transparent to visible light can be expected.

The near-infrared transmitting filter 120 may further include a surfactant, a cured product derived from a polymerizable monomer, a cured product derived from an epoxy compound, an antioxidant, an ultraviolet absorber, and the like.

In the second pixels, the thickness of the near-infrared transmitting filter 120 is preferably 20 μm or less, more preferably 10 μm or less, and particularly preferably 5 μm or less. The lower limit is not particularly limited, but can be 0.01 μm, for example. Further, the thickness of the second pixels (a total thickness of the near-infrared transmitting filter 120 and other layers in a case where such other layers are included in addition to the near-infrared transmitting filter 120) is preferably 20 μm or less, more preferably 10 μm or less, and particularly preferably 5 μm or less.

The lower limit is not particularly limited, but can be 0.01 μm, for example.

The line width of the pixel of the near-infrared transmitting filter is preferably 0.1 to 100.0 μm. The lower limit is preferably 0.1 μm or more, and more preferably 0.3 μm or more. The upper limit is preferably 50.0 μm or less, and more preferably 30.0 μm or less.

<Composition for Near-Infrared Cut Filter>

Next, the composition for a near-infrared cut filter used for producing the near-infrared cut filter in the structure of the embodiment of the present invention will be described.

(Near-Infrared Absorbing Colorant)

The composition for a near-infrared cut filter includes a near-infrared absorbing colorant. The near-infrared absorbing colorant used in the present invention is at least one selected from a colorant compound having a cation and an anion in the same molecule, a colorant compound which is a salt of a cationic chromophore and a counter anion, or a colorant compound which is a salt of an anionic chromophore and a counter cation. Details of the near-infrared absorbing colorant include those described in the section of Near-Infrared Cut Filter.

A content of the near-infrared absorbing colorant in the total solid content of the composition for a near-infrared cut filter is preferably 5% by mass or more, more preferably 10% by mass or more, and still more preferably 12% by mass or more. The upper limit is preferably 90% by mass or less, more preferably 80% by mass or less, and still more preferably 70% by mass or less.

(Other Near-Infrared Absorbers)

The composition for a near-infrared cut filter may further include a near-infrared absorber (also referred to as another near-infrared absorber) other than the above-mentioned near-infrared absorbing colorant.

Examples of such other near-infrared absorbers include pyrrolopyrrole compounds, phthalocyanine compounds, naphthalocyanine compounds, quaterrylene compounds, tungsten compounds, and metal borides. Details of such another near-infrared absorber include those described in the section of Near-Infrared Cut Filter.

A content of such another near-infrared absorber in the total solid content of the composition for a near-infrared cut filter is preferably 80% by mass or less, more preferably 70% by mass or less, and still more preferably 50% by mass or less. In addition, the content of such other near-infrared absorbers is preferably 1,500 parts by mass or less, more preferably 1,000 parts by mass or less, and 500 parts by mass or less, with respect to 100 parts by mass of the above-mentioned near-infrared absorbing colorant.

Moreover, it is also preferable that the composition for a near-infrared cut filter does not substantially contain another near-infrared absorber. According to this aspect, more excellent heat resistance can be easily obtained. In addition, a case where the composition for a near-infrared cut filter does not substantially contain such another near-infrared absorber means that a content of such another near-infrared absorber in the composition for a near-infrared cut filter is 0.5% by mass or less, the content is more preferably 0.1% by mass or less, and it is still more preferable that such another near-infrared absorber is not contained.

(At Least One Compound Selected from Group Consisting of Resin Having Glass Transition Temperature of 100° C. or Higher and Precursor of Resin Having Glass Transition Temperature of 100° C. or Higher)

The composition for a near-infrared cut filter contains at least one compound selected from the group consisting of a resin having a glass transition temperature of 100° C. or higher and a precursor of the resin having a glass transition temperature of 100° C. or higher, and preferably contains the resin having a glass transition temperature of 100° C. or higher. Hereinafter, the resin having a glass transition temperature of 100° C. or higher will also be referred to as a resin A. The precursor of the resin having a glass transition temperature of 100° C. or higher will also be referred to as a precursor A. In addition, the resin A and the precursor A are collectively referred to as a compound A.

The glass transition temperature of the resin A is 100° C. or higher, preferably 130° C. or higher, and more preferably 150° C. or higher. The upper limit is preferably 500° C. or lower, more preferably 450° C. or lower, and still more preferably 400° C. or lower for a reason that generation of cracks is easily suppressed. Further, the glass transition temperature of a resin obtained from the precursor A is 100° C. or higher, preferably 130° C. or higher, and more preferably 150° C. or higher. The upper limit is preferably 500° C. or lower, more preferably 450° C. or lower, and still more preferably 400° C. or lower for a reason that generation of cracks is easily suppressed.

The weight-average molecular weight (Mw) of the resin A is preferably 3,000 to 350,000, more preferably 4,000 to 250,000, and particularly preferably 5,000 to 250,000. The number-average molecular weight (Mn) is preferably 3,000 to 150,000, and more preferably 3,000 to 100,000. Further, the weight-average molecular weight (Mw) of the resin obtained from the precursor A is preferably 3,000 to 350,000, more preferably 4,000 to 250,000, and particularly preferably 5,000 to 250,000. The number-average molecular weight (Mn) is preferably 3,000 to 150,000, and more preferably 3,000 to 100,000.

Examples of the kind of the resin A include a (meth)acrylic resin, a (meth)acrylamide resin, a maleimide resin, a styrene resin, an epoxy resin, a polyester resin, a polycarbonate resin, a polyether resin, a polyarylate resin, a polysulfone resin, a polyether sulfone resin, a polyphenylene ether resin, a polyphenylene oxide resin, a polyphenylene sulfide resin, a polyimide resin, a polybenzoxazole resin, and a cyclic olefin resin, the (meth)acrylic resin, the (meth)acrylamide resin, the cyclic olefin resin, or the polyimide resin is preferable, and for a reason that the effects of the present inventions can be more remarkably obtained, the cyclic olefin resin is more preferable, and the norbornene resin is particularly preferable. As the cyclic olefin resin, the above-mentioned resin including a repeating unit represented by Formula (CO-1) is preferable. Specific examples of the resin A include ARTON F4520 and D4540 (both manufactured by JSR Corporation, norbornene resins), and Neopulim S-200 (manufactured by Mitsubishi Gas Chemical Company, a polyimide resin).

Examples of the kind of the precursor A include a polyimide precursor and a polybenzoxazole precursor.

The compound A may have an acidic group or a group in which an acid group or a hydroxy group is protected with an acid-decomposable group. In a case where the composition for a near-infrared cut filter is a negative tone composition, it is preferable that the compound A has the acidic group. In addition, in a case where the composition for a near-infrared cut filter is a positive tone composition, it is preferable that the compound A has the group in which the acid group or the hydroxy group is protected by an acid-decomposable group.

From the viewpoint of a pattern forming property, as the acidic group, a carboxy group, a phenolic hydroxyl group, a sulfo group, a sulfonamido group, a phosphonic acid group, or a phosphoric acid group is preferable, the carboxy group, the phenolic hydroxyl group, the sulfo group, or the sulfonamido group is more preferable, the carboxy group, the phenolic hydroxyl group, or the sulfonamido group is still more preferable, and the carboxy group is particularly preferable.

From the viewpoint of the pattern forming property, as the acid group in the group in which the acid group or the hydroxyl group is protected with an acid-decomposable group, a carboxy group, a phenolic hydroxyl group, a sulfo group, a phosphonic acid group, or a phosphoric acid group is preferable, the carboxy group or the phenolic hydroxyl group is more preferable, and the carboxy group is particularly preferable.

Furthermore, the hydroxyl group in the group in which the acid group or the hydroxyl group is protected by an acid-decomposable group is preferably a phenolic hydroxyl group.

From the viewpoint of sensitivity and a pattern forming property, as the acid-decomposable group, at least one group selected from the group consisting of a tertiary alkyl group and an acetal-type acid-decomposable group is preferable, and the acetal-type acid-decomposable group is more preferable.

As the tertiary alkyl group, a t-butyl group is preferable.

As the acetal-type acid-decomposable group, a 1-alkoxy-alkyl group, a 2-tetrahydrofuranyl group, or a 2-tetrahydropyranyl group is preferable.

A content of the compound A in the total solid content of the composition for a near-infrared cut filter is preferably 10% to 95% by mass. The lower limit is preferably 20% by mass or more, and more preferably 40% by mass or more. The upper limit is preferably 90% by mass or less, and more preferably 85% by mass or less. Further, a content of the resin A in the total solid content of the composition for a near-infrared cut filter is preferably 10% to 95% by mass. The lower limit is preferably 20% by mass or more, and more preferably 40% by mass or more. The upper limit is preferably 90% by mass or less, and more preferably 85% by mass or less.

(Other Resins)

The composition for a near-infrared cut filter may contain a resin other than the resin A described above (hereinafter also referred to as another resin). Another resin is blended, for example, in an application for dispersing particles such as pigments in the composition or in an application as a binder. Incidentally, a resin which is used for dispersing particles such as a pigment in a composition is also referred to as a dispersant. However, such the application of the resin is only exemplary, and the resin can also be used for other purposes other than such the application.

The weight-average molecular weight (Mw) of such another resin is preferably 3,000 to 350,000, more preferably 4,000 to 250,000, and particularly preferably 5,000 to 250,000.

Examples of the kind of such another resin include a (meth)acrylic resin, a (meth)acrylamide resin, a maleimide resin, and a styrene resin.

Such another resin may be a resin having an acid group. Examples of the acid group include a carboxyl group, a phosphoric acid group, a sulfo group, and a phenolic hydroxyl group, with the carboxyl group being preferable. The acid value of the resin having an acid group is preferably 30 to 200 mgKOH/g. The lower limit is preferably 50 mgKOH/g or more, and more preferably 70 mgKOH/g or more. The upper limit is preferably 150 mgKOH/g or less, and more preferably 120 mgKOH/g or less.

Such another resin may have a polymerizable group. Examples of the polymerizable group include a (meth)allyl group and a (meth)acryloyl group. Examples of a commercially available product thereof include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), and ACRYCURE RD-F8 (manufactured by Nippon Shokubai Co., Ltd.).

Such another resin may include a repeating unit derived from a compound represented by Formula (ED1) and/or a compound represented by Formula (ED2) (these compounds will hereinafter also be referred to as an "ether dimer" in some cases).

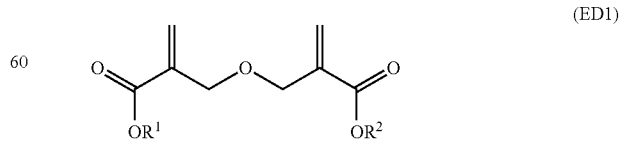

(ED1)

In Formula (ED1), $R^1$ and $R^2$ each independently represent a hydrogen atom, or a hydrocarbon group having 1 to 25 carbon atoms, which may have a substituent.

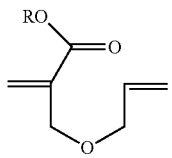

(ED2)

In Formula (ED2), R represents a hydrogen atom or an organic group having 1 to 30 carbon atoms. With regard to Formula (ED2), reference can be made to the descriptions in JP2010-168539A.

With regard to the ether dimer, reference can be made to paragraph No. 0317 of JP2013-029760A, the contents of which are incorporated herein by reference.

Such another resin may include a repeating unit derived from a compound represented by Formula (X).

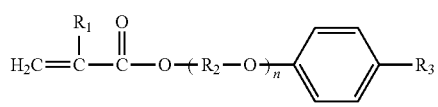

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may contain a benzene ring. n represents an integer of 1 to 15.

With regard to such another resin, reference can be made to the descriptions in paragraph Nos. 0558 to 0571 of JP2012-208494A (paragraph Nos. 0685 to 0700 of the corresponding US2012/0235099A) and the descriptions in paragraph Nos. 0076 to 0099 of JP2012-198408A, the contents of which are incorporated herein by reference.

The composition for a near-infrared cut filter can also include a resin as the dispersant. Examples of the dispersant include an acidic dispersant (acidic resin) and a basic dispersant (basic resin). Here, the acidic dispersant (acidic resin) represents a resin in which the amount of the acid group is more than the amount of the basic group. The acidic dispersant (acidic resin) is preferably a resin in which the amount of the acid group occupies 70% by mole or more in a case where the total amount of the acid group and the basic group is 100% by mole, and more preferably a resin consisting substantially of only an acid group. The acid group contained in the acidic dispersant (acidic resin) is preferably a carboxyl group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is more than the amount of the acid group. The basic dispersant (basic resin) is preferably a resin in which the amount of the basic group occupies more than 50% by mole in a case where the total amount of the acid group and the basic group is 100% by mole. The basic group contained in the basic dispersant is preferably an amino group. The resin which is used as the dispersant preferably includes a repeating unit having an acid group.

It is also preferable that the resin used as the dispersant is a graft copolymer. Since the graft copolymer has affinity with a solvent due to its the graft chain, it is excellent in dispersibility of a pigment and dispersion stability after the lapse of time. With regard to the details of the graft copolymer, reference can be made to the descriptions in paragraph Nos. 0025 to 0094 of JP2012-255128A, the contents of which are incorporated herein by reference.

In addition, examples of the graft copolymer include the resins described in paragraph Nos. 0072 to 0094 of JP2012-255128A, the contents of which are incorporated herein by reference. Furthermore, it is also preferable that the resin used as the dispersant is an oligoimine-based copolymer including a nitrogen atom at at least one of a main chain or a side chain. With regard to the oligoimine-based copolymer, reference can be made to the descriptions in paragraph Nos. 0102 to 0174 of JP2012-255128A, the contents of which are incorporated herein by reference. The dispersant is also available as a commercially available product, and specific examples thereof include Disperbyk-111 (manufactured by BYK Chemie), and Solsperse 36000 and 76500, both manufactured by The Lubrizol Corporation. Further, the pigment dispersant described in paragraph Nos. 0041 to 0130 of JP2014-130338A, the contents of which are incorporated herein by reference, can also be used.

A content of such another resin in the total solid content of the composition for a near-infrared cut filter is preferably 75% by mass or less, more preferably 50% by mass or less, and still more preferably 25% by mass or less. In a case where the composition for a near-infrared cut filter contains another resin, crack suppression, or an effect that the function can be exhibited in a case where such another resin is a functional resin (for example, a dispersion resin or an alkali-development resin) can be expected.

It is also preferable that the composition for a near-infrared cut filter does not substantially contain other resins.

According to this aspect, an effect of suppressing phase separation during film formation can be expected. In addition, a case where the composition for a near-infrared cut filter does not substantially contain another resin means that a content of such another resin in the total solid content of the composition for a near-infrared cut filter is 0.5% by mass or less, the content is preferably 0.1% by mass or less, and it is more preferable that the composition for a near-infrared cut filter does not contain another resin.

(Surfactant)

The composition for a near-infrared cut filter includes a surfactant. As the surfactant, various surfactants such as a fluorine-based surfactant, a nonionic surfactant, a cationic surfactant, an anionic surfactant, and a silicon-based surfactant can be used, and for a reason that more excellent heat resistance and an effect of suppressing voids are easily obtained, the fluorine-based surfactant is preferable. Furthermore, a composition having excellent coating properties can be obtained by using the fluorine-based surfactant. Details of the surfactant include those described in the section of Near-Infrared Cut Filter.

A content of the surfactant is preferably 0.01% to 1% by mass with respect to the composition for a near-infrared cut filter. The upper limit is preferably 0.5% by mass or less, more preferably 0.1% by mass or less, and still more preferably 0.05% by mass or less. The lower limit is preferably 0.015% by mass or more.

(Solvent)

The composition for a near-infrared cut filter preferably contains a solvent. Examples of the solvent include an organic solvent. Examples of the organic solvent include the following organic solvents. Examples of the ester-based solvent include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate (for example, methyl alkyloxyacetate, ethyl alkyloxyacetate, butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate, ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate, and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate. Examples of the ether-based solvent include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monobutyl ether acetate, propylene glycol monomethyl ether, propylene glycol monomethyl ether acetate, propylene glycol monoethyl ether acetate, and propylene glycol monopropyl ether acetate. Examples of the ketone-based solvent include methyl ethyl ketone, cyclohexanone, cyclopentanone, 2-heptanone, and 3-heptanone. Examples of the aromatic hydrocarbon-based solvent include toluene and xylene. Moreover, examples of the halogen-based solvent include dichloromethane and trichloromethane.

In the present invention, it is preferable to use a solvent having a small metal content, and the metal content of the solvent is preferably, for example, 10 parts per billion (ppb) by mass or less. The metal content of the solvent is at a level of parts per trillion (ppt), as desired, and such a high-purity solvent is provided by, for example, Toyo Kasei Kogyo Co., Ltd. (The Chemical Daily, Nov. 13, 2015).

Examples of a method for removing impurities such as a metal from the solvent include distillation (for example, molecular distillation and thin-film distillation) and filtering using a filter. The pore diameter of a filter used for the filtering is preferably 10 µm or less, more preferably 5 µm or less, and still more preferably 3 µm or less. As a material for the filter, polytetrafluoroethylene, polyethylene, or nylon is preferable.

The solvent may include an isomer (a compound having the same number of atoms and a different structure).

Furthermore, the solvent may include only one isomer or a plurality of isomers.

In the present invention, as the organic solvent, an organic solvent containing 0.8 mmol/L or less of a peroxide is preferable, and an organic solvent substantially not including a peroxide is more preferable.

The content of the solvent is preferably 10% to 90% by mass, more preferably 20% to 90% by mass, and still more preferably 30% to 90% by mass with respect to the total amount of the composition for a near-infrared cut filter.

(Polymerizable Monomer)

The composition for a near-infrared cut filter can contain a polymerizable monomer. The polymerizable monomer is preferably a compound that can be polymerized by the action of a radical. That is, the polymerizable monomer is preferably a radical polymerizable monomer. The polymerizable monomer is preferably a compound having one or more groups having an ethylenically unsaturated bond, more preferably a compound having two or more groups having an ethylenically unsaturated bond, and still more preferably a compound having three or more groups having an ethylenically unsaturated bond. The upper limit of the number of the groups having an ethylenically unsaturated bond is, for example, preferably 15 or less, and more preferably 6 or less. Examples of the group having an ethylenically unsaturated bond include a vinyl group, a styrene group, an (meth)allyl group, and a (meth)acryloyl group, with the (meth)acryloyl group being preferable. The polymerizable monomer is preferably a trifunctional to pentadecafunctional (meth)acrylate compound, and more preferably a trifunctional to hexafunctional (meth)acrylate compound.

The molecular weight of the polymerizable monomer is preferably 100 to 3,000. The upper limit is preferably 2,000 or less, and more preferably 1,500 or less. The lower limit is preferably 150 or more, and more preferably 250 or more.

As the polymerizable monomer, ethyleneoxy-modified pentaerythritol tetraacrylate (as a commercially available product, NK ESTER ATM-35E manufactured by Shin-Nakamura Chemical Co., Ltd.); dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.); and a compound having a structure in which the (meth)acryloyl group is bonded through an ethylene glycol residue and/or a propylene glycol residue are preferable. Further, examples of the polymerizable monomer include the polymerizable monomers described in paragraph Nos. 0034 to 0038 of JP2013-253224A and paragraph No. 0477 of JP2012-208494A, the contents of which are incorporated herein by reference. Further, as the polymerizable monomer, diglycerin ethylene oxide (EO)-modified (meth)acrylate (M-460 as a commercially available product; manufactured by Toagosei Co., Ltd.), pentaerythritol tetraacrylate (manufactured by Shin-Nakamura Chemical Co., Ltd., A-TMMT), 1,6-hexanediol diacrylate (manufactured by Nippon Kayaku Co., Ltd., KAYARAD HDDA), RP-1040 (manufactured by Nippon Kayaku Co., Ltd.), ARONIX TO-2349 (manufactured by Toagosei Co., Ltd.), NK Oligo UA-7200 (manufactured by Shin Nakamura Chemical Co., Ltd.), 8UH-1006 or 8UH-1012 (manufactured by Taisei Fine Chemical Co., Ltd.), or the like can also be used.

The polymerizable monomer may have an acid group such as a carboxyl group, a sulfo group, and a phosphoric acid group. Examples of a commercially available product of the polymerizable monomer having an acid group include ARONIX M-305, M-510, and M-520 (manufactured by Toagosei Co., Ltd.). The acid value of the polymerizable monomer having an acid group is preferably 0.1 to 40 mgKOH/g. The lower limit is preferably 5 mgKOH/g or more. The upper limit is preferably 30 mgKOH/g or less.

A compound having a caprolactone structure can also be used as the polymerizable monomer. With regard to examples of the compound having a caprolactone structure, reference can be made to the descriptions in paragraphs 0042 to 0045 of JP2013-253224A, the contents of which are incorporated herein by reference. Examples of the compound having a caprolactone structure include DPCA-20, DPCA-30, DPCA-60, and DPCA-120, which are commercially available from Nippon Kayaku Co., Ltd. as the KAYARAD DPCA series.

As the polymerizable monomer, a compound having a group having an ethylenically unsaturated bond and an alkyleneoxy group can also be used. As the compound having a group having an ethylenically unsaturated bond and an alkyleneoxy group, a compound having an ethylenically unsaturated bond and an ethyleneoxy group and/or propyleneoxy group is preferable, a compound having a group having an ethylenically unsaturated bond and an ethyleneoxy group is more preferable, and a tri- to hexafunctional (meth)acrylate compound having 4 to 20 ethyleneoxy groups is still more preferable. Examples of a commercially available product of the compound having a group having an ethylenically unsaturated bond and an alkyleneoxy group include SR-494 which is a tetrafunctional (meth)acrylate having 4 ethyleneoxy groups, manufactured by Sartomer, and KAYARAD TPA-330 which is a trifunctional (meth)acrylate having 3 isobutyleneoxy groups.

As the polymerizable monomer, the urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable. In addition, the addition-polymerizable compounds having an amino structure or a sulfide structure in the molecules thereof described in JP1988-277653A (JP-S63-277653A), JP1988-260909A (JP-S63-260909A), or JP1989-105238A (JP-H01-105238A) can be used. Examples of a commercially available product thereof include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

Furthermore, as the polymerizable monomer, the compounds described in JP2017-048367A, JP6057891B, or JP6031807B can also be used.

In addition, it is also preferable that 8UH-1006 and 8UH-1012 (both manufactured by Taisei Fine Chemical Co., Ltd.), light acrylate POB-A0 (manufactured by Kyoeisha Chemical Co., Ltd.), OGSOL EA-0300 (Osaka Gas Chemicals Co., Ltd.), or the like is used as the polymerizable monomer.

In a case where the composition for a near-infrared cut filter contains a polymerizable monomer, the content of the polymerizable monomer in the total solid content of the composition for a near-infrared cut filter is preferably 0.1 to 60% by mass. The lower limit is preferably 0.5% by mass or more, and more preferably 1% by mass or more. The upper limit is preferably 30% by mass or less, and more preferably 20% by mass or less. In the present invention, the polymerizable monomer may be used singly or in combination of two or more kinds thereof. In a case where two or more kinds of the polymerizable monomers are used, a total amount thereof is preferably within the range.

(Photopolymerization Initiator)

The composition for a near-infrared cut filter can contain a photopolymerization initiator. The photopolymerization initiator is not particularly limited, and can be appropriately selected from known photopolymerization initiators. The photopolymerization initiator is preferably a radical polymerization initiator. The photopolymerization initiator is preferably a compound having photosensitivity to light rays in the ultraviolet region to the visible region.

Examples of the photopolymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an a-hydroxyketone compound, and an α-aminoketone compound. From the viewpoint of the exposure sensitivity, as the photopolymerization initiator, a trihalomethyl triazine compound, a benzyl dimethyl ketal compound, an a-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound are preferable, a compound selected from an oxime compound, the a-hydroxyketone compound, the α-aminoketone compound, and the acylphosphine compound is more preferable, and the oxime compound is still more preferable. With regard to the photopolymerization initiator, reference can be made to the description in paragraphs 0065 to 0111 of JP2014-130173A, the contents of which are incorporated herein by reference.

Examples of a commercially available product of the a-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819 and DAROCUR-TPO (both of which are manufactured by BASF).

As the oxime compound, the compounds described in JP2001-233842A, the compounds described in JP2000-080068A, the compounds described in JP2006-342166A, the compounds described in JP2016-021012A, or the like can be used. In the present invention, examples of the oxime compound which can be suitably used in the present invention include 3-benzoyoxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Further, other examples of the oxime compound include the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A. As a commercially available product of the oxime compound, IRGACURE-OXE01, IRGACURE-OXE02, IRGACURE-OXE03, and IRGACURE-OXE04 (all of which are manufactured by BASF) are also suitably used. In addition, TRONLY TR-PBG-304 (manufactured by Changzhou Tronly New Electronic Materials Co., Ltd.), or ADEKA OPTOMER N-1919 (manufactured by ADEKA Corporation, the photopolymerization initiator 2 described in JP2012-014052A) can also be used. In addition, it is also preferable that a compound having no colorability or a compound having high transparency and hardly changing the colors is used as the oxime compound. Examples of a commercially available product of the compound include ADEKA ARKLS NCI-730, NCI-831, and NCI-930 (all manufactured by ADEKA Corporation).

In the present invention, an oxime compound having a fluorene ring can also be used as the photopolymerization initiator. Specific examples of the oxime compound having a fluorene ring include the compounds described in JP2014-137466A, the contents of which are incorporated herein by reference. The contents of the publication are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, each content of which is incorporated herein by reference. The contents of the publication are incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

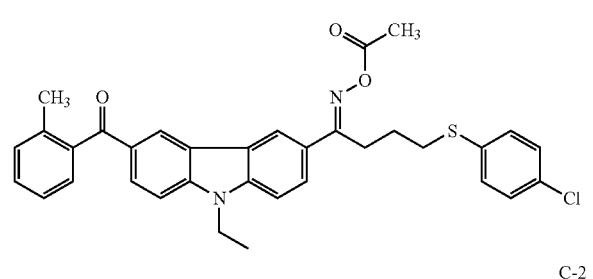

C-1

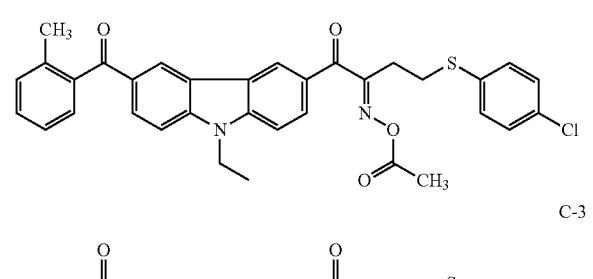

C-2

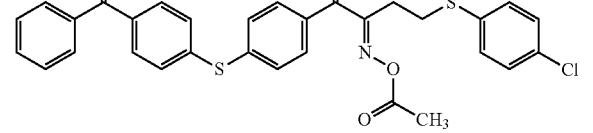

C-3

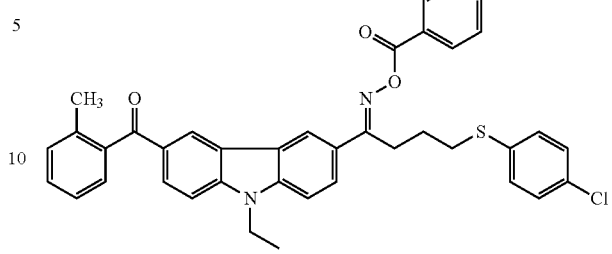

C-4

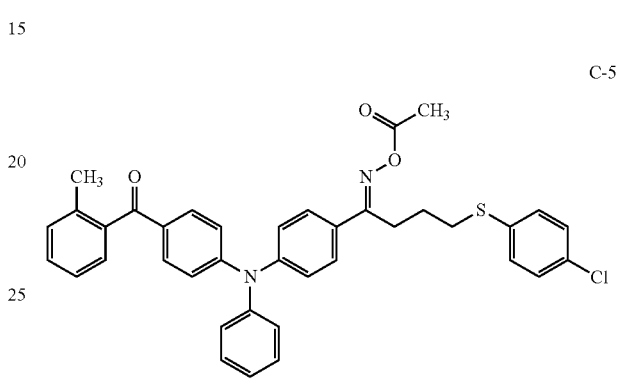

C-5

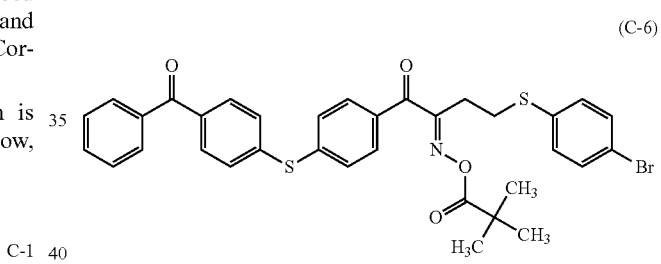

(C-6)

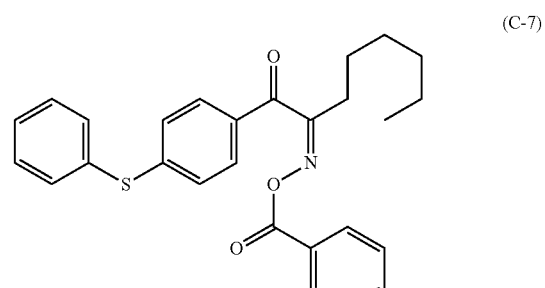

(C-7)

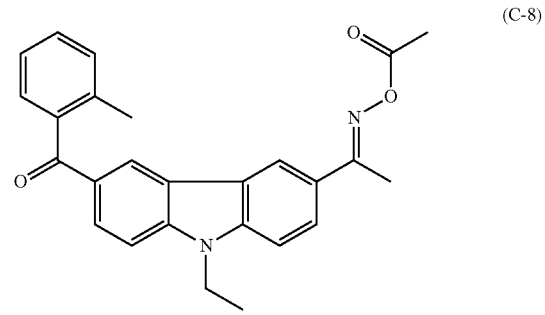

(C-8)

(C-9)
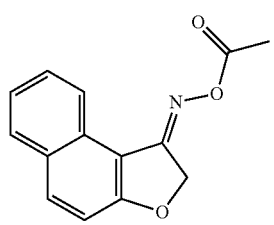

(C-10)
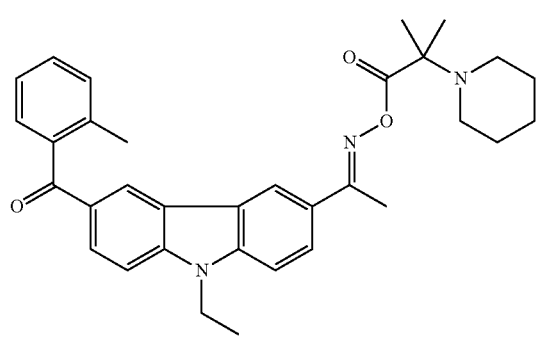

(C-11)

(C-12)

(C-13)
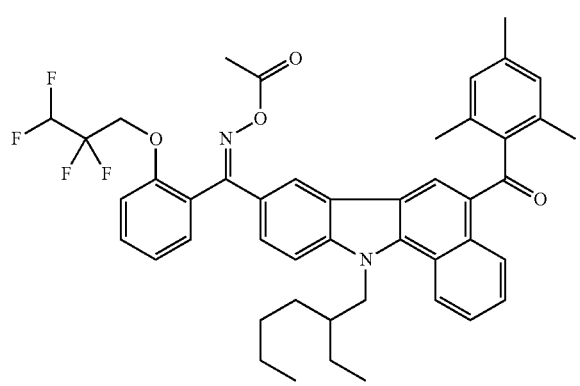

(C-14)
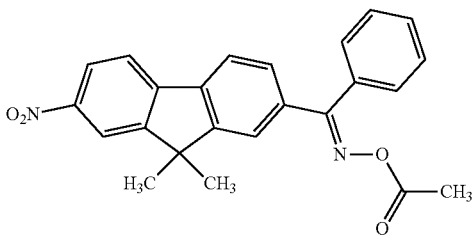

(C-15)
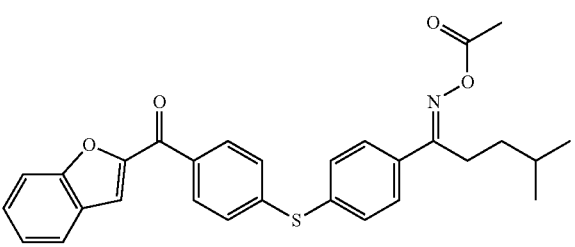

(C-16)
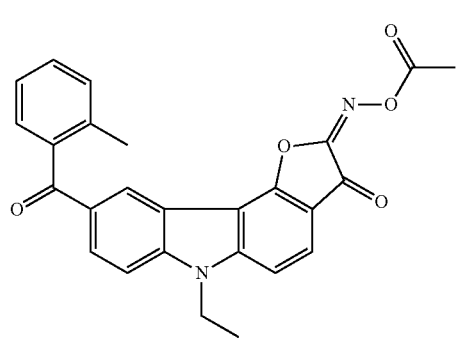

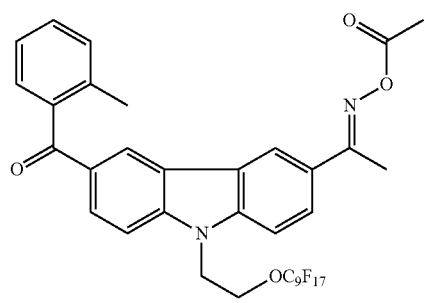

As the oxime compound, a compound having the maximum absorption wavelength in a wavelength range of 350 to 500 nm is preferable, and a compound having the maximum absorption wavelength in a wavelength range of 360 to 480 nm is more preferable.

Furthermore, from the viewpoint of sensitivity, the molar light absorption coefficient at a wavelength of 365 nm or a wavelength of 405 nm of the oxime compound is preferably high, more preferably 1,000 to 300,000, still more preferably 2,000 to 300,000, and particularly preferably 5,000 to 200,000. The molar light absorption coefficient of the compound can be measured using a known method, but specifically, it is preferably measured, for example, by means of a spectrophotometer (Cary-5 spectrophotometer manufactured by Varian) at a concentration of 0.01 g/L using an ethyl acetate solvent.

In the present invention, a bifunctional or trifunctional or higher functional photopolymerization initiator may be used as the photopolymerization initiator. Since two or more active species such as radicals are generated from one molecule of the photopolymerization initiator by using such a photopolymerization initiator, good sensitivity can be obtained. Further, in a case where a compound having an asymmetric structure is used, the crystallinity is reduced, the solubility in a solvent or the like is improved, and the compound is hardly precipitated over time, and the temporal stability of the composition can be improved. Specific examples of such a photopolymerization initiator include dimers of the oxime compounds described in JP2010-527339A, JP2011-524436A, WO2015/004565A, paragraph Nos. 0417 to 0412 of JP2016-532675A, and paragraph Nos. 0039 to 0055 of WO2017/033680A, the compound (E) and the compound (G) described in JP2013-522445A, Cmpd 1 to 7 described in WO2016/034963A, the photoinitiators of oxime esters described in paragraph No. 0007 of JP2017-523465A, the photoinitiators described in paragraph Nos. 0020 to 0033 of JP2017-167399A, and the photopolymerization initiators (A) described in paragraph Nos. 0017 to 0026 of JP2017-151342A.

It is also preferable that the photopolymerization initiator includes an oxime compound and an α-aminoketone compound.

By using both the compounds in combination, the developability is improved and a pattern having excellent rectangularity is likely to be formed. In a case where the oxime compound and the α-aminoketone compound are used in combination, the content of the a-aminoketone compound is preferably 50 to 600 parts by mass, and more preferably 150 to 400 parts by mass, with respect to 100 parts by mass of the oxime compound.

In a case where the composition for a near-infrared cut filter contains a photopolymerization initiator, a content of the photopolymerization initiator in the total solid content of the composition for a near-infrared cut filter is preferably 0.1% to 20% by mass, more preferably 0.5% to 15% by mass, and still more preferably 1% to 20% by mass. The composition for a near-infrared cut filter may include only one kind or two or more kinds of the photopolymerization initiators. In a case where two or more kinds of the photopolymerization initiators are included, the total amount thereof is preferably within the range.

(Epoxy Compound)

The composition for a near-infrared cut filter can contain a compound having an epoxy group (hereinafter also referred to as an epoxy compound). The epoxy compound is preferably a compound having 1 to 100 epoxy groups per molecule. The upper limit of the number of the epoxy groups can be, for example, preferably 10 or less, or 5 or less. The lower limit is preferably 2 or more.

The epoxy compound may be a low molecular compound (for example, having a molecular weight of less than 1,000), or may be a high molecular compound (macromolecule) (for example, a compound having a molecular weight of 1,000 or more, and in a case of a polymer, a compound having a weight-average molecular weight of 1,000 or more). The weight-average molecular weight of the epoxy compound is preferably 2,000 to 100,000. The upper limit of the weight-average molecular weight is preferably 10,000 or less, more preferably 5,000 or less, and still more preferably 3,000 or less.

Examples of a commercially available product of the epoxy compound include OGSOL PG-100 (manufactured by Osaka Gas Chemicals Co., Ltd.), EHPE3150 (manufactured by Daicel Chemical Industries, Ltd.), EPICLON N-695 (manufactured by DIC Corporation), ED-505 (manufactured by ADEKA Corporation, epoxy group-containing monomer), and MARPROOF G-0150M, G-0105SA, G-0130SP, G-0250SP, G-1005S, G-1005SA, G-1010S, G-2050M, G-01100, and G-01758 (all of which are manufactured by NOF Corporation, epoxy group containing polymer). Further, as the epoxy compound, the compounds described in paragraph Nos. 0034 to 0036 of JP2013-011869A, paragraph Nos. 0147 to 0156 of JP2014-043556A, or paragraph Nos. 0085 to 0092 of JP2014-089408A can also be used. The contents of the publications are incorporated herein by reference.

In a case where the composition for a near-infrared cut filter contains an epoxy compound, the content of the epoxy compound in the total solid content of the composition for a near-infrared cut filter is preferably 0.1% by mass or more, and more preferably 0.5% by mass or more. The upper limit is preferably 50% by mass or less, more preferably 30% by mass or less, and still more preferably 20% by mass or less. The composition for a near-infrared cut filter may include only one kind or two or more kinds of the epoxy compounds. In a case where two or more kinds of the epoxy compounds are included, the total amount thereof is preferably within the range.

(Pigment Derivative)

In a case where the composition for a near-infrared cut filter includes a pigment, the composition for a near-infrared cut filter can further contain a pigment derivative. Examples of the pigment derivative include a compound in which at least one group selected from an acid group, a basic group, and a hydrogen-bonding group is bonded to a colorant skeleton. Examples of the acid group include a sulfo group, a carboxyl group, a phosphoric acid group, a boronic acid group, a sulfonimido group, a sulfonamido group, and salts thereof, and desalted structures of these salts.

Examples of atoms or atomic groups constituting the salts include alkali metal ions ($Li^+$, $Na^+$, $K^+$, and the like), alkaline earth metal ions ($Ca^{2+}$, $Mg^{2+}$, and the like), ammonium ions, imidazolium ions, pyridinium ions, and phosphonium ions. In addition, examples of the desalted structures of the salts include a group in which the salt-forming atom or atomic group is eliminated. For example, the desalted structure of a salt of a carboxyl group is a carboxylate group (—COO$^-$). Examples of the basic group include an amino group, a pyridinyl group, and salts thereof, and desalted structures of these salts. Examples of the atom or atomic group constituting the salt include a hydroxide ion, a halogen ion, a carboxylate ion, a sulfonate ion, and a phenoxide ion. In addition, examples of the desalted structures of the salts include a group in which the salt-forming atom or atomic group is eliminated. A hydrogen-bonding group is a group that interacts via a hydrogen atom. Specific examples of the hydrogen-bonding group include an amido group, a hydroxyl group, —NHCONHR, —NHCOOR, and —OCONHR. R is preferably an alkyl group or an aryl group.

As the pigment derivative, a compound represented by Formula (B1) is preferable.

In Formula (B1), P represents a colorant skeleton, L represents a single bond or a linking group, X represents an acid group, a basic group, or a hydrogen-bonding group, m represents an integer of 1 or more, n represents an integer of 1 or more; and in a case where m represents 2 or more, a plurality of L's and a plurality of X's may be the same as or different from each other, and in a case where n represents 2 or more, a plurality of X's may be the same as or different from each other.

As the colorant skeleton represented by P, at least one selected from a squarylium colorant structure, a pyrrolopyrrole colorant skeleton, a diketopyrrolopyrrole colorant skeleton, a quinacridone colorant skeleton, an anthraquinone colorant skeleton, a dianthraquinone colorant skeleton, a benzoisoindole colorant skeleton, a thiazine indigo colorant skeleton, an azo colorant skeleton, a quinophthalone colorant skeleton, a phthalocyanine colorant skeleton, a naphthalocyanine colorant skeleton, a dioxazine colorant skeleton, a perylene colorant skeleton, a perinone colorant skeleton, a benzimidazol one colorant skeleton, a benzothiazole colorant skeleton, a benzimidazole colorant skeleton, or a benzoxazole colorant skeleton is preferable, and at least one selected from the squarylium colorant structure, the pyrrolopyrrole colorant skeleton, the diketopyrrolopyrrole colorant skeleton, the quinacridone colorant skeleton, or the benzimidazolone colorant skeleton is more preferable, and the squarylium colorant structure is particularly preferable.

As the linking group represented by L, a group formed of 1 to 100 carbon atoms, 0 to 10 nitrogen atoms, 0 to 50 oxygen atoms, 1 to 200 hydrogen atoms, and 0 to 20 sulfur atoms is preferable, and the linking group may be unsubstituted or may further have a substituent. Examples of the substituent include the substituent T described for Formula (PP) as described above.

Examples of the acid group, the basic group, and the hydrogen-bonding group represented by X include the groups described above.

In a case where a pigment-type compound is used as the near-infrared absorbing colorant, the pigment derivative is also preferably any of a compound having a maximum absorption wavelength in the wavelength range of 700 to 1,200 nm, a compound having a maximum absorption wavelength in the wavelength range of 700 to 1,100 nm, or a compound having a maximum absorption wavelength in the wavelength range of 700 to 1,000 nm. The pigment derivative having a maximum absorption wavelength in the wavelength range can easily make the π-plane extend to be closer to that of the near-infrared absorbing colorant, improve the adsorption of the near-infrared absorbing colorant, and thus, easily obtain more excellent dispersion stability. Further, the pigment derivative is preferably a compound including an aromatic ring, and more preferably a compound including a structure in which two or more aromatic rings are fused. Incidentally, the pigment derivative is preferably a compound having a π-conjugated plane, and more preferably a compound having a π-conjugated plane having the same structure as the π-conjugated plane included in the near-infrared absorbing colorant. In addition, the number of the π electrons included in the π-conjugated plane of the pigment derivative is preferably 8 to 100. The upper limit is, for example, preferably 90 or less, and more preferably 80 or less. The lower limit is preferably 10 or more, and more preferably 12 or more. Moreover, the pigment derivative is also preferably a compound which has a π-conjugated plane including a partial structure represented by Formula (SQ-a) or has a π-conjugated plane including a partial structure represented by Formula (CR-a).

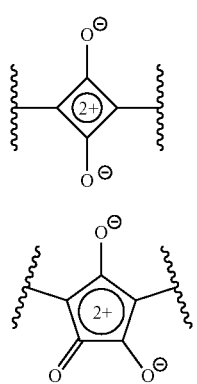

(SQ-a)

(CR-a)

In the formula, the wavy line represents a bond.

The pigment derivative is also preferably at least one selected from the compound represented by Formula (Syn1) or the compound represented by Formula (Syn2).

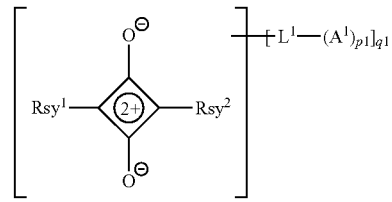

(Syn1)

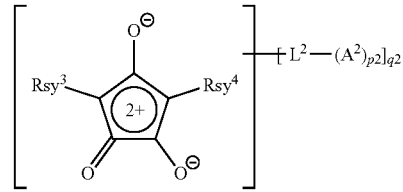

(Syn2)

In Formula (Syn1), $Rsy^1$ and $Rsy^2$ each independently represent an organic group, $L^1$ represents a single bond or a p1+1-valent group, $A^1$ represents a sulfo group, a carboxyl group, a phosphoric acid group, a boronic acid group, a sulfonimido group, a sulfonamido group, an amino group, a pyridinyl group, a salt thereof, or a group selected from desalted structures thereof, and p1 and q1 each independently represent an integer of 1 or more. In a case where p1 is 2 or more, a plurality of $A^1$'s may be the same as or different from each other. In a case where q1 is 2 or more, a plurality of $L^1$'s and $A^1$'s may be the same as or different from each other.

In Formula (Syn2), $Rsy^3$ and $Rsy^4$ each independently represent an organic group, $L^2$ represents a single bond or a p2+1-valent group, $A^2$ represents a sulfo group, a carboxyl group, a phosphoric acid group, a boronic acid group, a sulfonimido group, a sulfonamido group, an amino group, a pyridinyl group, a salt thereof, or a group selected from desalted structures thereof, and p2 and q2 each independently represent an integer of 1 or more. In a case where p2 is 2 or more, a plurality of $A^2$'s may be the same as or different from each other. In a case where q2 is 2 or more, a plurality of $L^2$'s and $A^2$'s may be the same as or different from each other.

Examples of the organic group represented by each of $Rsy^1$ and $Rsy^2$ of Formula (Syn1) and the organic group represented by each of $Rsy^3$ and $Rsy^4$ of Formula (Syn2) include aryl groups, heteroaryl groups, and groups represented by Formulae (R1) to (R7).

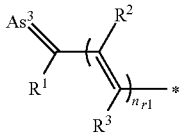

(R1)

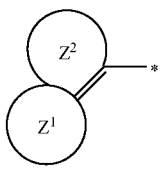

(R2)

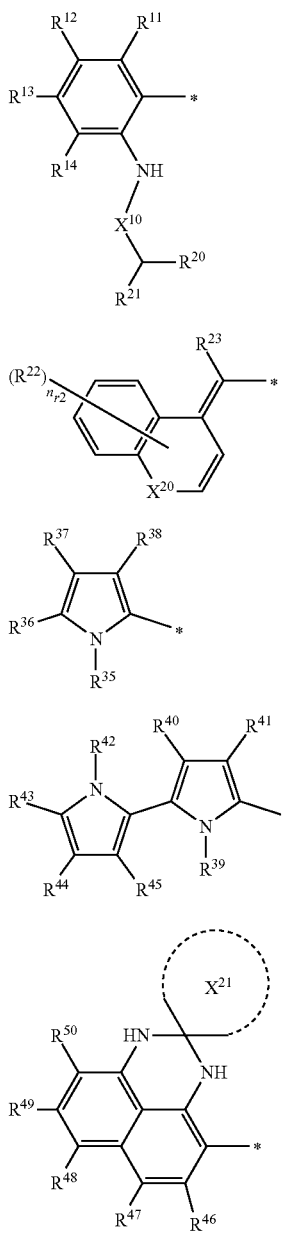

(R3)
(R4)
(R5)
(R6)
(R7)

In Formula (R1), $R^1$ to $R^3$ each independently represent a hydrogen atom or a substituent, $As^3$ represents a heteroaryl group, $n_{r1}$ represents an integer of 0 or more, $R^1$ and $R^2$ may be bonded to each other to form a ring, $R^1$ and $As^3$ may be bonded to each other to form a ring, $R^2$ and $R^3$ may be bonded to each other to form a ring, in a case where $n_{r1}$ is 2 or more, a plurality of $R^2$'s and $R^3$'s may be the same as or different from each other, and * represents a bond.

In Formula (R2), Ring $Z^1$ represents a fused ring including an aromatic heterocyclic ring or an aromatic heterocyclic ring, which may have a plurality of more substituents, Ring $Z^2$ represents a 4- to 9-membered hydrocarbon ring or heterocyclic ring, which may have one or a plurality of substituents, in a case where Ring $Z^1$ and Ring $Z^2$ have a plurality of substituents, the plurality of substituents may be the same as or different from each other, and * represents a bond.

In Formula (R3), $R^{11}$ to $R^{14}$ each independently represent a hydrogen atom or a substituent, two adjacent groups of $R^{11}$ to $R^{14}$ may be bonded to each other to form a ring, $R^{20}$ represents an aryl group or a heteroaryl group, $R^{21}$ represents a substituent, and $X^{10}$ represents CO or $SO_2$.

In Formula (R4), $R^{22}$ and $R^{23}$ each independently represent a hydrogen atom or a substituent, $R^{22}$ and $R^{23}$ may be bonded to each other to form a ring, $X^{20}$ represents an oxygen atom, a sulfur atom, $NR^{24}$, a selenium atom, or a tellurium atom, $R^{24}$ represents a hydrogen atom or a substituent, in a case where $X^{20}$ is $NR^{24}$, $R^{24}$ and $R^{22}$ may be bonded to each other to form a ring, $n_{r2}$ is an integer of 0 to 5, in a case where $n_{r2}$ is 2 or more, a plurality of $R^{22}$'s may be the same as or different from each other, two $R^{22}$'s of a plurality of $R^{22}$'s may be bonded to each other to form a ring, and * represents a bond.

In Formula (R5), $R^{35}$ to $R^{38}$ each independently represent a hydrogen atom or a substituent, $R^{35}$ and $R^{36}$, $R^{36}$ and $R^{37}$, or $R^{37}$ and $R^{38}$ may be bonded to each other to form a ring, and * represents a bond.

In Formula (R6), $R^{39}$ to $R^{45}$ independently represent a hydrogen atom or a substituent, and $R^{39}$ and $R^{45}$, $R^{40}$ and $R^{41}$, $R^{40}$ and $R^{42}$, $R^{42}$ and $R^{43}$, $R^{43}$ and $R^{44}$, or $R^{44}$ and $R^{45}$ are bonded to each other to form a ring, and * represents a bond.

In Formula (R7), $X^{21}$ represents a ring structure, $R^{46}$ to $R^{50}$ each independently represent a hydrogen atom or a substituent, $R^{47}$ and $R^{48}$ may be bonded to each other to form a ring, and * represents a bond.

Examples of the p1+1-valent group represented by $L^1$ of Formula (Syn1) and the p2+1-valent group represented by $L^2$ of Formula (Syn2) include a hydrocarbon group, a heterocyclic group, —O—, —S—, —CO—, —COO—, —OCO—, —SO$_2$—, —NRL-, —NRLCO—, —CONRL-, —NRLSO$_2$-, —SO$_2$NRL-, and a group consisting of a combination thereof. $R^L$ represents a hydrogen atom, an alkyl group, or an aryl group. The hydrocarbon group may be an aliphatic hydrocarbon group or an aromatic hydrocarbon group. Examples of the hydrocarbon group include an alkylene group, an arylene group, and a group obtained by removing one or more hydrogen atoms from these groups. The alkylene group preferably has 1 to 30 carbon atoms, more preferably has 1 to 15 carbon atoms, and still more preferably has 1 to 10 carbon atoms.

The alkylene group may be linear, branched, or cyclic. Further, the cyclic alkylene group may be either monocyclic or polycyclic. The arylene group preferably has 6 to 18 carbon atoms, more preferably has 6 to 14 carbon atoms, and still more preferably has 6 to 10 carbon atoms. The heterocyclic group is preferably a monocyclic ring or a fused ring having a fusion number of 2 to 4. The number of heteroatoms constituting the ring of the heterocyclic group is preferably 1 to 3. The heteroatom forming the ring of the heterocyclic group is preferably a nitrogen atom, an oxygen atom, or a sulfur atom. The number of carbon atoms constituting the ring of the heterocyclic group is preferably 3 to 30, more preferably 3 to 18, and still more preferably 3 to 12. The hydrocarbon group and the heterocyclic group may have a substituent.

Examples of the substituent include the above-mentioned substituent T. Furthermore, the alkyl group represented by $R^L$ preferably has 1 to 20 carbon atoms, more preferably has 1 to 15 carbon atoms, and still more preferably has 1 to 8 carbon atoms. The alkyl group may be in any of linear, branched, and cyclic forms, but is preferably linear or branched, and more preferably linear. The alkyl group represented by $R^L$ may have a substituent. Examples of the substituent include the above-mentioned substituent T. The aryl group represented by $R^L$ preferably has 6 to 30 carbon atoms, more preferably has 6 to 20 carbon atoms, and still more preferably has 6 to 12 carbon atoms. The aryl group represented by $R^L$ may further have a substituent. Examples of the substituent include the above-mentioned substituent T.

Specific examples of the pigment derivatives include compounds having the following structures, and the compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H030-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, and paragraph Nos. 0063 to 0094 of WO2012/102399A.

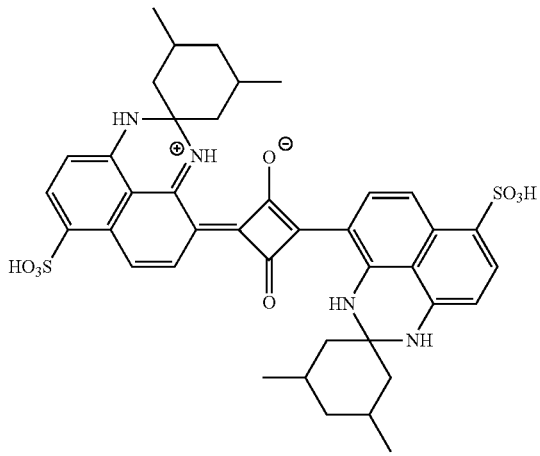

B-1

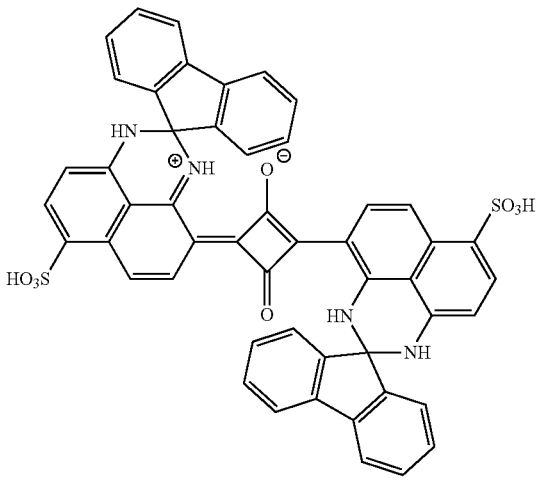

B-2

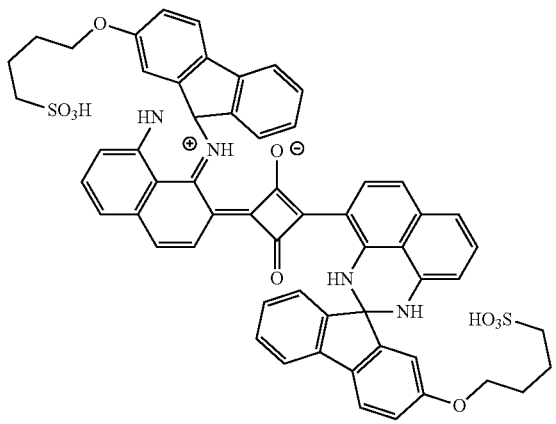

B-3

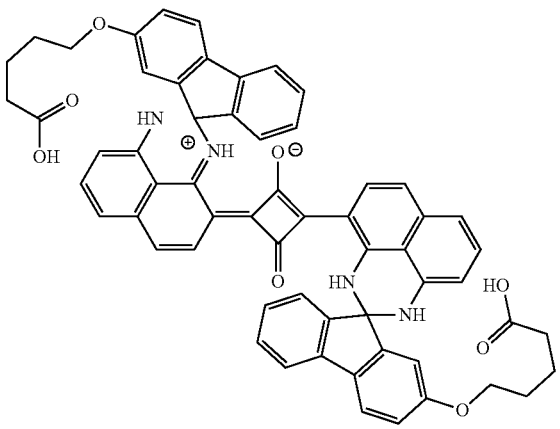

B-4

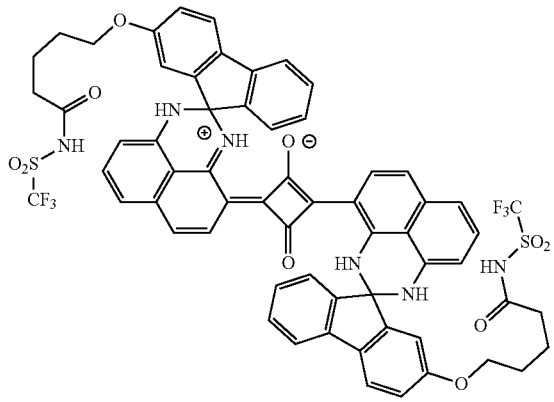

B-5

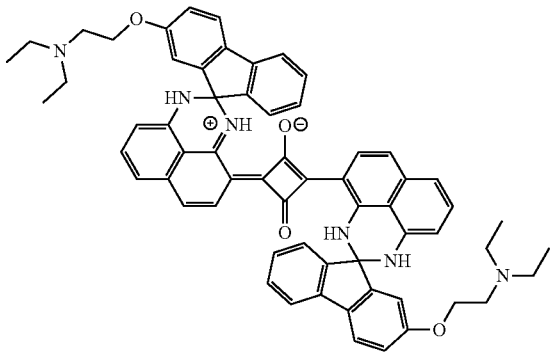

B-6

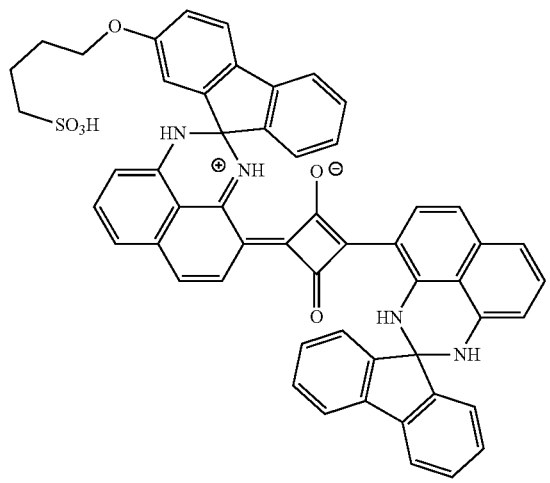
B-7
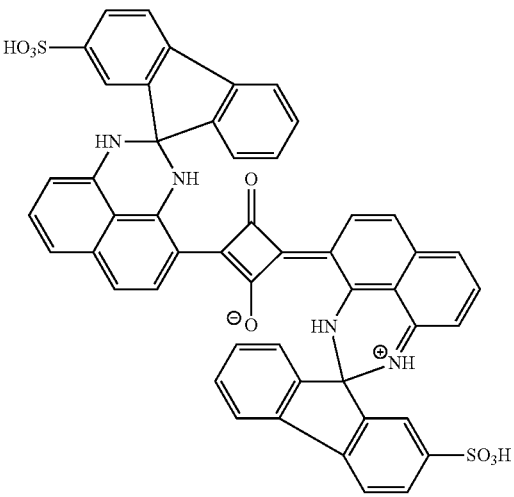
B-8
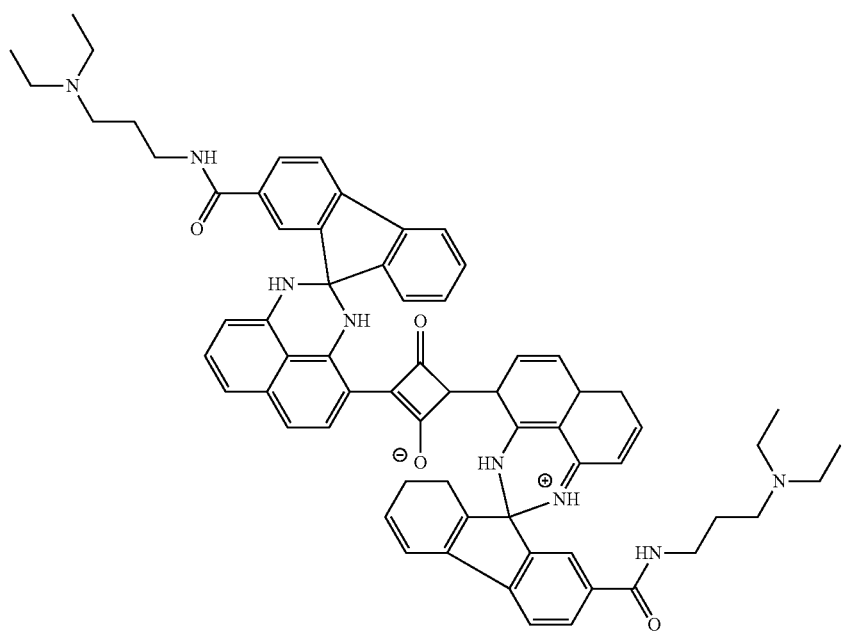
B-9

-continued
B-10
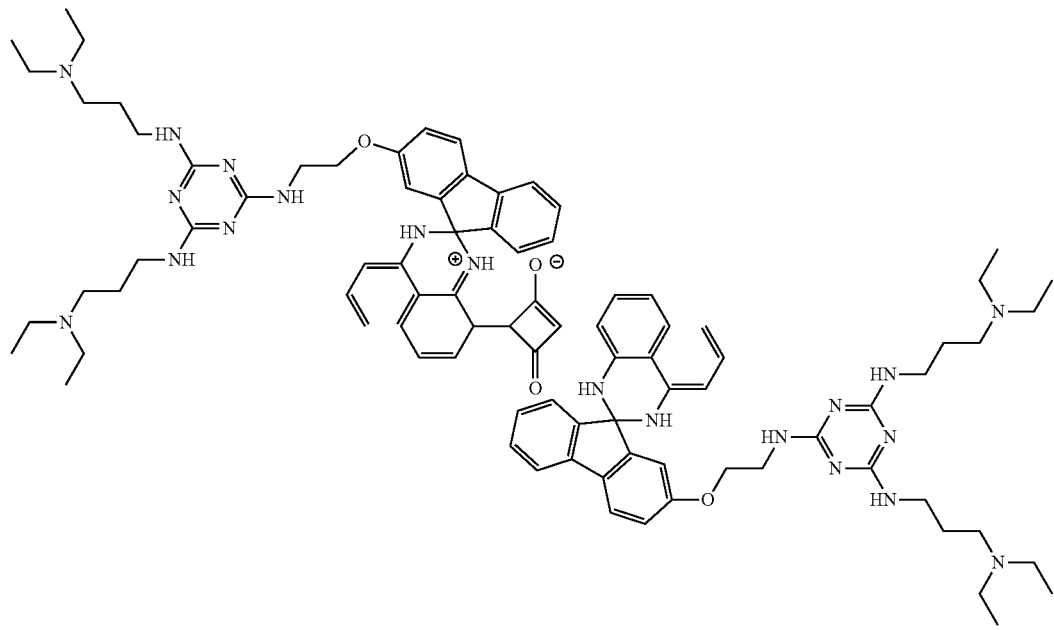
B-11
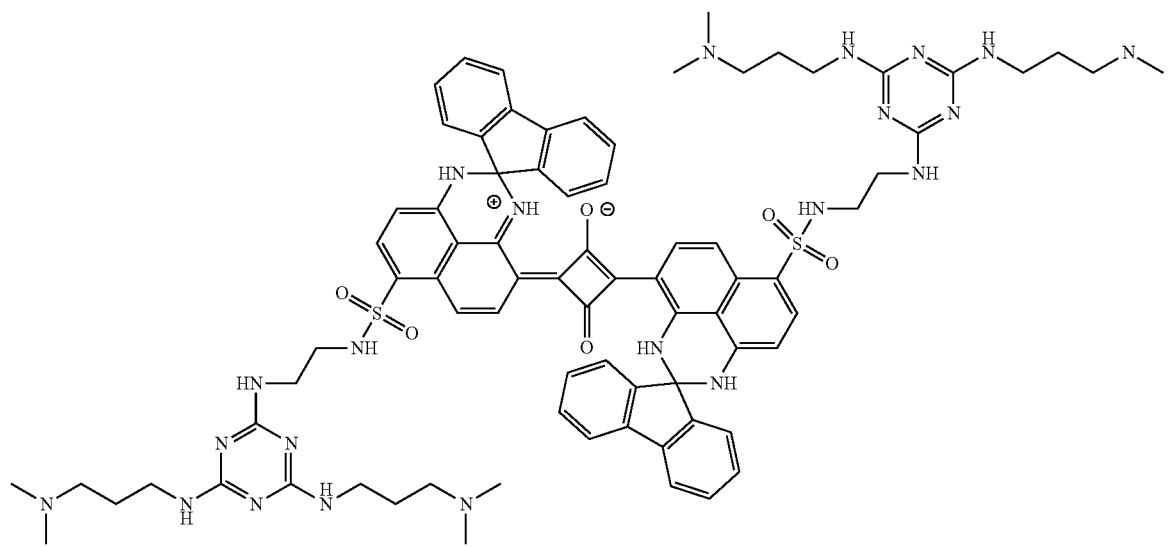

-continued
B-12
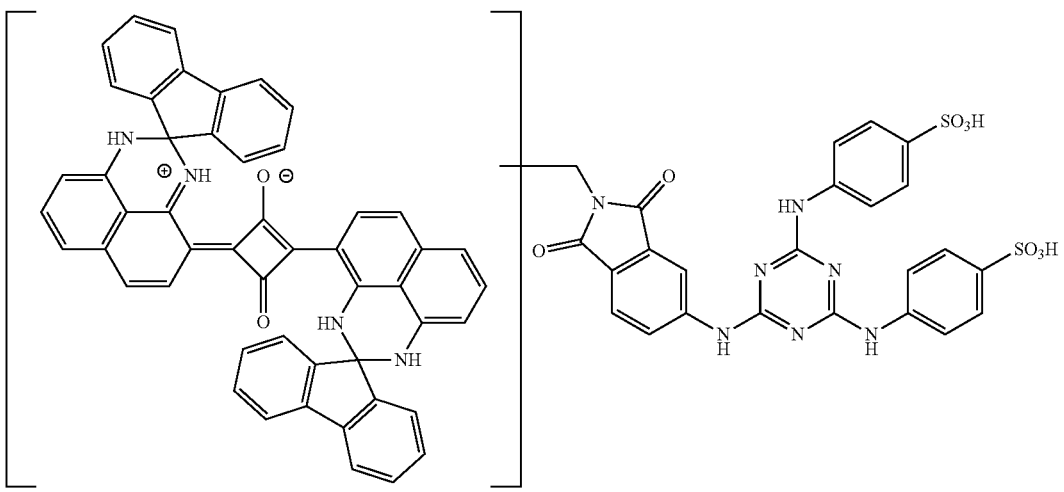
B-13
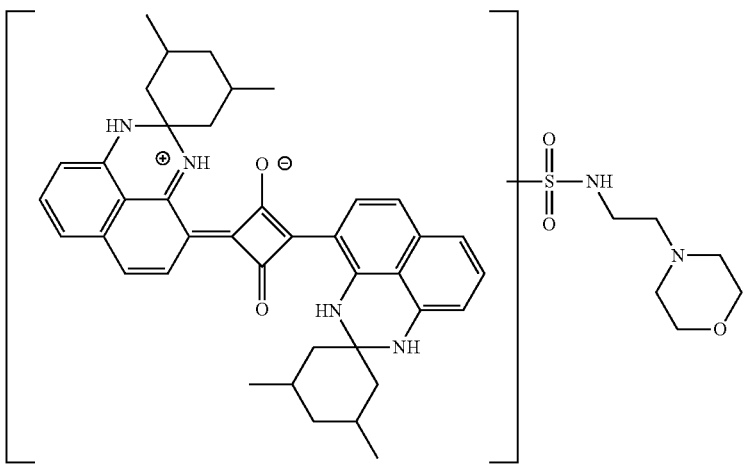
B-14
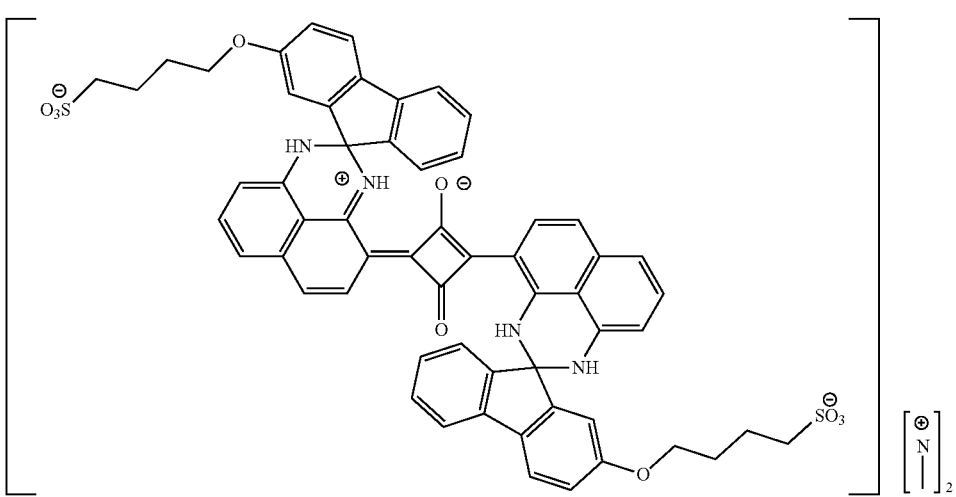

B-15

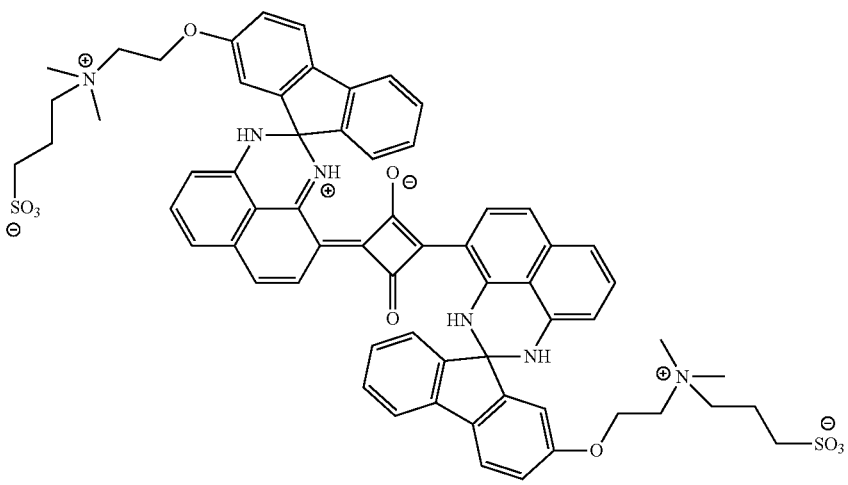

In a case where the composition for a near-infrared cut filter contains a pigment derivative, a content of the pigment derivative is preferably 1 to 50 parts by mass with respect to 100 parts by mass of the pigment. The lower limit value is preferably 3 parts by mass or more, and more preferably 5 parts by mass or more. The upper limit value is preferably 40 parts by mass or less, and more preferably 30 parts by mass or less. The pigment derivative may be used singly or in combination of two or more kinds thereof in combination. In a case where two or more kinds of the pigment derivatives are used, the total amount thereof is preferably within the range.

(Polymerization Inhibitor)

The composition for a near-infrared cut filter can contain a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis (4-methyl-6-t-butylphenol), and an N-nitrosophenylhydroxylamine salt (for example, an ammonium salt and a cerium (III) salt). Among these, p-methoxyphenol is preferable. In a case where the composition for a near-infrared cut filter contains a polymerization inhibitor, a content of the polymerization inhibitor is preferably 0.001% to 5% by mass with respect to the composition for a near-infrared cut filter.

(Silane Coupling Agent)

The composition for a near-infrared cut filter can contain a silane coupling agent. In the present invention, the silane coupling agent means a silane compound having a hydrolyzable group and a functional group other than the hydrolyzable group. Further, the hydrolyzable group refers to a substituent which is directly linked to a silicon atom and is capable of forming a siloxane bond due to at least one of a hydrolysis reaction or a fusion reaction. Examples of the hydrolyzable group include a halogen atom, an alkoxy group, and an acyloxy group, with the alkoxy group being preferable. That is, it is preferable that the silane coupling agent is a compound having an alkoxysilyl group. In addition, examples of the functional group other than the hydrolyzable group include a vinyl group, a styrene group, a (meth)acryloyl group, a mercapto group, an epoxy group, an oxetanyl group, an amino group, a ureido group, a sulfide group, an isocyanate group, and a phenyl group, with the (meth)acryloyl group or the epoxy group being preferable.

Examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference. In a case where the composition for a near-infrared cut filter contains a silane coupling agent, a content of the silane coupling agent in the total solid content of the composition for a near-infrared cut filter is preferably 0.01% to 15.0% by mass, and more preferably 0.05% to 10.0% by mass. The silane coupling agents may be of only one kind or of two or more kinds. In a case where two or more kinds of the silane coupling agents are used, the total amount thereof is preferably within the range.

(Ultraviolet Absorber)

The composition for a near-infrared cut filter can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyl triazine compound, an indole compound, a triazine compound, or the like can be used. With reference to details thereof, reference can be made to the descriptions in paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Specific examples of the ultraviolet absorber include compounds having the following structures. Examples of a commercially available product of the ultraviolet absorber include UV-503 (manufactured by Daito Chemical Co., Ltd.). In addition, examples of the benzotriazole compound include MYUA series manufactured by Miyoshi Oil&Fat Co., Ltd. (The Chemical Daily, Feb. 1, 2016).

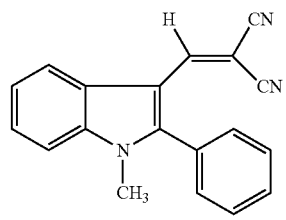

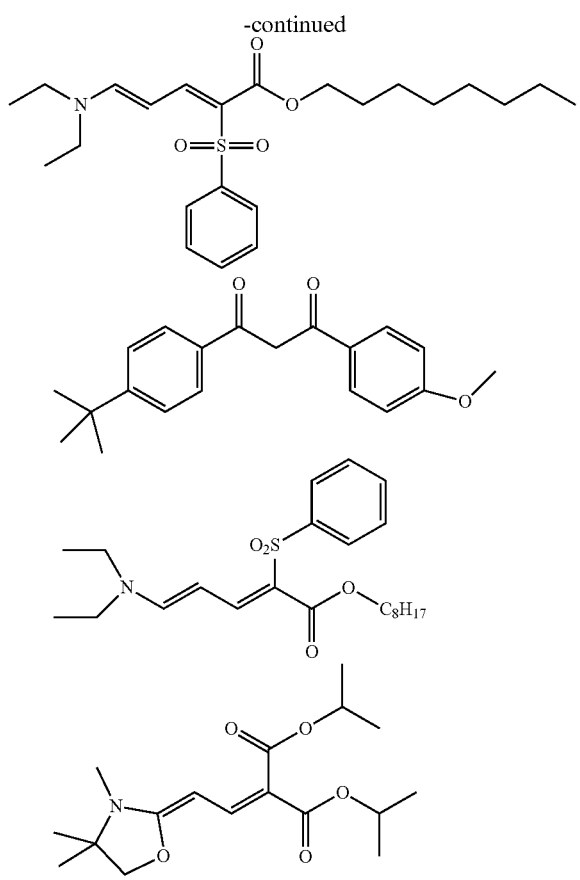

In a case where the composition for a near-infrared cut filter contains an ultraviolet absorber, a content of the ultraviolet absorber in the total solid content of the composition for a near-infrared cut filter is preferably 0.01% to 10% by mass, and more preferably 0.01% to 5% by mass. In the present invention, the ultraviolet absorber may be used singly or in combination of two or more kinds thereof. In a case where two or more kinds of the polymerizable monomers are used, a total amount thereof is preferably within the range.

(Antioxidant)

The composition for a near-infrared cut filter can contain an antioxidant. Examples of the antioxidant include a phenol compound, a phosphite compound, and a thioether compound. As the phenol compound, any of compounds which are known as a phenol antioxidant can be used. Preferred examples of the phenol compound include a hindered phenol compound. A compound having a substituent at a position (ortho-position) adjacent to a phenolic hydroxyl group is preferable. As the above-mentioned substituent, a substituted or unsubstituted alkyl group having 1 to 22 carbon atoms is preferable. Further, as the antioxidant, a compound having a phenol group and a phosphite group in the same molecule is also preferable. In addition, as the antioxidant, a phosphorus-based antioxidant can also be suitably used. Examples of the phosphorous-based antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and bis(2,4-di-tert-butyl-6-methylphenyl) ethyl phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation).

In a case where the composition for a near-infrared cut filter contains an antioxidant, a content of the antioxidant in the total solid content of the composition for a near-infrared cut filter is preferably 0.01% to 20% by mass, and more preferably 0.3% to 15% by mass. The antioxidants may be used singly or in combination of two or more kinds thereof. In a case where two or more kinds of the pigment derivatives are used, the total amount thereof is preferably within the range.

(Other Components)

The composition for a near-infrared cut filter may contain a sensitizer, a curing accelerator, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent), as desired. By appropriately incorporating the components into the composition, properties such as film physical properties can be adjusted. With regard to the details of the components, can be found in, for example, paragraph No. 0183 or later of JP2012-003225A (paragraph No. 0237 of the corresponding US2013/0034812A), paragraph Nos. 0101 to 0104, and 0107 to 0109 of JP2008-250074A, and the like, the contents of which are incorporated herein by reference. Moreover, the composition for a near-infrared cut filter may contain a latent antioxidant, as necessary. The latent antioxidant is a compound in which a moiety functioning as an antioxidant is protected with a protecting group, and examples thereof include a compound which functions as an antioxidant by eliminating a protecting group by heating at 100° C. to 250° C. or heating at 80° C. to 200° C. in the presence of an acid/base catalyst. Examples of the latent antioxidant include the compounds described in WO2014/021023, WO2017/030005, and JP2017-008219A. Examples of a commercially available product thereof include ADEKA ARKLS GPA-5001 (manufactured by ADEKA Corporation).

<Composition for Color Filter>

Next, the composition for a color filter, which is used for producing a color filter of the structure of the embodiment of the present invention will be described.

The composition for a color filter preferably includes a chromatic coloring agent. The chromatic coloring agent may be either a pigment or a dye. With regard to the details of the chromatic coloring agent, the above-mentioned ones may be mentioned. The content of the chromatic coloring agent is preferably 0.1% to 70% by mass in the total solid content of the composition for a color filter. The lower limit is preferably 0.5% by mass or more, and more preferably 1.0% by mass or more. The upper limit is preferably 60% by mass or less, and more preferably 50% by mass or less.

The composition for a color filter can further contain a polymerizable monomer, a photopolymerization initiator, a resin, the above-mentioned compound A, a solvent, a pigment derivative, a polymerization inhibitor, a surfactant, a silane coupling agent, an ultraviolet absorber, an antioxidant, or the like. With regard to details thereof, the above-mentioned materials which are used for the above-mentioned composition for a near-infrared cut filter may be mentioned, and preferred ranges thereof are also the same. Further, preferred contents of these materials are also the same as the content for the composition for a near-infrared cut filter.

<Composition for Near-Infrared Transmitting Filter>

Next, the composition for a near-infrared transmitting filter, which is used for producing a near-infrared transmitting filter of the structure of the embodiment of the present invention, will be described.

Next, the composition for a near-infrared transmitting filter has the minimum value Amin in an absorbance in a wavelength range of 400 to 640 nm, and a ratio of the minimum value Amin to the maximum value Bmax in an absorbance in a wavelength range of 1,100 to 1,300 nm, Amin/Bmax, of preferably 5 or more, more preferably 7.5 or more, still more preferably 15 or more, and particularly preferably 30 or more.

An absorbance $A\lambda$ at a certain wavelength $\lambda$ is defined by Expression (1).

$$A\lambda = -\log(T\lambda/100) \tag{1}$$

$A\lambda$ is an absorbance at the wavelength $\lambda$ and $T\lambda$ represents a transmittance (%) at the wavelength $\lambda$.

In the present invention, a value of the absorbance may be a value measured in the form of a solution or a value of a film which is formed using the composition. In a case where the absorbance is measured in the state of the film, it is preferable that the absorbance is measured using a film prepared by applying the composition onto a glass substrate using a method such as spin coating such that the thickness of the dried film is a predetermined value, and drying the applied composition using a hot plate at 100° C. for 120 seconds. The thickness of the film can be measured using a stylus surface profilometer (DEKTAK 150, manufactured by ULVAC Inc.) onto a substrate including the film.

The composition for a near-infrared transmitting filter preferably includes the above-mentioned color material that shields visible light. The content of the color material that shields visible light is preferably 10% to 70% by mass in the total solid content of the composition for a near-infrared transmitting filter. The lower limit is preferably 30% by mass or more, and more preferably 40% by mass or more.

The composition for a near-infrared transmitting filter can further contain a near-infrared absorber. Examples of the near-infrared absorber include the near-infrared absorbing colorants described in the above-mentioned section of Near-Infrared Cut Filter, and other near-infrared absorbers.

In a case where the composition for a near-infrared transmitting filter contains a near-infrared absorber, a content of the near-infrared absorber is preferably 1% to 30% by mass in the total solid content of the composition for a near-infrared transmitting filter. The upper limit is preferably 20% by mass or less, and more preferably 10% by mass or less. The lower limit is preferably 3% by mass or more, and more preferably 5% by mass or more.

Furthermore, a total content of the near-infrared absorber and the color material that shields visible light is preferably 10% to 70% by mass in the total solid content of the composition for a near-infrared transmitting filter. The lower limit is preferably 20% by mass or more, and more preferably 25% by mass or more. Further, the content of the near-infrared absorber in the total amount of the near-infrared absorber and the color material that shields visible light is preferably 5% to 40% by mass. The upper limit is preferably 30% by mass or less, and more preferably 25% by mass or less. The lower limit is preferably 10% by mass or more, and more preferably 15% by mass or more.

The composition for a near-infrared transmitting filter can further contain a polymerizable monomer, a photopolymerization initiator, a resin, the above-mentioned compound A, a solvent, a pigment derivative, a polymerization inhibitor, a surfactant, a silane coupling agent, an ultraviolet absorber, an antioxidant, or the like. With regard to details thereof, the above-mentioned materials which are used for the above-mentioned composition for a near-infrared cut filter may be mentioned, and preferred ranges thereof are also the same. Further, preferred contents of these materials are also the same as the content for the composition for a near-infrared cut filter.

<Storage Container for Composition>

A storage container for each of the compositions is not particularly limited, and a known storage container can be used. Further, as the storage container, it is also preferable to use a multilayer bottle having an inner wall constituted of 6 kinds of resins in 6 layers or a bottle having a 7-layer structure with 6 kinds of resins for the purpose of suppressing incorporation of impurities into raw materials or compositions. Examples of such a container include the containers described in JP2015-123351A.

<Method for Preparing Composition>

Each of the above-mentioned compositions can be prepared by mixing the above-mentioned components. At a time of preparation of the composition, the composition may be prepared by dissolving or dispersing all the components in a solvent at the same time, or two or more solutions or dispersion liquids in which the respective components have been appropriately blended may be prepared in advance, as necessary, and mixed upon use (application) to prepare a composition.

<Dry Film>

Next, the dry film of an embodiment of the present invention will be described. The dry film of the embodiment of the present invention is obtained by using the above-mentioned composition for a near-infrared cut filter. The dry film of the embodiment of the present invention can be preferably used as a dry film for forming a near-infrared cut filter.

A thickness of the dry film is preferably 0.1 to 20 µm. The upper limit is preferably 10 µm or less, and more preferably 5 µm or less. The lower limit is preferably 0.2 µm or more, and more preferably 0.3 µm or more.

The dry film of the embodiment of the present invention can be produced by applying the above-mentioned composition for a near-infrared cut filter onto a carrier film (support) and drying the film.

As the carrier film, a plastic film is used, and a plastic film such as a polyester film such as polyethylene terephthalate, a polyimide film, a polyamide-imide film, a polypropylene film, and a polystyrene film is preferably used. The thickness of the carrier film is not particularly limited, but it is preferably selected in a range of 0.1 to 150 µm.

As a method for applying the composition for a near-infrared cut filter, a known method can be used. Examples of the method include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as ink jet (for example, an on-demand mode, a piezo mode, and a thermal mode), a discharge system printing such as nozzle jet, flexographic printing, screen printing, gravure printing, reverse offset printing, and metal mask printing; a transfer method using a mold or the like; and a nanoimprint method. The application method using ink jet is not particularly limited and examples thereof include a method described in the patent publication (in particular, pp. 115 to 133) shown in "Extension of Use of Ink Jet-Infinite Possibilities in Patent—, published in February, 2005, S. B. Research Co., Ltd.", or the methods described in JP2003-262716A, JP2003-185831A, JP2003-261827A, JP2012-126830A, JP2006-169325A, and the like.

With regard to drying conditions, it is preferable to perform drying at a temperature of 50° C. to 130° C. for 1 to 30 minutes.

Furthermore, it is preferable that after forming a coating film of the composition for a near-infrared cut filter on a carrier film, a peelable cover film is further laminated on the surface of the coating film for the purpose of preventing dust from adhering to the surface of the coating film, and other purposes. As the peelable cover film, for example, a polyethylene film, a polytetrafluoroethylene film, a polypropylene film, a surface-treated paper, or the like can be used, and the adhesive force between the coating film and the cover film upon peeling the cover film is desirably smaller than the adhesive force between the coating film and the carrier film.

<Method for Producing Structure>

Next, a method for producing the structure of an embodiment of the present invention will be described.

A first aspect of the method for producing a structure of the embodiment of the present invention is a method for producing the above-mentioned structure of the embodiment of the present invention, the method including:

a step of forming first pixels constituted of a laminate including a color filter and a near-infrared cut filter on a light-receiving surface of the light-receiving element, and a step of forming second pixels including a near-infrared transmitting filter on the light-receiving surface of the light-receiving element at a position different from a region where the first pixels are provided, in which the near-infrared cut filter is formed by a step of applying the above-mentioned composition for a near-infrared cut filter on the light-receiving surface of the light-receiving element to form a composition layer, and a step of subjecting the composition layer to a photolithography method or a dry etching method to form a pattern.

Furthermore, a second aspect of the method for producing a structure of the embodiment of the present invention is a method for producing the above-mentioned structure of the embodiment of the present invention described above, the method including:

a step of forming first pixels constituted of a laminate including a color filter and a near-infrared cut filter on a light-receiving surface of the light-receiving element, and a step of forming second pixels including a near-infrared transmitting filter on the light-receiving surface of the light-receiving element at a position different from a region where the first pixels are provided, in which the near-infrared cut filter is formed by a step of applying the above-mentioned dry film onto the light-receiving surface of the light-receiving element to form a dry film layer, and a step of subjecting the dry film layer to a photolithography method or a dry etching method to form a pattern.

In the first and second aspects of the method for producing a structure of the embodiment of the present invention, the color filter and the near-infrared cut filter can be produced using each of the above-mentioned compositions for forming a filter. For example, such a filter can be produced through a step of applying a composition for forming a filter on a light-receiving surface of a light-receiving element to form a composition layer and a step of forming a pattern on the composition layer. Examples of the pattern forming method include a pattern forming method using a photolithography method and a pattern forming method using a dry etching method. Further, the order for forming the respective filters is not particularly limited. For example, in FIG. 1, the near-infrared cut filter 112 may be initially formed or the near-infrared transmitting filter 120 may also be initially formed. In addition, the respective filters may be formed in the order of the near-infrared cut filter 112, the color filter 111, and the near-infrared transmitting filter 120, or may also be formed in the order of the near-infrared cut filter 112, the near-infrared transmitting filter 120, and the color filter 111. Moreover, in FIG. 2, the respective filters may be formed in the order of the color filter 111, the near-infrared cut filter 112, and the near-infrared transmitting filter 120, or may also be formed in the order of the near-infrared transmitting filter 120, the color filter 111, and the near-infrared cut filter 112. Hereinafter, the respective steps will be described.

(First Aspect)

<<Step of Forming Composition Layer>>

In the step of forming the composition layer, the composition layer is formed on the light-receiving surface of the light-receiving element, using the composition for forming each filter. As a method of applying each composition, a known method can be used. Examples of the method include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as ink jet (for example, an on-demand mode, a piezo mode, and a thermal mode), a discharge system such as nozzle jet, flexographic printing, screen printing, gravure printing, reverse offset printing, and metal mask printing; a transfer method using a mold or the like; and a nanoimprint method. The method for application to ink jet is not particularly limited and examples thereof include a method described in the patent publication (in particular, pp. 115 to 133) shown in "Extension of Use of Ink Jet-Infinite Possibilities in Patent—, published in February, 2005, S. B. Research Co., Ltd.", or the methods described in JP2003-262716A, JP2003-185831A, JP2003-261827A, JP2012-126830A, JP2006-169325A, and the like.

The composition layer may be dried (prebaked). The pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 seconds to 3,000 seconds, more preferably 40 to 2,500 seconds, and still more preferably 80 to 220 seconds. Drying can be performed with a hot plate, an oven, or the like.

(Case of Forming Pattern by Photolithography Method)

The pattern forming method by a photolithography method preferably includes a step of patternwise exposing a composition layer (exposing step) and a step of removing the composition layer on the unexposed area by development to form a pattern (developing step). A step of baking the developed pattern (post-baking step) may be provided, as necessary. Hereinafter, the respective steps will be described.

<<Exposing Step>>

The composition layer is patternwise exposed in the exposing step. For example, the composition layer can be patternwise exposed by exposing the composition layer via a mask having a predetermined mask pattern using a stepper exposure machine, a scanner exposure machine, or the like.

Thus, the exposed area can be cured. Radiation (light) that can be used upon exposure includes g-rays and i-rays. Light at a wavelength of 300 nm or less (preferably light at a wavelength of 180 to 300 nm) can also be used. Examples of the light at a wavelength of 300 nm or less include KrF rays (wavelength: 248 nm) and ArF rays (wavelength: 193 nm), with the KrF rays (wavelength: 248 nm) being preferable. The irradiation dose (exposure dose) is, for example, preferably 0.03 to 2.5 J/cm$^2$, more preferably 0.05 to 1.0 J/cm$^2$, and most preferably 0.08 to 0.5 J/cm$^2$. The oxygen concentration upon exposure can be appropriately selected. For example, exposure may be performed in the atmosphere and may also be performed in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be set as appropriate, and is preferably selected from the range of 1,000 to 100,000 W/m$^2$. Appropriate conditions of each of the oxygen concentration and the illuminance of exposure energy may be combined, and for example, a combination of an oxygen concentration of 10% by volume and an illuminance of 10,000 W/m$^2$, a combination of an oxygen concentration of 35% by volume and an illuminance of 20,000 W/m$^2$, or the like is available.

<<Developing Step>>

Next, the composition layer of the unexposed area in the composition layer after exposure is removed by development to form a pattern. The removal of the composition layer of the unexposed area by development can be performed using a developer. Thus, the composition layer of the unexposed area in the exposing step is eluted with the developer, and as a result, only a photocured portion remains in the light-receiving element. The temperature of the developer is preferably, for example, 20° C. to 30° C. The developing time is preferably 20 to 180 seconds. Further, in order to improve residue removing properties, a step of removing the developer by shaking every 60 second and supplying a new developer again may be repeated multiple times.

Examples of the alkali agent used for the developer include ammonia water, organic alkaline compounds such as ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. As the alkali agent, a compound having a high molecular weight is preferable in consideration of the environments and the safety. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass. Further, the developer may contain a surfactant. Examples of the surfactant include the surfactants described for the above-mentioned composition, and the nonionic surfactant is preferable. The developer may be once produced as a concentrated solution and diluted to a necessary concentration at the time of use from the viewpoint of convenience of transportation, storage, and the like. The dilution ratio is not particularly limited, but can be set, for example, in a range of 1.5 to 100 times. Incidentally, in a case where a developer including such an aqueous alkaline solution is used, it is preferable that washing (rinsing) with pure water is performed after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. Post-baking can be performed continuously or batchwise using a heating unit such as a hot plate, a convection oven (hot-air circulating dryer), and a high-frequency heater so that the film after development satisfies the conditions. Further, in a case where the pattern is formed by a low-temperature process, the post-baking may not be performed.

(Case of Forming Pattern by Dry Etching Method)

Pattern formation by a dry etching method can be performed by a method including, for example, curing a composition layer to form a cured material layer, then forming a patterned photoresist layer on the cured material layer, and subsequently subjecting the cured material layer to dry-etching using an etching gas through the patterned photoresist layer as a mask.

A heating treatment is preferable as the method for curing the composition layer. According to this aspect, the entire composition layer can be cured almost homogeneously. The heating temperature is preferably 150° C. to 240° C., more preferably 180° C. to 230° C., and still more preferably 195° C. to 225° C. The heating time is preferably 250 to 600 seconds, more preferably 250 to 500 seconds, and still more preferably 280 to 480 seconds.

For example, a positive tone radiation-sensitive composition is used to form the photoresist layer. As the positive tone radiation-sensitive composition, a radiation-sensitive composition sensitive to radiations such as ultraviolet rays (g-rays, h-rays, i-rays), far ultraviolet rays including an excimer laser and the like, electron beams, ion beams, and X-rays can be used. Among the radiations, the g-rays, the h-rays, or the i-rays are preferable, and the i-rays are particularly preferable. Specifically, as the positive tone radiation-sensitive composition, a composition containing a quinonediazide compound and an alkali-soluble resin is preferable. In a positive tone radiation-sensitive composition containing a quinonediazide compound and an alkali-soluble resin, the quinonediazide group decomposes by irradiation with light at a wavelength of 500 nm or less to form a carboxyl group, and as a result, the alkali-insoluble state turns into an alkali-soluble one. Examples of the quinonediazide compound include a naphthoquinonediazide compound.

The thickness of the photoresist layer is preferably 0.1 to 3 μm, preferably 0.2 to 2.5 μm, and more preferably 0.3 to 2 μm.

The patterning of the photoresist layer can be performed by exposing the photoresist layer through a predetermined mask pattern and developing the exposed photoresist layer with a developer.

The above-mentioned developer is used as the developer.

A cured material layer is dry-etched using the resist pattern thus formed as an etching mask. The dry etching is preferably performed in the following form from the viewpoint of forming a pattern cross-section which is closer to a rectangle and further reducing damage to an underlying material.

Preferred is a form including a first-stage etching in which etching is performed using a mixed gas of a fluorine-based gas and an oxygen gas ($O_2$) up to a region (depth) where a base (a light-receiving element and the like) is not exposed; a second-stage etching in which etching is performed using a mixed gas of a nitrogen gas ($N_2$) and an oxygen gas ($O_2$) after the first-stage etching, preferably up to near a region (depth) where the base is exposed; and overetching which is performed after the base is exposed. Hereinafter, specific methods for the dry etching, the first-stage etching, the second-stage etching, and the overetching will be described.

The dry etching is preferably performed by determining the etching conditions in advance by the following methods.

(1) An etching rate (nm/min) in the first-stage etching and an etching rate (nm/min) in the second-stage etching are each calculated.
(2) A time for etching a desired thickness in the first-stage etching and a time for etching a desired thickness in the second-stage etching are each calculated.
(3) The first-stage etching is performed according to the etching time calculated in (2).
(4) The second-stage etching is performed according to the etching time calculated in (2). Alternatively, the etching time may be determined by end point detection, and the second-stage etching may be performed according to the determined etching time.
(5) The overetching time is calculated with respect to a total time of (3) and (4), and the overetching is performed.

The mixed gas used in the first-stage etching step preferably includes a fluorine-based gas and an oxygen gas ($O_2$) from the viewpoint of processing the cured material layer into a rectangle. Further, in the first-stage etching step, the base can be prevented from being damaged by etching up to a region where the base is not exposed.

In addition, the second-stage etching step and the overetching step are performed after performing etching up to a region where the base is not exposed by a mixed gas of a fluorine-based gas and an oxygen gas in the first-stage etching step, and then from the viewpoint of avoiding damage to the base, an etching treatment is preferably performed using a mixed gas of a nitrogen gas and an oxygen gas.

It is important to determine a ratio of the etching amount in the first-stage etching step to the etching amount in the second-stage etching step so as not to impair the rectangularity due to the etching treatment in the first-stage etching step. Further, the ratio of the latter in a total etching amount (a sum of the etching amount in the first-stage etching step and the etching amount in the second-stage etching step) is preferably in a range of more than 0% and 50% or less, and more preferably 10% to 20%. The etching amount refers to a remaining film thickness of the cured material layer.

Furthermore, the dry etching preferably includes an overetching treatment.

The overetching treatment is preferably performed by setting the overetching ratio.

Further, it is preferable to calculate the overetching ratio from the etching treatment time which is initially performed. Any of the overetching ratios can be set, but from the viewpoint of holding the etching resistance of the photoresist and the rectangularity of the pattern to be etched, the overetching ratio is preferably 30% or less, more preferably 5% to 25%, and still particularly preferably 10% to 15% of the etching treatment time in the etching step.

Subsequently, the resist pattern (that is, the etching mask) remaining after the dry etching is removed. It is preferable that the removal of the resist pattern includes a step of applying a peeling liquid or a solvent onto the resist pattern to create a state where the resist pattern can be removed, and a step of removing the resist pattern with washing water. With regard to the method for removing the resist pattern, reference can be made to the description in paragraph Nos. 0318 to 0324 of JP2013-054080A, the contents of which are incorporated herein by reference.

(Second Aspect)

In the second aspect, the above-mentioned dry film is applied onto the light-receiving surface of the light-receiving element to form a dry film layer. The method for forming the dry film layer is not particularly limited, and a method known in the related art can be applied. For example, a dry film layer can be formed on a light-receiving surface of a light-receiving element by attaching a dry film to the light-receiving surface of the light-receiving element using a laminator or the like, so that the dry film comes into contact with a desired position of the light-receiving element, and then peeling the carrier film.

The dry film layer thus formed is patterned by a photolithography method or a dry etching method, and preferably by the dry etching method to form a near-infrared cut filter. Examples of the pattern forming method by the photolithography and the pattern forming method by the dry etching method include the methods described in the above-mentioned first aspect.

In the second aspect, it is preferable that the near-infrared cut filter is initially formed, and then the color filter and the near-infrared transmitting filter are respectively formed. The order of forming the color filter and the near-infrared transmitting filter is not particularly limited, and the color filter and the near-infrared transmitting filter may be formed in this order, or the near-infrared transmitting filter and the color filter may be formed in this order.

<Optical Sensor>

The optical sensor of an embodiment of the present invention includes the above-mentioned structure of the embodiment of the present invention. Examples of the optical sensor include a solid-state imaging device. The configuration of the optical sensor of the embodiment of the present invention is not particularly limited as long as the optical sensor is configured to have the structure of the embodiment of the present invention and is configured to function as an optical sensor. An optical sensor into which the structure of the embodiment of the present invention is introduced can be preferably used in applications such as biometric authentication applications, security applications, mobile applications, automotive applications, agricultural applications, medical applications, distance measuring applications, and gesture recognition applications.

The optical sensor of the embodiment of the present invention may use a bandpass filter for the purpose of noise reduction. By using the bandpass filter, the incidence intensity of light in an undesired range is reduced, and thus, noise is reduced. The band pass filter is preferably a dual band pass filter or a multi-band pass filter. The bandpass filter is preferably constituted of a dielectric multilayer film or a color material, or a combination thereof, and among these, a combination thereof is preferable from the viewpoint of cost and angle dependence.

<Image Display Device>

The structure of the embodiment of the present invention can also be used in an image display device such as a liquid crystal display device and an organic electroluminescence (organic EL) display device. The definition or details of the image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The image display device may have a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinbelow, the present invention will be described in more detail with reference to Examples. Materials, used amounts, ratios, treatment details, treatment procedures, and the like shown in Examples as described below may be modified as appropriate within a range not departing from the scope of the present invention. Accordingly, the scope of the present invention is not limited to the following specific examples. Further, in the structural formulae, Me represents a methyl group, Et represents an ethyl group, iPr represents an isopropyl group, tBu represents a tert-butyl group, and Ph represents a phenyl group.

[Preparation of Composition for Near-Infrared Cut Filter]

The raw materials shown in the following table were mixed to prepare each of compositions for a near-infrared cut filter. Numerical values described in the Tg column of the resin are each a glass transition temperature (unit: ° C.) of the resin. Further, for those including two or more kinds of resins, the value is a value of the glass transition temperature of the resin having a higher glass transition temperature.

TABLE 1

| Name | Near-infrared absorber Type | Parts by mass | Resin or precursor Type | Tg | Parts by mass | Additive Type | Parts by mass | Surfactant Type | Parts by mass | Solvent Type | Parts by Mass |
|---|---|---|---|---|---|---|---|---|---|---|---|
| Example 1 | Near-infrared absorber 1 | 2 | Resin 1 | 164 | 18 | — | | Surfactant 1 | 0.025 | Solvent 1 | 80.0 |
| Example 2 | Near-infrared absorber 2 | 2 | Resin 1 | 164 | 18 | — | | Surfactant 1 | 0.025 | Solvent 1 | 80.0 |
| Example 3 | Near-infrared absorber 3 | 2 | Resin 1 | 164 | 18 | — | | Surfactant 1 | 0.025 | Solvent 1 | 80.0 |
| Example 4 | Near-infrared absorber 4 | 2 | Resin 1 | 164 | 18 | — | | Surfactant 1 | 0.025 | Solvent 1 | 80.0 |
| Example 5 | Near-infrared absorber 5 | 2 | Resin 1 | 164 | 18 | — | | Surfactant 1 | 0.025 | Solvent 1 | 80.0 |
| Example 6 | Near-infrared absorber 6 | 2 | Resin 1 | 164 | 18 | — | | Surfactant 1 | 0.025 | Solvent 1 | 80.0 |
| Example 7 | Near-infrared absorber 7 | 2 | Resin 1 | 164 | 18 | — | | Surfactant 1 | 0.025 | Solvent 1 | 80.0 |
| Example 8 | Near-infrared absorber 1<br>Near-infrared absorber 2 | 1<br>1 | Resin 1 | 164 | 18 | — | | Surfactant 1 | 0.025 | Solvent 1 | 80.0 |
| Example 9 | Near-infrared absorber 1<br>Near-infrared absorber 5 | 1<br>1 | Resin 1 | 164 | 18 | — | | Surfactant 1 | 0.025 | Solvent 1 | 80.0 |
| Example 10 | Near-infrared absorber 1<br>Near-infrared absorber 8 | 1.5<br>0.5 | Resin 1 | 164 | 18 | — | | Surfactant 1 | 0.025 | Solvent 1 | 80.0 |
| Example 11 | Near-infrared absorber 1<br>Near-infrared absorber 9 | 1.5<br>2.7 | Resin 1 | 164 | 17.7 | — | | Surfactant 1 | 0.025 | Solvent 1 | 78.1 |
| Example 12 | Near-infrared absorber 1<br>Near-infrared absorber 10 | 1.5<br>2.5 | Resin 1 | 164 | 17.75 | — | | Surfactant 1 | 0.025 | Solvent 1 | 78.2 |
| Example 13 | Near-infrared absorber 1<br>Near-infrared absorber 11 | 1.5<br>6.0 | Resin 1 | 164 | 17.54 | — | | Surfactant 1 | 0.025 | Solvent 1 | 74.9 |

TABLE 1-continued

| Name | Near-infrared absorber Type | Parts by mass | Resin or precursor Type | Tg | Parts by mass | Additive Type | Parts by mass | Surfactant Type | Parts by mass | Solvent Type | Parts by Mass |
|---|---|---|---|---|---|---|---|---|---|---|---|
| Example 14 | Near-infrared absorber 1 | 1 | Resin 1 | 164 | 19 | — | | Surfactant 1 | 0.025 | Solvent 1 | 80.0 |
| Example 15 | Near-infrared absorber 1 | 6 | Resin 1 | 164 | 14 | — | | Surfactant 1 | 0.025 | Solvent 1 | 80.0 |
| Example 16 | Near-infrared absorber 1 | 8 | Resin 1 | 164 | 12 | — | | Surfactant 1 | 0.025 | Solvent 1 | 80.0 |
| Example 17 | Near-infrared absorber 1 | 2 | Resin 1 | 164 | 18 | — | | Surfactant 1 | 0.002 | Solvent 1 | 80.0 |
| Example 18 | Near-infrared absorber 1 | 6 | Resin 1 | 164 | 14 | — | | Surfactant 1 | 0.05 | Solvent 1 | 80.0 |
| Example 19 | Near-infrared absorber 1 | 10 | Resin 1 | 164 | 10 | — | | Surfactant 1 | 0.09 | Solvent 1 | 80.0 |
| Example 20 | Near-infrared absorber 1 | 1 | Resin 1 | 164 | 9 | — | | Surfactant 1 | 0.025 | Solvent 1 | 90.0 |
| Example 21 | Near-infrared absorber 1 | 3 | Resin 1 | 164 | 27 | — | | Surfactant 1 | 0.025 | Solvent 1 | 70.0 |
| Example 22 | Near-infrared absorber 1 | 2 | Resin 2 | 128 | 18 | — | | Surfactant 1 | 0.025 | Solvent 1 | 80.0 |
| Example 23 | Near-infrared absorber 1 | 1 | Resin 3 | 146 | 64.3 | — | | Surfactant 1 | 0.025 | Solvent 1 | 34.7 |
| Example 24 | Near-infrared absorber 1 | 1 | Precursor 1 | (100° C. or higher after polyimidzation) | 45 | — | | Surfactant 1 | 0.025 | Solvent 1 | 80.0 |
| Example 25 | Near-infrared absorber 1 | 2 | Resin 1 Resin 2 | 164 | 9 9 | — | | Surfactant 1 | 0.025 | Solvent 1 | 80.0 |
| Example 26 | Near-infrared absorber 1 | 2 | Resin 1 | 164 | 10.8 7.2 | — | | Surfactant 1 | 0.025 | Solvent 1 | 80.0 |
| Example 27 | Near-infrared absorber 1 | 2 | Resin 1 | 164 | 17.8 | Additive 1 | 0.2 | Surfactant 1 | 0.025 | Solvent 1 | 80.0 |
| Example 28 | Near-infrared absorber 1 | 2 | Resin 1 | 164 | 17.2 | Additive 2 | 0.8 | Surfactant 1 | 0.025 | Solvent 1 | 80.0 |
| Example 29 | Near-infrared absorber 1 | 2 | Resin 1 | 164 | 15.5 | Additive 3 | 1.7 | Surfactant 1 | 0.025 | Solvent 1 | 80.0 |
| Example 30 | Near-infrared absorber 1 | 2 | Resin 1 | 164 | 15 | Additive 4 Additive 5 | 1.7 0.5 | Surfactant 1 | 0.025 | Solvent 1 | 80.0 |
| Example 31 | Near-infrared absorber 1 | 2 | Resin 1 | 164 | 17 | Additive 1 Additive 2 | 0.2 0.8 | Surfactant 1 | 0.025 | Solvent 1 | 80.0 |
| Example 32 | Near-infrared absorber 1 | 2 | Resin 1 | 164 | 18 | — | | Suifactant 2 | 0.025 | Solvent 1 | 80.0 |
| Example 33 | Near-infrared absorber 1 | 2 | Resin 1 | 164 | 18 | — | | Surfactant 3 | 0.025 | Solvent 1 | 80.0 |
| Example 34 | Near-infrared absorber 1 | 2 | Resin 1 | 164 | 18 | — | | Surfactant 1 Surfactant 2 | 0.025 | Solvent 1 | 80.0 |
| Example 35 | Near-infrared absorber 1 | 2 | Resin 1 | 164 | 18 | — | | Surfactant 1 Surfactant 3 | 0.025 | Solvent 1 | 80.0 |
| Example 36 | Near-infrared absorber 1 | 2 | Resin 1 | 164 | 18 | — | | Surfactant 1 | 0.025 | Solvent 2 | 80.0 |
| Example 37 | Near-infrared absorber 1 | 2 | Resin 1 | 164 | 18 | — | | Surfactant 1 | 0.025 | Solvent 3 | 80.0 |
| Example 38 | Near-infrared absorber 1 | 2 | Resin 1 | 164 | 18 | — | | Surfactant 1 | 0.025 | Solvent 1 Solvent 2 | 80.0 |

TABLE 2

| Name | Near-infrared absorber Type | Parts by mass | Resin or precursor Type | Tg | Parts by mass | Additive Type | Parts by mass | Surfactant Type | Parts by mass | Solvent Type | Parts by mass |
|---|---|---|---|---|---|---|---|---|---|---|---|
| Example 39 | Near-infrared absorber 12 | 24 | Resin 1 | 164 | 17 | — | | Surfactant 1 | 0.025 | Solvent 1 | 59.4 |
| Example 40 | Near-infrared absorber 13 | 48 | Resin 1 | 164 | 16 | — | | Surfactant 1 | 0.025 | Solvent 1 | 36.7 |
| Example 41 | Near-infrared absorber 14 | 12 | Resin 1 | 164 | 17 | — | | Surfactant 1 | 0.025 | Solvent 1 | 70.7 |

TABLE 2-continued

| Name | Near-infrared absorber Type | Parts by mass | Resin or precursor Type | Tg | Parts by mass | Additive Type | Parts by mass | Surfactant Type | Parts by mass | Solvent Type | Parts by mass |
|---|---|---|---|---|---|---|---|---|---|---|---|
| Example 42 | Near-infrared absorber 15 | 20 | Resin 1 | 164 | 17 | — | | Surfactant 1 | 0.025 | Solvent 1 | 62.6 |
| Example 43 | Near-infrared absorber 16 | 26 | Resin 1 | 164 | 17 | — | | Surfactant 1 | 0.025 | Solvent 1 | 57.3 |
| Example 44 | Near-infrared absorber 17 | 24 | Resin 1 | 164 | 16 | — | | Surfactant 1 | 0.025 | Solvent 1 | 60.0 |
| Example 45 | Near-infrared absorber 18 | 24 | Resin 1 | 164 | 17 | — | | Surfactant 1 | 0.025 | Solvent 1 | 58.8 |
| Example 46 | Near-infrared absorber 19 | 24 | Resin 1 | 164 | 17 | — | | Surfactant 1 | 0.025 | Solvent 1 | 59.4 |
| Example 47 | Near-infrared absorber 20 | 24 | Resin 1 | 164 | 17 | — | | Surfactant 1 | 0.025 | Solvent 1 | 59.4 |
| Example 48 | Near-infrared absorber 21 | 24 | Resin 1 | 164 | 17 | — | | Surfactant 1 | 0.025 | Solvent 1 | 59.4 |
| Example 49 | Near-infrared absorber 22 | 24 | Resin 1 | 164 | 17 | — | | Surfactant 1 | 0.025 | Solvent 1 | 59.4 |
| Example 50 | Near-infrared absorber 23 | 24 | Resin 1 | 164 | 17 | — | | Surfactant 1 | 0.025 | Solvent 1 | 59.4 |
| Example 51 | Near-infrared absorber 24 | 24 | Resin 1 | 164 | 17 | — | | Surfactant 1 | 0.025 | Solvent 1 | 59.4 |
| Example 52 | Near-infrared absorber 25 | 24 | Resin 1 | 164 | 17 | — | | Surfactant 1 | 0.025 | Solvent 1 | 59.4 |
| Example 53 | Near-infrared absorber 26 | 24 | Resin 1 | 164 | 17 | — | | Surfactant 1 | 0.025 | Solvent 1 | 59.4 |
| Example 54 | Near-infrared absorber 27 | 24 | Resin 1 | 164 | 17 | — | | Surfactant 1 | 0.025 | Solvent 1 | 59.4 |
| Example 55 | Near-infrared absorber 28 | 24 | Resin 1 | 164 | 17 | — | | Surfactant 1 | 0.025 | Solvent 1 | 59.4 |
| Example 56 | Near-infrared absorber 29 | 24 | Resin 1 | 164 | 17 | — | | Surfactant 1 | 0.025 | Solvent 1 | 59.4 |
| Example 57 | Near-infrared absorber 30 | 24 | Resin 1 | 164 | 17 | — | | Surfactant 1 | 0.025 | Solvent 1 | 59.4 |
| Example 58 | Near-infrared absorber 31 | 24 | Resin 1 | 164 | 17 | — | | Surfactant 1 | 0.025 | Solvent 1 | 59.4 |
| Example 59 | Near-infrared absorber 32 | 2 | Resin 1 | 164 | 18 | — | | Surfactant 1 | 0.025 | Solvent 1 | 80.0 |
| Example 60 | Near-infrared absorber 33 | 2 | Resin 1 | 164 | 18 | — | | Surfactant 1 | 0.025 | Solvent 1 | 80.0 |
| Example 61 | Near-infrared absorber 34 | 2 | Resin 1 | 164 | 18 | — | | Surfactant 1 | 0.025 | Solvent 1 | 80.0 |
| Comparative Example 1 | Near-infrared absorber 1 | 2 | Resin 1 | 164 | 18 | — | | — | | Solvent 1 | 80.0 |
| Comparative Example 2 | Near-infrared absorber 1 | 2 | Resin R1 | 19 | 18 | — | | Surfactant 1 | 0.025 | Solvent 1 | 80.0 |
| Comparative Example 3 | Near-infrared absorber 8 | 2 | Resin 1 | 164 | 18 | — | | Surfactant 1 | 0.025 | Solvent 1 | 80.0 |

The raw materials described in the table are as follows.

(Near-Infrared Absorber)

Near-infrared absorber 1: Compound having the following structure (squarylium compound)

Near-infrared absorber 2: Compound having the following structure (squarylium compound)

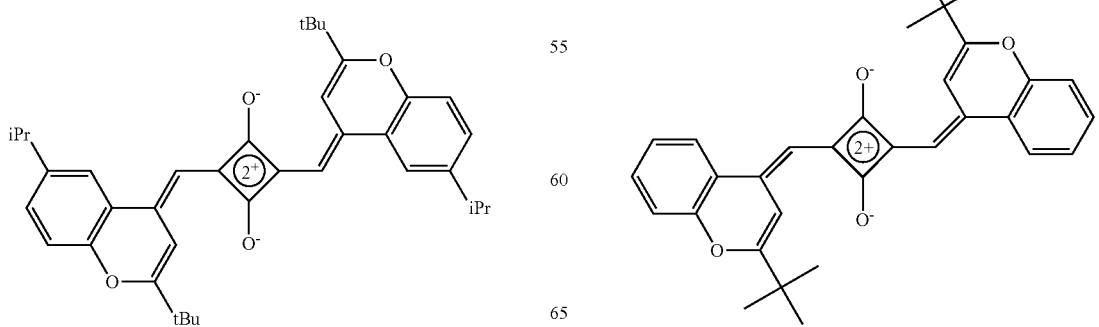

Near-infrared absorber 3: Compound having the following structure (squarylium compound)

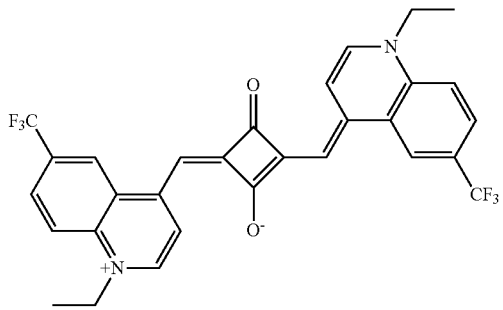 [SMILES: CCN1C=C/C(=C\C2=C([O-])C(=C\c3cc[n+](CC)c4ccc(C(F)(F)F)cc34)/C2=O)c2cc(C(F)(F)F)ccc21]

Near-infrared absorber 4: Compound having the following structure (squarylium compound)

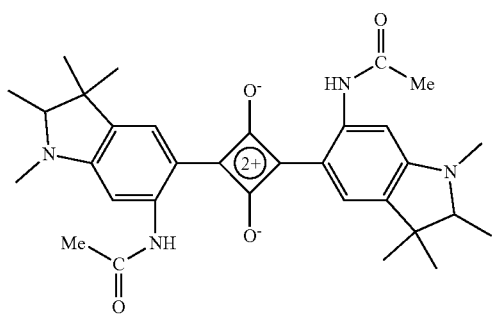

Near-infrared absorber 5: Compound having the following structure (croconium compound)

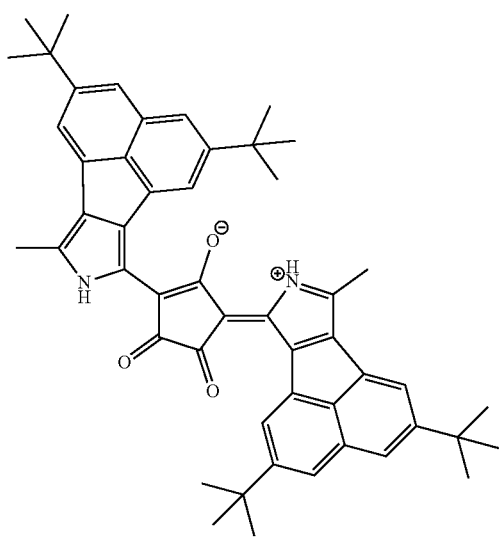

Near-infrared absorber 6: NK-5060 (manufactured by Hayashibara Co., Ltd., cyanine compound)

Near-infrared absorber 7: Compound of Production Example 1 of WO2010/095676A (iminium compound)

Near-infrared absorber 8: Compound having the following structure (phthalocyanine compound)

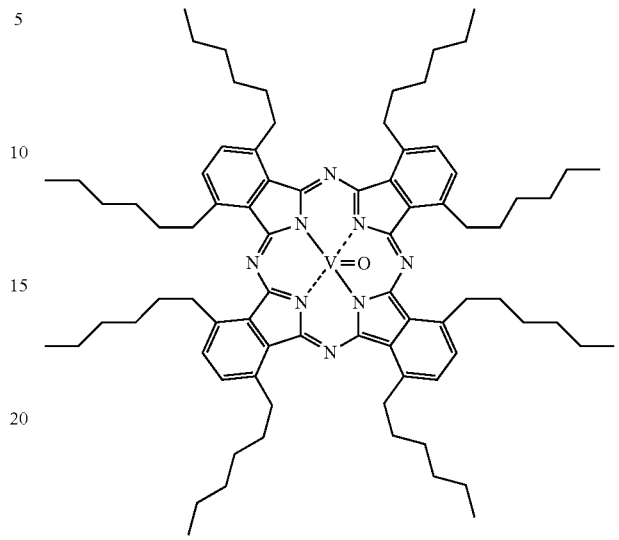

Near-infrared absorber 9: YMF-02 (manufactured by Sumitomo Metal Mining Co., Ltd., dispersion of tungsten particles, pigment content: 18.5% by mass, dispersant: 10% by mass)

Near-infrared absorber 10: P1-3 (manufactured by Mitsubishi Materials Corporation, indium tin oxide (ITO) dispersion liquid, pigment content: 20% by mass, dispersant: 2% by mass)

Near-infrared absorber 11: KHF-5AH (manufactured by Sumitomo Metal Mining Co., Ltd., $LaB_6$ dispersion liquid, pigment content: 8.4% by mass, dispersant: 7.8% by mass)

Near-infrared absorber 12: Dispersion liquid containing 7% by mass of a compound (SQ-1) having the following structure as a near-infrared absorbing colorant, 1.4% by mass of a compound (B-2) having the following structure as a pigment derivative, 5% by mass of a dispersant 1, and a balance of PGMEA Near-infrared absorber 13: Dispersion liquid containing 14% by mass of a compound (SQ-1) having the following structure as a near-infrared absorbing colorant, 2.8% by mass of the compound (B-2) having the following structure as a pigment derivative, 10% by mass of the dispersant 1, and a balance of PGMEA Near-infrared absorber 14: Dispersion liquid containing 3.5% by mass of the compound (SQ-1) having the following structure as a near-infrared absorbing colorant, 0.7% by mass of the compound (B-2) having the following structure as a pigment derivative, 2.5% by mass of the dispersant 1, and a balance of PGMEA Near-infrared absorber 15: Dispersion liquid containing 7% by mass of a compound (SQ-1) having the following structure as a near-infrared absorbing colorant, 2.8% by mass of the compound (B-2) having the following structure as a pigment derivative, 5% by mass of the dispersant 1, and a balance of PGMEA Near-infrared absorber 16: Dispersion liquid containing 7% by mass of a compound (SQ-1) having the following structure as a near-infrared absorbing colorant, 0.7% by mass of the compound (B-2) having the following structure as a pigment derivative, 5% by mass of the dispersant 1, and a balance of PGMEA Near-infrared absorber 17: Dispersion liquid containing 7% by mass of a compound (SQ-1) having the following structure as a near-infrared absorbing colorant, 1.4% by mass of the compound (B-2) having the following structure as a pigment derivative, 7.5% by mass of the dispersant 1, and a balance of PGMEA Near-infrared absorber 18: Dispersion liquid containing 7% by mass of a compound (SQ-1) having the following structure as a near-infrared absorbing colorant, 1.4% by mass of the compound (B-2) having the following structure as a pigment derivative, 2.5% by mass of the dispersant 1, and a balance of PGMEA Near-infrared absorber 19: Dispersion liquid containing 7% by mass of a compound (SQ-1) having the following structure as a near-infrared absorbing colorant, 1.4% by mass of the compound (B-2) having the following structure as a pigment derivative, 5% by mass of the dispersant 1, and a balance of cyclohexanone Near-infrared absorber 20: Dispersion liquid containing 7% by mass of a compound (SQ-1) having the following structure as a near-infrared absorbing colorant, 1.4% by mass of the compound (B-6) having the following structure as a pigment derivative, 5% by mass of the dispersant 1, and a balance of PGMEA Near-infrared absorber 21: Dispersion liquid containing 7% by mass of a compound (SQ-1) having the following structure as a near-infrared absorbing colorant, 1.4% by mass of the compound (B-14) having the following structure as a pigment derivative, 5% by mass of a dispersant 2, and a balance of PGMEA Near-infrared absorber 22: Dispersion liquid containing 7% by mass of a compound (SQ-14) having the following structure as a near-infrared absorbing colorant, 1.4% by mass of the compound (B-2) having the following structure as a pigment derivative, 5% by mass of the dispersant 1, and a balance of PGMEA Near-infrared absorber 23: Dispersion liquid containing 7% by mass of a compound (SQ-13) having the following structure as a near-infrared absorbing colorant, 1.4% by mass of the compound (B-2) having the following structure as a pigment derivative, 5% by mass of the dispersant 1, and a balance of PGMEA Near-infrared absorber 24: Dispersion liquid containing 7% by mass of a compound (SQ-15) having the following structure as a near-infrared absorbing colorant, 1.4% by mass of the compound (B-2) having the following structure as a pigment derivative, 5% by mass of the dispersant 1, and a balance of PGMEA Near-infrared absorber 25: Dispersion liquid containing 7% by mass of a compound (SQ-17) having the following structure as a near-infrared absorbing colorant, 1.4% by mass of the compound (B-2) having the following structure as a pigment derivative, 5% by mass of the dispersant 1, and a balance of PGMEA Near-infrared absorber 26: Dispersion liquid containing 7% by mass of a compound (SQ-33) having the following structure as a near-infrared absorbing colorant, 1.4% by mass of the compound (B-2) having the following structure as a pigment derivative, 5% by mass of the dispersant 1, and a balance of PGMEA Near-infrared absorber 27: Dispersion liquid containing 7% by mass of the compound (SQ-24) having the following structure as a near-infrared absorbing colorant, 1.4% by mass of the compound (B-1) having the following structure as a pigment derivative, 5% by mass of the dispersant 1, and a balance of PGMEA Near-infrared absorber 28: Dispersion liquid containing 7% by mass of a compound (SQ-25) having the following structure as a near-infrared absorbing colorant, 1.4% by mass of a compound (B-1) having the following structure as a pigment derivative, 5% by mass of the dispersant 1, and a balance of PGMEA Near-infrared absorber 29: Dispersion liquid containing 7% by mass of the compound (SQ-27) having the following structure as a near-infrared absorbing colorant, 1.4% by mass of the compound (B-1) having the following structure as a pigment derivative, 5% by mass of the dispersant 1, and a balance of PGMEA Near-infrared absorber 30: Dispersion liquid containing 7% by mass of a compound (SQ-30) having the following structure as a near-infrared absorbing colorant, 1.4% by mass of the compound (B-1) having the following structure as a pigment derivative, 5% by mass of the dispersant 1, and a balance of PGMEA Near-infrared absorber 31: Dispersion liquid containing 7% by mass of a compound (SQ-21) having the following structure as a near-infrared absorbing colorant, 1.4% by mass of the compound (B-3) having the following structure as a pigment derivative, 5% by mass of the dispersant 1, and a balance of PGMEA Near-infrared absorber 32: Compound having the following structure (squarylium compound)

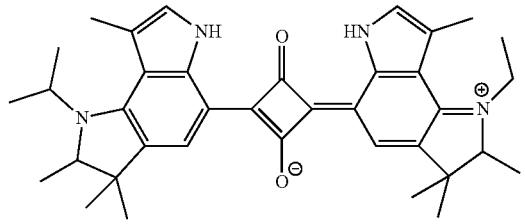 [SMILES: CC[N+]1=c2c(c/c(=C3/C(=O)C(c4cc5c(c6c(C)c[nH]c46)N(C(C)C)C(C)C5(C)C)=C3[O-])c3[nH]cc(C)c23)C(C)(C)C1C]

Near-infrared absorber 33: Compound having the following structure (croconium compound)

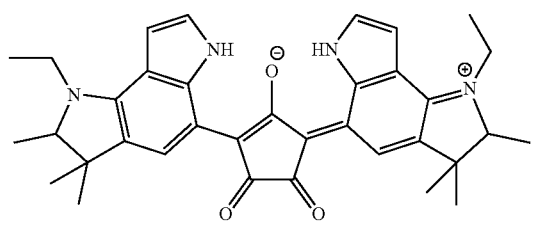 [SMILES: CCN1c2c(cc(C3=C([O-])/C(=c4/cc5c(c6cc[nH]c46)=[N+](CC)C(C)C5(C)C)C(=O)C3=O)c3[nH]ccc23)C(C)(C)C1C]

Near-infrared absorber 34: Compound having the following structure (croconium compound)

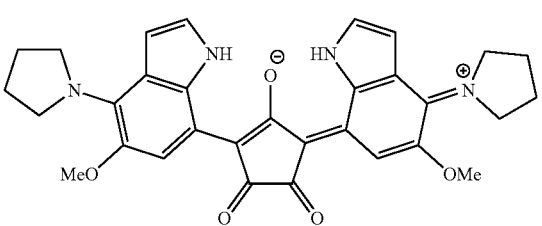 [SMILES: COC1=C/C(=C2\C(=O)C(=O)C(c3cc(OC)c(N4CCCC4)c4cc[nH]c34)=C2[O-])c2[nH]ccc2C1=[N+]1CCCC1]

The near-infrared absorbing colorants, the pigment derivatives, and the dispersants used for the near-infrared absorbers 12 to 31 are as follows.

[Near-Infrared Absorbing Colorant]
Compounds (SQ-1), (SQ-13), (SQ-14), (SQ-15), (SQ-17), (SQ-21), (SQ-24), (SQ-25), (SQ-27), (SQ-30), and (SQ-33): Compounds of the following structures (all are squarylium compounds)
SQ-1
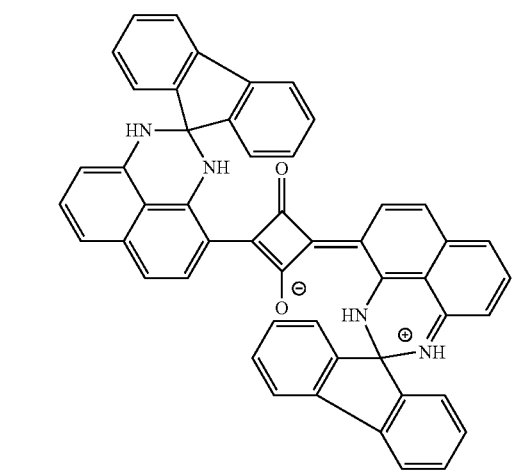
SQ-13
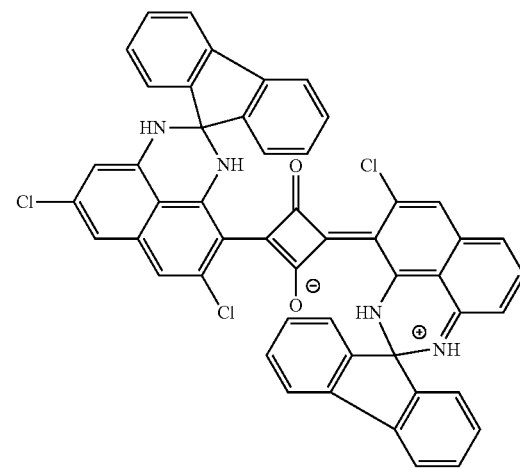
SQ-14
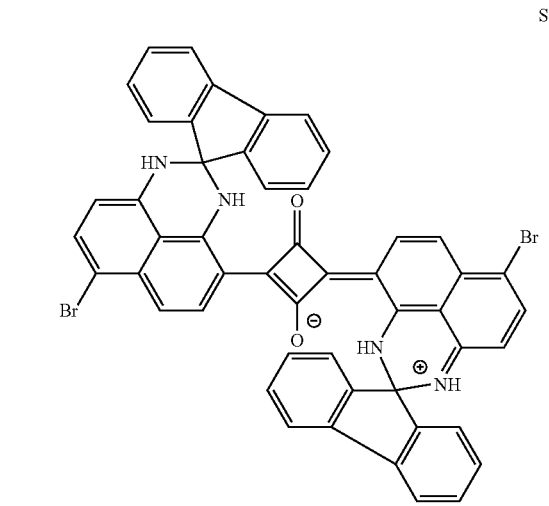
-continued
SQ-15
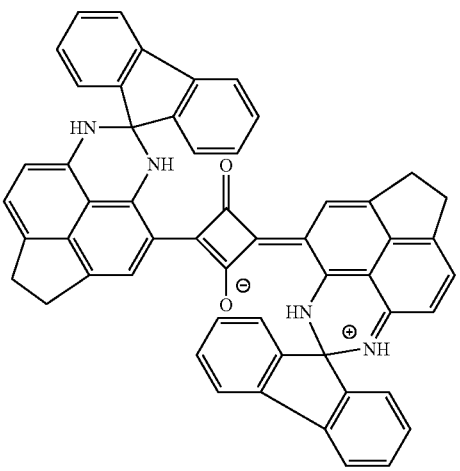
SQ-17
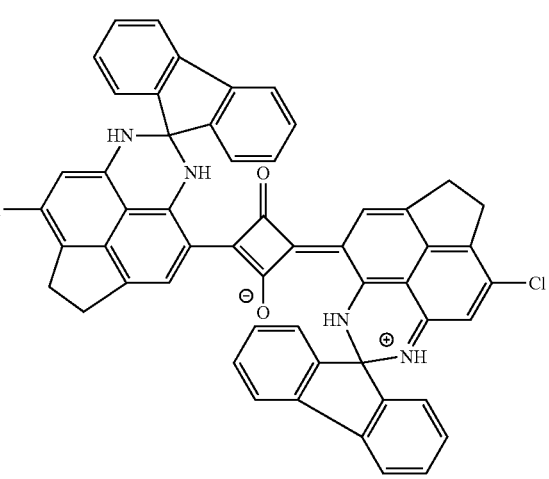
SQ-21
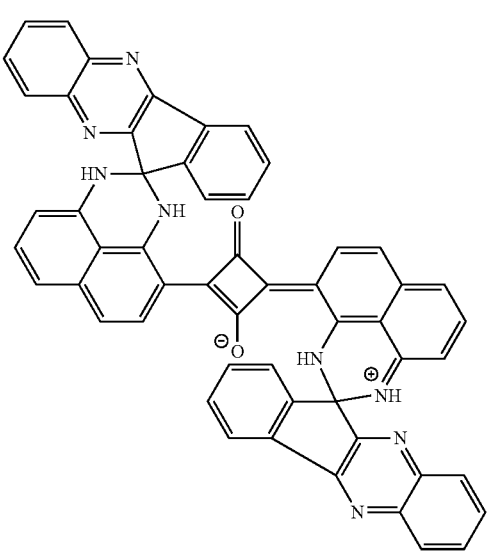

-continued
SQ-24
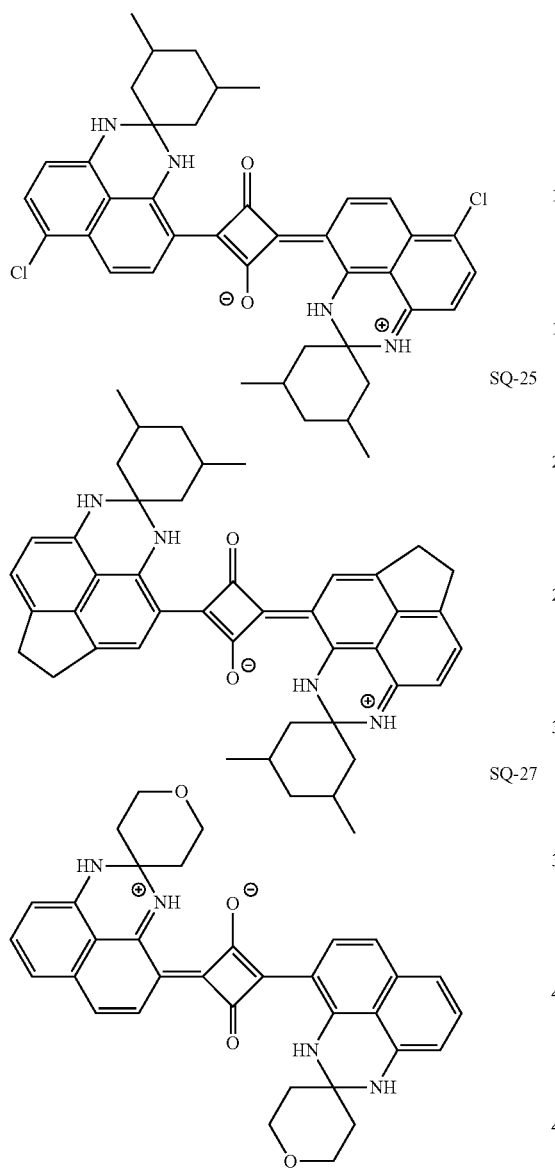
-continued
SQ-30
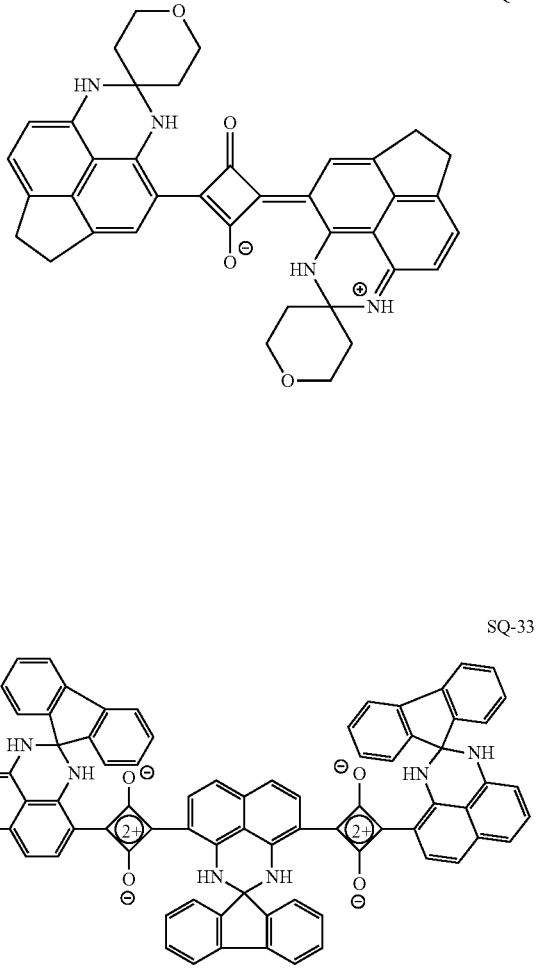
SQ-25
SQ-27
SQ-33
[Pigment Derivatives]
Compound (B-1), compound (B-2), compound (B-3), compound (B-6), and compound (B-14): Compounds having the following structures
B-1
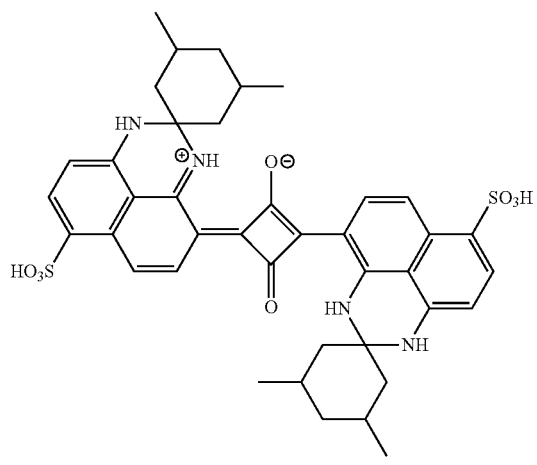
B-2
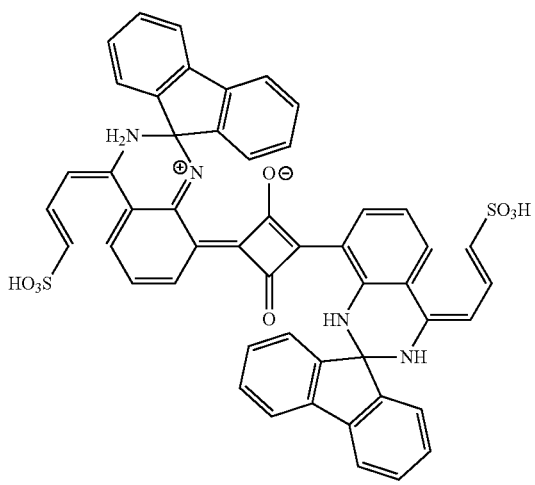

-continued

B-3

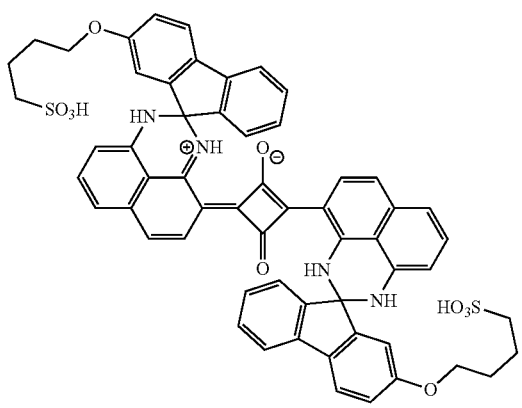

B-6

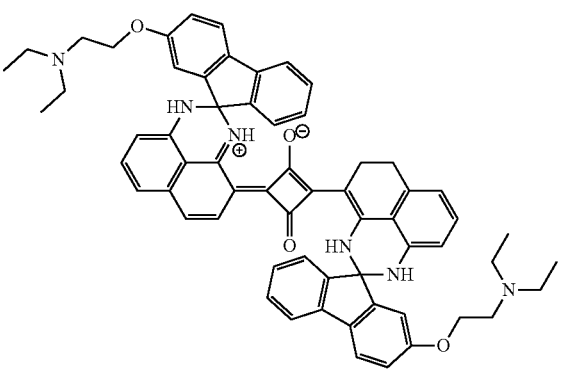

B-14

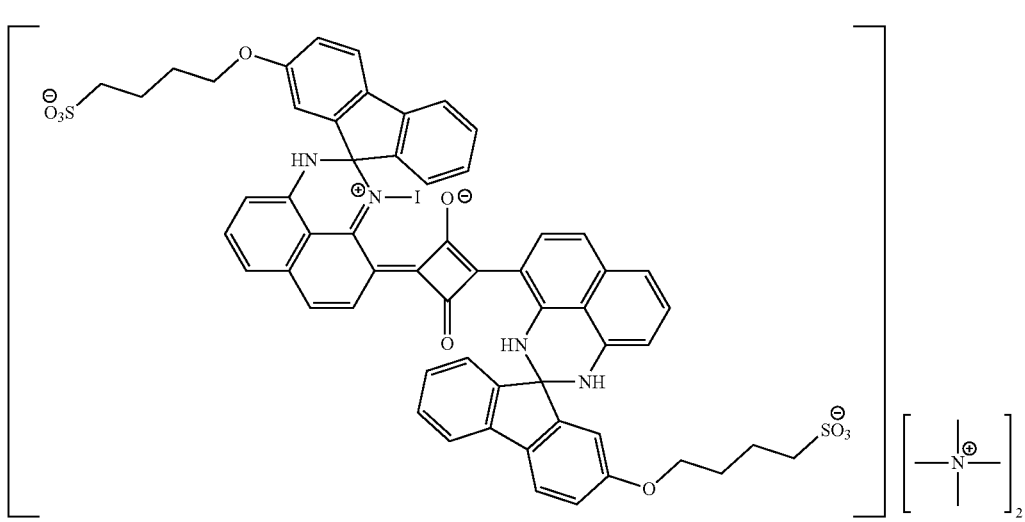

[Dispersant]

Dispersant 1: Block type resin having the following structure (amine value=90 mg KOH/g, quaternary ammonium salt value=30 mg KOH/g, weight-average molecular weight=9,800). The numerical value attached to the main chain represents a molar ratio of the repeating unit.

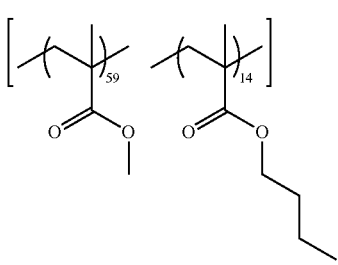

-continued

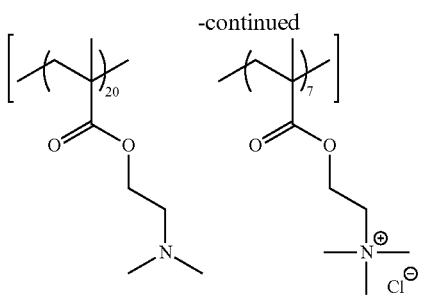

Dispersant 2: SOLSEPERSE 36000 (manufactured by Nippon Lubrizol Co., Ltd.)

(Surfactant)

Surfactant 1: MEGAFACE F-554 (manufactured by DIC Corporation, fluorine-based surfactant)

Surfactant 2: Ftergent FTX-218 (manufactured by Neos Co., Ltd., fluorine-based surfactant)

Surfactant 3: KF-6001 (manufactured by Shin-Etsu Chemical Co., Ltd., silicon-based surfactant)

(Resin or Precursor)

Resin 1: ARTON F4520 (manufactured by JSR Corporation, norbornene resin, glass transition temperature=164° C.)

Resin 2: ARTON D4540 (manufactured by JSR Corporation, norbornene resin, glass transition temperature=128° C.)

Resin 3: Neopulim S-200 (manufactured by Mitsubishi Gas Chemical Co., Inc., polyimide resin, glass transition temperature=300° C.)

Resin R1: Cyclomer ACA210β (manufactured by Daicel Ornex Co., acrylic resin, glass transition temperature=19° C.)

Precursor 1: Polyimide precursor synthesized by the following method 4,4'-Diaminophenyl ether (0.30 molar equivalents), paraphenylenediamine (0.65 molar equivalents), and bis(3-aminopropyl)tetramethyldisiloxane (0.05 molar equivalents) were charged together with 850 g of γ-butyrolactone and 850 g of N-methyl-2-pyrrolidone, 3,3',4,4'-oxydiphthalcarboxylic dianhydride (0.9975 molar equivalents) was added thereto, and the mixture was reacted at 80° C. for 3 hours.

Maleic anhydride (0.02 molar equivalents) was added thereto, and the mixture was further reacted at 80° C. for 1 hour to obtain a polyimide precursor resin solution (concentration of polyimide precursor: 20% by weight). A resin (polyimide resin) formed from this polyimide precursor resin has a glass transition temperature of 100° C. or higher.

(Solvent)
Solvent 1: Dichloromethane
Solvent 2: Trichloromethane
Solvent 3: Toluene (Additive)
Additive 1: ADEKA STAB AO-80 (manufactured by ADEKA Corporation, antioxidant)
Additive 2: Compound having the following structure (ultraviolet absorber)

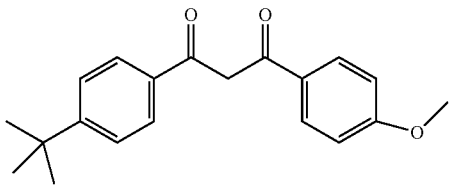 [SMILES: COc1ccc(C(=O)CC(=O)c2ccc(C(C)(C)C)cc2)cc1]

Additive 3: OGSOL PG-100 (Epoxy compound manufactured by Osaka Gas Chemicals Co., Ltd.)
Additive 4: OGSOL EA-0300 (Osaka Gas Chemicals Co., Ltd., polymerizable monomer)
Additive 5: IRGACURE OXE 01, (manufactured by BASF, photopolymerization initiator)

[Preparation of Composition for Color Filter]

(Red Composition 1)

The following components were mixed, stirred, and then filtered through a nylon-made filter having a pore diameter of 0.45 μm (manufactured by Nihon Pall Corporation) to prepare a red composition 1.

Red pigment dispersion liquid • • • 51.7 parts by mass
Resin 14 • • • 0.6 parts by mass
Polymerizable monomer 14 • • • 0.6 parts by mass
Photopolymerization initiator 11 • • • 0.4 parts by mass
Surfactant 11 • • • 4.2 parts by mass
Ultraviolet absorber (UV-503, manufactured by Daito Chemical Co., Ltd.) • • • 0.3 parts by mass
Propylene glycol monomethyl ether acetate (PGMEA) • • • 42.6 parts by mass (Green Composition 1)

The following components were mixed, stirred, and then filtered through a nylon-made filter having a pore diameter of 0.45 μm (manufactured by Nihon Pall Corporation) to prepare a green composition 1.

Green pigment dispersion liquid • • • 73.7 parts by mass
Resin 14 • • • 0.3 parts by mass
Polymerizable monomer 11 • • • 1.2 parts by mass
Photopolymerization initiator 11 • • • 0.6 parts by mass
Surfactant 11 • • • 4.2 parts by mass
Ultraviolet absorber (UV-503, manufactured by Daito Chemical Co., Ltd.) • • • 0.5 parts by mass
PGMEA • • • 19.5 parts by mass (Blue Composition 1)

The following components were mixed, stirred, and then filtered through a nylon-made filter having a pore diameter of 0.45 μm (manufactured by Nihon Pall Corporation) to prepare a blue composition 1.

Blue pigment dispersion liquid • • • 44.9 parts by mass
Resin 14 • • • 2.1 parts by mass
Polymerizable monomer 11 • • • 1.5 parts by mass
Polymerizable monomer 14 • • • 0.7 parts by mass
Photopolymerization initiator 11 • • • 0.8 parts by mass
Surfactant 11 • • • 4.2 parts by mass
Ultraviolet absorber (UV-503, manufactured by Daito Chemical Co., Ltd.) • • • 0.3 parts by mass
PGMEA • • • 45.8 parts by mass

[Preparation of Composition for Near-Infrared Transmitting Filter]

(IR-Pass Composition)

The following components were mixed, stirred, and then filtered through a nylon-made filter having a pore diameter of 0.45 μm (manufactured by Nihon Pall Corporation) to prepare an IR-pass composition 1.

Pigment dispersion liquid 1-1 • • • 46.5 parts by mass
Pigment dispersion liquid 1-2 • • • 37.1 parts by mass
Polymerizable monomer 15 • • • 1.8 parts by mass
Resin 14 • • • 1.1 parts by mass
Photopolymerization initiator 12 • • • 0.9 parts by mass
Surfactant 11 • • • 4.2 parts by mass
Polymerization inhibitor (p-methoxyphenol) • • • 0.001 parts by mass
Silane coupling agent • • • 0.6 parts by mass
PGMEA • • • 7.8 parts by mass (IR-Pass Composition 2)
The photosensitive composition 1 of JP6263964B was used as the IR-pass composition 2.

(IR-Pass Composition 3)
The photosensitive composition 2 of JP6263964B was used as the IR-pass composition 3.

(IR-Pass Composition 4)
The photosensitive composition 3 of JP6263964B was used as the IR-pass composition 4.

(IR-Pass Composition 5)
The photosensitive composition 4 of JP6263964B was used as the IR-pass composition 5.

(IR-Pass Composition 6)
The photosensitive composition 5 of JP6263964B was used as the IR-pass composition 6.

(IR-Pass Composition 7)
The photosensitive composition 6 of JP6263964B was used as the IR-pass composition 7.

(IR-Pass Composition 8)
The composition of Example 7 of JP2016-177079A was used as the IR-pass composition 8.

The raw materials used for the red composition 1, the green composition 1, the blue composition 1 and the IR-pass composition 1 are as follows.

Red Pigment Dispersion Liquid

A mixed liquid consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed with a beads mill (zirconia beads with a diameter of 0.3 mm) for 3 hours to prepare a pigment dispersion liquid. Thereafter, the mixture was further subjected to a dispersion treatment at a flow rate of 500 g/min under a pressure of 2,000 kg/cm$^3$ using a high-pressure dispersing machine with pressure reducing mechanism, NANO-3000-10 (manufactured by Nippon BEE Chemical Co., Ltd.). This dispersion treatment was repeated ten times to obtain a red pigment dispersion liquid.

Green Pigment Dispersion Liquid

A mixed liquid consisting of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads with a diameter of 0.3 mm) for 3 hours to prepare a pigment dispersion liquid.

Thereafter, the mixture was further subjected to a dispersion treatment at a flow rate of 500 g/min under a pressure of 2,000 kg/cm$^3$ using a high-pressure dispersing machine with pressure reducing mechanism, NANO-3000-10 (manufactured by Nippon BEE Chemical Co., Ltd.). This dispersion treatment was repeated ten times to obtain a green pigment dispersion liquid.

Pigment Dispersion Liquid 1-1

The following components were mixed and dispersed for 3 hours using zirconia beads having a diameter of 0.3 mm with a beads mill (high-pressure dispersing machine with pressure reducing mechanism, NANO-3000-10 (manufactured by Nippon BEE Chemical Co., Ltd.)), to prepare a pigment dispersion liquid 1-1.

A mixed pigment consisting of a red pigment (C. I. Pigment Red 254) and a yellow pigment (C. I. Pigment Yellow 139) • • • 11.8 parts by mass Resin (Disperbyk-111 (manufactured by BYK Chemie) • • • 9.1 parts by mass PGMEA • • • 79.1 parts by mass Pigment Dispersion Liquid 1-2

The following components were mixed and dispersed for 3 hours with a beads mill (a high-pressure dispersing machine with pressure reducing mechanism, NANO-3000-10 (manufactured by Nippon BEE Chemical Co., Ltd.)) in which zirconia beads having a diameter of 0.3 mm were used to prepare a pigment dispersion liquid 1-2.

A mixed pigment consisting of a blue pigment (C. I. Pigment Blue 15:6) and a violet pigment (C. I. Pigment Violet 23) • • • 12.6 parts by mass Resin (Disperbyk-111 (manufactured by BYK Chemie) • • • 2.0 parts by mass Resin 13 • • • 3.3 parts by mass Cyclohexanone • • • 31.2 parts by mass PGMEA • • • 50.9 parts by mass Polymerizable monomer 11: KAYARAD DPHA (manufactured by Nippon Kayaku Co., Ltd.)

Polymerizable monomer 14: Compound having the following structure

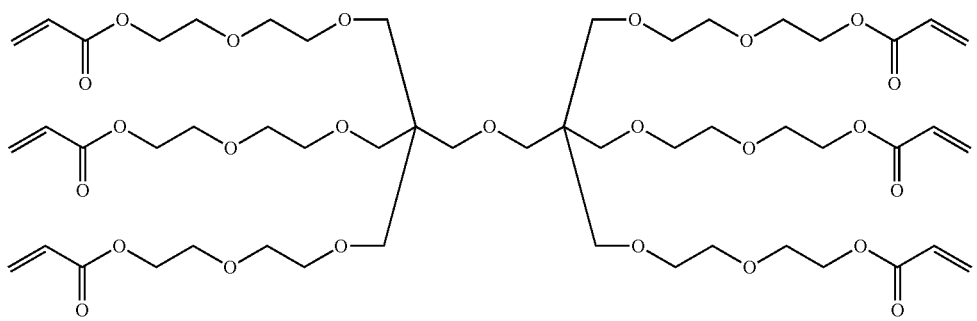 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Blue Pigment Dispersion Liquid

A mixed liquid formed of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), and 82.4 parts by mass of PGMEA was mixed and dispersed with a beads mill (zirconia beads with a diameter of 0.3 mm) for 3 hours to prepare a pigment dispersion liquid. Thereafter, the mixture was further subjected to a dispersion treatment at a flow rate of 500 g/min under a pressure of 2,000 kg/cm$^3$ using a high-pressure dispersing machine with pressure reducing mechanism, NANO-3000-10 (manufactured by Nippon BEE Chemical Co., Ltd.). This dispersion treatment was repeated ten times to obtain a blue pigment dispersion liquid.

Polymerizable monomer 15: A mixture of compounds having the following structures (a mixture of the left compound and the right compound at a molar ratio of 7:3)

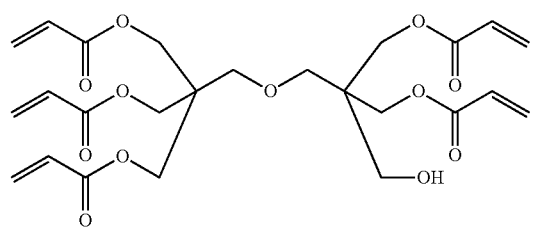

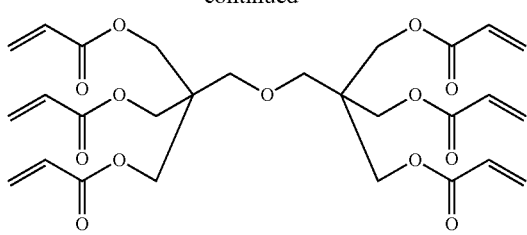

Resin 13: Resin having the following structure. (The numerical value attached to the main chain is a molar ratio. Mw=10,000, acid value=70 mgKOH/g, glass transition temperature=79° C.)

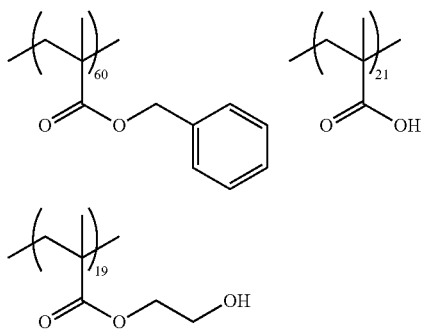

Resin 14: Resin having the following structure. (The numerical value attached to the main chain is a molar ratio. Mw=10,000, acid value=70 mgKOH/g, glass transition temperature=46° C.)

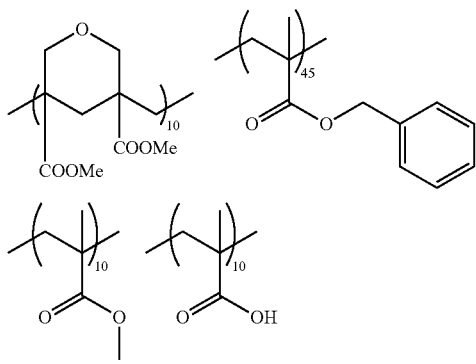

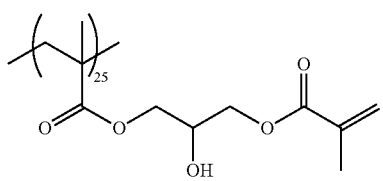

Photopolymerization initiator 11: IRGACURE OXE01 (manufactured by BASF)

Photopolymerization initiator 12: Compound having the following structure

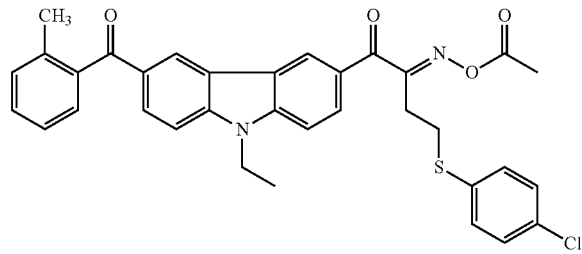 [SMILES: CCn1c2ccc(C(=O)/C(CCSc3ccc(Cl)cc3)=N/OC(C)=O)cc2c2cc(C(=O)c3ccccc3C)ccc21]

Surfactant 11: 1%-by-mass PGMEA solution of the following mixture (Mw=14,000). In the following formula, % representing a ratio of the repeating units is in % by mole.

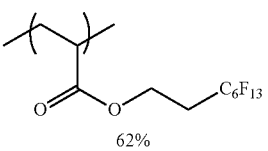

62%

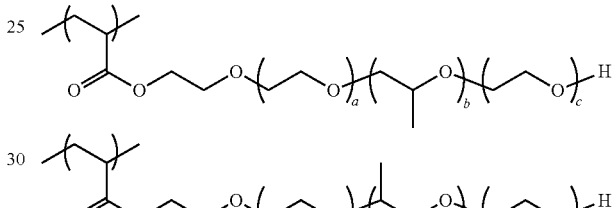

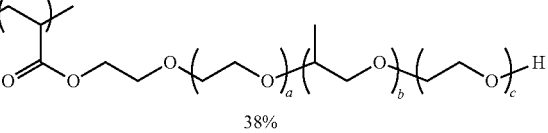

38%

$a + c = 14$
$b = 17$

Silane coupling agent: Compound having the following structure. In the following structural formula, Me represents a methyl group.

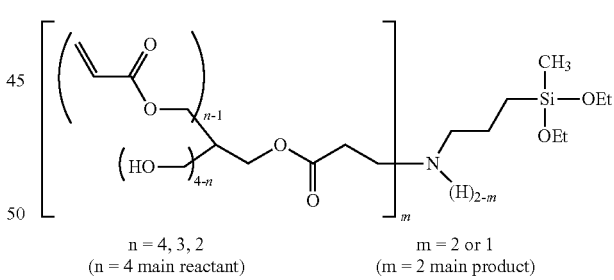

n = 4, 3, 2           m = 2 or 1
(n = 4 main reactant)   (m = 2 main product)

Test Example 1

<Production of Structure>

The composition described in the column of Near-infrared cut filter in the following table was applied onto an 8-inch (20.32-cm) silicon wafer or glass substrate by spin coating. Subsequently, it was heated at 100° C. for 2 minutes using a hot plate.

Then, a cured material layer was formed by performing a heating treatment at 220° C. for 300 seconds using a hot plate. The film thickness of this cured material layer was 1.0 μm.

Then, a positive photoresist "FHi622BC" (manufactured by FUJIFILM Electronic Materials Co., Ltd.) was applied onto the cured material layer and prebaked at 110° C. for 1 minute to form a photoresist layer having a film thickness of 3.0 μm.

Subsequently, the photoresist layer was subjected to patternwise exposure using an i-ray stepper (manufactured by Canon Inc.) with an exposure dose of 200 mJ/cm$^2$, and then subjected to a heating treatment for 1 minute at a temperature so that the temperature of the photoresist layer or the atmosphere temperature was 90° C. Thereafter, the photoresist layer was subjected to a developing treatment for 1 minute using a developer "FHD-5" (manufactured by Fujifilm Electronics Materials Co., Ltd.) and a post-baking treatment was carried out at 110° C. for 1 minute to form a resist pattern.

Next, using the resist pattern as an etching mask, the cured material layer was subjected to dry etching by the following procedure.

A first-stage etching treatment was performed for 80 seconds with a dry etching apparatus (manufactured by Hitachi High-Technologies Corporation, U-621) under the conditions of RF power: 800 W, antenna bias: 400 W, wafer bias: 200 W, internal pressure of chamber: 4.0 Pa, substrate temperature: 50° C., and gas type and flow rate of mixed gas: $CF_4$: 80 mL/min, $O_2$: 40 mL/min, and Ar: 800 mL/min.

Subsequently, an overetching treatment was performed as a second-stage etching treatment in the same etching chamber under the conditions of RF power: 600 W, antenna bias: 100 W, wafer bias: 250 W, internal pressure of chamber: 2.0 Pa, substrate temperature: 50° C., gas type and flow rate of mixed gas: $N_2$: 500 mL/min, $O_2$: 50 mL/min, and Ar: 500 mL/min ($N_2/O_2/Ar=10/1/10$) for 28 seconds.

After performing the dry etching under the above-described conditions, a peeling treatment was performed for 120 seconds by using a photoresist peeling solution "MS230C" (manufactured by FUJIFILM Electronic Materials Co., Ltd.) to remove the resist, and further subjected to washing with pure water and spin-drying. Thereafter, a dehydration baking treatment was performed at 100° C. for 2 minutes.

By the above-described process, a Bayer pattern (near-infrared cut filter) of 2 μm square was formed.

Next, the red composition 1 was applied onto the pattern of the near-infrared cut filter by spin coating so that the film thickness after film formation was 1.0 Then, the film was heated at 100° C. for 2 minutes using a hot plate. Then, the film was exposed through a mask having a Bayer pattern of 2 μm square at an exposure dose of 1,000 mJ/cm$^2$, using an i-ray stepper exposure apparatus FPA-3000i5+ (manufactured by Canon Inc.). Next, the film was subjected to puddle development at 23° C. for 60 seconds using a 0.3%-by-mass aqueous solution of tetramethylammonium hydroxide (TMAH). Thereafter, the substrate was rinsed with a spin shower and further washed with pure water. Then, the green composition was patterned on the pattern of the near-infrared cut filter by heating at 200° C. for 5 minutes using a hot plate. Similarly, the green composition 1 and the blue composition 1 were sequentially patterned to form red, green and blue colored patterns, thereby forming a color filter.

Next, the composition described in the section of Near-Infrared Transmitting Filter was applied onto the patterned film by spin coating so that the film thickness after film formation was 2.0 μm. Then, it was heated at 100° C. for 2 minutes using a hot plate. In addition, in Example 109, the red composition 1 and the blue composition 1 were laminated to form a laminated film having a film thickness of 2.0 μm after film formation (the film thickness of the red composition 1=1.0 μm, the film thickness of the blue composition 1=1.0 μm).

Then, the film was exposed through a mask having a Bayer pattern of 2 μm square at an exposure dose of 1,000 mJ/cm$^2$, using an i-ray stepper exposure apparatus FPA-3000i5+ (manufactured by Canon Inc.). Next, the film was subjected to puddle development at 23° C. for 60 seconds using a 0.3%-by-mass aqueous solution of tetramethylammonium hydroxide (TMAH). Thereafter, the substrate was rinsed with a spin shower and further washed with pure water. Then, a pattern of the near-infrared transmitting filter was formed in the pattern missing portion of the near-infrared cut filter by heating at 200° C. for 5 minutes using a hot plate. Thus, the structure shown in FIG. 1 was produced.

TABLE 3

| | Near-infrared cut filter | Color filter | | | Near-infrared transmitting filter |
| --- | --- | --- | --- | --- | --- |
| | | Red | Green | Blue | |
| Example 101 | Example 1 | Red composition 1 | Green composition 1 | Blue composition 1 | IR-pass composition 1 |
| Example 102 | Example 1 | Red composition 1 | Green composition 1 | Blue composition 1 | IR-pass composition 2 |
| Example 103 | Example 1 | Red composition 1 | Green composition 1 | Blue composition 1 | IR-pass composition 3 |
| Example 104 | Example 1 | Red composition 1 | Green composition 1 | Blue composition 1 | IR-pass composition 4 |
| Example 105 | Example 1 | Red composition 1 | Green composition 1 | Blue composition 1 | IR-pass composition 5 |
| Example 106 | Example 1 | Red composition 1 | Green composition 1 | Blue composition 1 | IR-pass composition 6 |
| Example 107 | Example 1 | Red composition 1 | Green composition 1 | Blue composition 1 | IR-pass composition 7 |
| Example 108 | Example 1 | Red composition 1 | Green composition 1 | Blue composition 1 | IR-pass composition 8 |
| Example 109 | Example 1 | Red composition 1 | Green composition 1 | Blue composition 1 | Laminate of Red composition 1 and Blue composition 1 |
| Example 110 | Example 2 | Red composition 1 | Green composition 1 | Blue composition 1 | IR-pass composition 1 |
| Example 111 | Example 3 | Red composition 1 | Green composition 1 | Blue composition 1 | IR-pass composition 1 |
| Example 112 | Example 4 | Red composition 1 | Green composition 1 | Blue composition 1 | IR-pass composition 1 |
| Example 113 | Example 5 | Red composition 1 | Green composition 1 | Blue composition 1 | IR-pass composition 1 |
| Example 114 | Example 6 | Red composition 1 | Green composition 1 | Blue composition 1 | IR-pass composition 1 |
| Example 115 | Example 7 | Red composition 1 | Green composition 1 | Blue composition 1 | IR-pass composition 1 |
| Example 116 | Example 8 | Red composition 1 | Green composition 1 | Blue composition 1 | IR-pass composition 1 |
| Example 117 | Example 9 | Red composition 1 | Green composition 1 | Blue composition 1 | IR-pass composition 1 |
| Example 118 | Example 10 | Red composition 1 | Green composition 1 | Blue composition 1 | IR-pass composition 1 |
| Example 119 | Example 11 | Red composition 1 | Green composition 1 | Blue composition 1 | IR-pass composition 1 |
| Example 120 | Example 12 | Red composition 1 | Green composition 1 | Blue composition 1 | IR-pass composition 1 |

TABLE 3-continued

| | Near-infrared cut filter | Color filter | | | Near-infrared transmitting filter |
|---|---|---|---|---|---|
| | | Red | Green | Blue | |
| Example 121 | Example 13 | Red composition 1 | Green composition 1 | Blue composition 1 | IR-pass composition 1 |
| Example 122 | Example 14 | Red composition 1 | Green composition 1 | Blue composition 1 | IR-pass composition 1 |
| Example 123 | Example 15 | Red composition 1 | Green composition 1 | Blue composition 1 | IR-pass composition 1 |
| Example 124 | Example 16 | Red composition 1 | Green composition 1 | Blue composition 1 | IR-pass composition 1 |
| Example 125 | Example 17 | Red composition 1 | Green composition 1 | Blue composition 1 | IR-pass composition 1 |
| Example 126 | Example 18 | Red composition 1 | Green composition 1 | Blue composition 1 | IR-pass composition 1 |
| Example 127 | Example 19 | Red composition 1 | Green composition 1 | Blue composition 1 | IR-pass composition 1 |
| Example 128 | Example 20 | Red composition 1 | Green composition 1 | Blue composition 1 | IR-pass composition 1 |
| Example 129 | Example 21 | Red composition 1 | Green composition 1 | Blue composition 1 | IR-pass composition 1 |
| Example 130 | Example 22 | Red composition 1 | Green composition 1 | Blue composition 1 | IR-pass composition 1 |
| Example 131 | Example 23 | Red composition 1 | Green composition 1 | Blue composition 1 | IR-pass composition 1 |
| Example 132 | Example 24 | Red composition 1 | Green composition 1 | Blue composition 1 | IR-pass composition 1 |
| Example 133 | Example 25 | Red composition 1 | Green composition 1 | Blue composition 1 | IR-pass composition 1 |
| Example 134 | Example 26 | Red composition 1 | Green composition 1 | Blue composition 1 | IR-pass composition 1 |
| Example 135 | Example 27 | Red composition 1 | Green composition 1 | Blue composition 1 | IR-pass composition 1 |
| Example 136 | Example 28 | Red composition 1 | Green composition 1 | Blue composition 1 | IR-pass composition 1 |
| Example 137 | Example 29 | Red composition 1 | Green composition 1 | Blue composition 1 | IR-pass composition 1 |
| Example 138 | Example 30 | Red composition 1 | Green composition 1 | Blue composition 1 | IR-pass composition 1 |
| Example 139 | Example 31 | Red composition 1 | Green composition 1 | Blue composition 1 | IR-pass composition 1 |
| Example 140 | Example 32 | Red composition 1 | Green composition 1 | Blue composition 1 | IR-pass composition 1 |
| Example 141 | Example 33 | Red composition 1 | Green composition 1 | Blue composition 1 | IR-pass composition 1 |
| Example 142 | Example 34 | Red composition 1 | Green composition 1 | Blue composition 1 | IR-pass composition 1 |
| Example 143 | Example 35 | Red composition 1 | Green composition 1 | Blue composition 1 | IR-pass composition 1 |
| Example 144 | Example 36 | Red composition 1 | Green composition 1 | Blue composition 1 | IR-pass composition 1 |
| Example 145 | Example 37 | Red composition 1 | Green composition 1 | Blue composition 1 | IR-pass composition 1 |
| Example 146 | Example 38 | Red composition 1 | Green composition 1 | Blue composition 1 | IR-pass composition 1 |

TABLE 4

| | Near-infrared cut filter | Color filter | | | Near-infrared transmitting filter |
|---|---|---|---|---|---|
| | | Red | Green | Blue | |
| Example 147 | Example 39 | Red composition 1 | Green composition 1 | Blue composition 1 | IR-pass composition 1 |
| Example 148 | Example 40 | Red composition 1 | Green composition 1 | Blue composition 1 | IR-pass composition 1 |
| Example 149 | Example 41 | Red composition 1 | Green composition 1 | Blue composition 1 | IR-pass composition 1 |
| Example 150 | Example 42 | Red composition 1 | Green composition 1 | Blue composition 1 | IR-pass composition 1 |
| Example 151 | Example 43 | Red composition 1 | Green composition 1 | Blue composition 1 | IR-pass composition 1 |
| Example 152 | Example 44 | Red composition 1 | Green composition 1 | Blue composition 1 | IR-pass composition 1 |
| Example 153 | Example 45 | Red composition 1 | Green composition 1 | Blue composition 1 | IR-pass composition 1 |
| Example 154 | Example 46 | Red composition 1 | Green composition 1 | Blue composition 1 | IR-pass composition 1 |
| Example 155 | Example 47 | Red composition 1 | Green composition 1 | Blue composition 1 | IR-pass composition 1 |
| Example 156 | Example 48 | Red composition 1 | Green composition 1 | Blue composition 1 | IR-pass composition 1 |
| Example 157 | Example 49 | Red composition 1 | Green composition 1 | Blue composition 1 | IR-pass composition 1 |
| Example 158 | Example 50 | Red composition 1 | Green composition 1 | Blue composition 1 | IR-pass composition 1 |
| Example 159 | Example 51 | Red composition 1 | Green composition 1 | Blue composition 1 | IR-pass composition 1 |
| Example 160 | Example 52 | Red composition 1 | Green composition 1 | Blue composition 1 | IR-pass composition 1 |
| Example 161 | Example 53 | Red composition 1 | Green composition 1 | Blue composition 1 | IR-pass composition 1 |
| Example 162 | Example 54 | Red composition 1 | Green composition 1 | Blue composition 1 | IR-pass composition 1 |
| Example 163 | Example 55 | Red composition 1 | Green composition 1 | Blue composition 1 | IR-pass composition 1 |
| Example 164 | Example 56 | Red composition 1 | Green composition 1 | Blue composition 1 | IR-pass composition 1 |
| Example 165 | Example 57 | Red composition 1 | Green composition 1 | Blue composition 1 | IR-pass composition 1 |
| Example 166 | Example 58 | Red composition 1 | Green composition 1 | Blue composition 1 | IR-pass composition 1 |
| Example 167 | Example 59 | Red composition 1 | Green composition 1 | Blue composition 1 | IR-pass composition 1 |
| Example 168 | Example 60 | Red composition 1 | Green composition 1 | Blue composition 1 | IR-pass composition 1 |
| Example 169 | Example 61 | Red composition 1 | Green composition 1 | Blue composition 1 | IR-pass composition 1 |
| Comparative Example 101 | Comparative Example 1 | Red composition 1 | Green composition 1 | Blue composition 1 | IR-pass composition 1 |
| Comparative Example 102 | Comparative Example 2 | Red composition 1 | Green composition 1 | Blue composition 1 | IR-pass composition 1 |
| Comparative Example 103 | Comparative Example 3 | Red composition 1 | Green composition 1 | Blue composition 1 | IR-pass composition 1 |

<Evaluation>

(Coating Properties)

The composition described in the column of Near-infrared cut filter in the following table was applied onto an 8-inch (20.32-cm) silicon wafer by spin coating. Subsequently, it was heated at 100° C. for 2 minutes using a hot plate. The film thickness of the pre-baked film was measured using a contactless type film thickness meter (FILMMETRICSF-50, manufactured by Matsushita Techno Trading Co., Ltd.), the in-plane uniformity (range: Δvalue [μm]=Max−Min) was calculated, and the coating properties were evaluated according to the following standard.

5: Δvalue<20 nm

4: 20 nm≤Δvalue<30 nm

3: 30 nm≤Δvalue<50 nm

2: 50 nm≤Δvalue<100 nm
1: 100 nm≤Δvalue
(Void)

The structure manufactured in Test Example 1 was stored in a chamber at a constant temperature and a constant humidity set at a temperature of 50° C. and a humidity of 70% for 6 months, and evaluation of the moisture resistance was performed. The structure after the moisture resistance test was cut and observed using a scanning electron microscope (measurement magnification=10,000 times), and the presence or absence of voids (voids and cracks) at the interface between the color filter and the near-infrared cut filter, on the pattern side surface of the near-infrared transmitting filter, and on the pattern side surface of the near-infrared cut filter was observed.

5: There are neither cracks nor voids at the interface between the pattern of each color of the color filter and the pattern of the near-infrared cut filter, on the pattern side surface of the near-infrared transmitting filter, and on the pattern side surface of the near-infrared cut filter.

4: Neither cracks or voids are found between the pattern of each color of the color filter and the near-infrared cut filter, but cracks can be slightly found at the interface between the pattern side of the near-infrared transmitting filter and the pattern side of the near-infrared cut filter.

3: Neither cracks or voids are found between the pattern of each color of the color filter and the near-infrared cut filter, but voids can be found at the interface between the pattern side of the near-infrared transmitting filter and the pattern side of the near-infrared cut filter.

2: Voids are found between the red, blue, or green pattern of the color filter and the near-infrared cut filter.

1: Voids are found in any of positions between the red pattern of the color filter and the near-infrared cut filter, between the blue pattern of the color filter and the near-infrared cut filter, and between the green pattern of the color filter and the near-infrared cut filter.

(Spectroscopy)

The composition for forming a near-infrared cut filter of each of Examples and Comparative Examples was applied onto a glass substrate using a spin coater (manufactured by Mikasa Co., Ltd.) so that the film thickness after prebaking was 1.0 μm, thereby forming a coating film. Then, the coating film was heated at 100° C. for 120 seconds using a hot plate. After performing (pre-baking), the entire surface was exposed at an exposure dose of 1,000 mJ/cm² using an i-ray stepper exposure apparatus FPA-3000i5+ (manufactured by Canon Co., Ltd.), and then heated (post-baked) again at 200° C. for 300 seconds using a hot plate to obtain a film. With respect to the obtained film, an absorbance with light at a wavelength of 400 to 1,300 nm was measured, $A_1/A_2$ which is a ratio of the maximum absorbance $A_1$ in the wavelength range of 400 to 600 nm to an absorbance $A_2$ at the maximum absorption wavelength in the wavelength range of 700 to 1,300 nm was calculated, and the spectral performance was evaluated according to the following standard.

A: $A_1/A_2$ is 0.3 or less.
B: $A_1/A_2$ is more than 0.3.

(Heat Resistance)

The structure manufactured in Test Example 1 was stored in a chamber at a high temperature set at 120° C. for 1,000 hours and the heat resistance was evaluated.

With regard to the structures before and after the heat resistance evaluation, transmittances T % of light at a wavelength of 400 to 1,300 nm were measured, a difference ΔT %=|T % (before heat resistance test)–T % (after heat resistance test)| was determined, and thus the heat resistance was evaluated. Further, in the evaluation of the heat resistance, a structure having each filter formed on a glass substrate was used.

5: ΔT %<3%
4: 3%≤ΔT %<5%
3: 5%≤ΔT %<10%
2: 10%≤ΔT %<20%
1: 20%≤ΔT %

(Light Resistance)

The structure manufactured in Test Example 1 was placed in a light resistance tester (illuminance: 10,000 Lx, temperature: 50° C., humidity: 50%) and the light resistance was evaluated.

With regard to the structures before and after the light resistance evaluation, transmittances T % of light at a wavelength of 400 to 1,300 nm were measured, a difference ΔT %=|T % (before light resistance test)–T % (after light resistance test)| was determined and thus the light resistance was evaluated. Further, in the evaluation of the light resistance, a structure having each filter formed on a glass substrate was used.

5: ΔT %<3%
4: 3%≤ΔT %<5%
3: 5%≤ΔT %<10%
2: 10%≤ΔT %<20%
1: 20%≤ΔT %

TABLE 5

| | Effect | | | | |
|---|---|---|---|---|---|
| | Coating properties | Hole | Spectroscopy | Heat Resistance | Moisture Resistance |
| Example 101 | 5 | 5 | A | 4 | 4 |
| Example 102 | 5 | 5 | A | 4 | 4 |
| Example 103 | 5 | 5 | A | 4 | 4 |
| Example 104 | 5 | 5 | A | 4 | 4 |
| Example 105 | 5 | 5 | A | 4 | 4 |
| Example 106 | 5 | 5 | A | 4 | 4 |
| Example 107 | 5 | 5 | A | 4 | 4 |
| Example 108 | 5 | 5 | A | 4 | 4 |
| Example 109 | 5 | 5 | A | 4 | 4 |
| Example 110 | 5 | 5 | A | 4 | 4 |
| Example 111 | 5 | 5 | A | 4 | 4 |
| Example 112 | 5 | 5 | A | 4 | 4 |
| Example 113 | 5 | 5 | A | 5 | 5 |
| Example 114 | 5 | 4 | A | 3 | 3 |
| Example 115 | 5 | 4 | A | 3 | 3 |
| Example 116 | 5 | 5 | A | 4 | 4 |
| Example 117 | 5 | 5 | A | 5 | 4 |
| Example 118 | 5 | 5 | A | 5 | 4 |
| Example 119 | 5 | 5 | A | 4 | 5 |
| Example 120 | 5 | 5 | A | 3 | 5 |
| Example 121 | 5 | 5 | A | 3 | 5 |
| Example 122 | 5 | 5 | A | 5 | 5 |
| Example 123 | 5 | 4 | A | 4 | 4 |
| Example 124 | 5 | 3 | A | 3 | 3 |
| Example 125 | 3 | 3 | A | 4 | 4 |
| Example 126 | 5 | 5 | A | 4 | 4 |
| Example 127 | 3 | 5 | A | 4 | 4 |
| Example 128 | 5 | 5 | A | 4 | 4 |
| Example 129 | 4 | 4 | A | 4 | 4 |
| Example 130 | 5 | 4 | A | 4 | 4 |
| Example 131 | 5 | 5 | A | 3 | 3 |
| Example 132 | 5 | 5 | A | 4 | 4 |
| Example 133 | 5 | 5 | A | 4 | 4 |
| Example 134 | 5 | 4 | A | 3 | 3 |
| Example 135 | 5 | 5 | A | 5 | 5 |
| Example 136 | 5 | 5 | A | 4 | 5 |
| Example 137 | 5 | 5 | A | 4 | 5 |
| Example 138 | 5 | 5 | A | 4 | 5 |
| Example 139 | 5 | 5 | A | 5 | 5 |

TABLE 5-continued

| | Effect | | | | |
|---|---|---|---|---|---|
| | Coating properties | Hole | Spectroscopy | Heat Resistance | Moisture Resistance |
| Example 140 | 5 | 5 | A | 4 | 4 |
| Example 141 | 4 | 4 | A | 4 | 4 |
| Example 142 | 5 | 5 | A | 4 | 4 |
| Example 143 | 5 | 4 | A | 4 | 4 |
| Example 144 | 5 | 5 | A | 4 | 4 |
| Example 145 | 4 | 5 | A | 4 | 4 |
| Example 146 | 5 | 5 | A | 4 | 4 |

TABLE 6

| | Effect | | | | |
|---|---|---|---|---|---|
| | Coating properties | Hole | Spectroscopy | Heat Resistance | Moisture Resistance |
| Example 147 | 5 | 5 | A | 4 | 4 |
| Example 148 | 5 | 5 | A | 4 | 4 |
| Example 149 | 5 | 5 | A | 4 | 4 |
| Example 150 | 5 | 5 | A | 4 | 4 |
| Example 151 | 5 | 5 | A | 4 | 4 |
| Example 152 | 5 | 5 | A | 4 | 4 |
| Example 153 | 5 | 5 | A | 4 | 4 |
| Example 154 | 5 | 5 | A | 4 | 4 |
| Example 155 | 5 | 5 | A | 4 | 4 |
| Example 156 | 5 | 5 | A | 4 | 4 |
| Example 157 | 5 | 5 | A | 4 | 4 |
| Example 158 | 5 | 5 | A | 4 | 4 |
| Example 159 | 5 | 5 | A | 4 | 4 |
| Example 160 | 5 | 5 | A | 4 | 4 |
| Example 161 | 5 | 5 | A | 4 | 4 |
| Example 162 | 5 | 5 | A | 4 | 4 |
| Example 163 | 5 | 5 | A | 4 | 4 |
| Example 164 | 5 | 5 | A | 4 | 4 |
| Example 165 | 5 | 5 | A | 4 | 4 |
| Example 166 | 5 | 5 | A | 4 | 4 |
| Example 167 | 5 | 5 | A | 4 | 4 |
| Example 168 | 5 | 5 | A | 4 | 4 |
| Example 169 | 5 | 5 | A | 4 | 4 |
| Comparative Example 101 | 1 | 2 | A | 4 | 4 |
| Comparative Example 102 | 5 | 1 | A | 1 | 1 |
| Comparative Example 103 | 5 | 1 | B | 5 | 4 |

As shown in the tables, it was possible to provide a structure having a near-infrared cut filter, which has good heat resistance and spectral characteristics and causes generation of voids to be suppressed, in Examples. Further, the structures of Examples were subjected to oblique cutting with a surface/interface cutting device (Model DN-20S, manufactured by Daipla Wintes Co., Ltd.) to expose the cross-section. Using an X-ray photoelectron spectroscopy analyzer (ESCA-3400, manufactured by Shimadzu Corporation), the exposed cross-section was analyzed by a total ($atm_{F+si}$) of fluorine atoms and silicon atoms and a ratio ($atm_{F+si}/atm_c$) thereof to carbon atoms ($atm_c$) in a range of 0% to 5% in the thickness direction from the surface of the near-infrared cut filter, and the ratio ($atm_{F+si}/atm_c$) in a range of 60% to 70% in the thickness direction from the surface of the near-infrared cut filter were measured, and the ratio ($atm_{F+si}/atm_c$) in a range of 0% to 5% in the thickness direction from the surface of the near-infrared cut filter was higher. From this finding, it can be seen that in the structures of Examples, the concentration of the region in a range of 0% to 5% in the thickness direction from one surface of the near-infrared cut filter is higher than the concentration of the region in a range of 60% to 70% in the region of a thickness direction from the above-mentioned surface.

Furthermore, the structure of each of Examples was incorporated into a solid-state imaging device according to a known method. The obtained solid-state imaging device was irradiated with light from an infrared light emitting diode (infrared LED) light source under a low illuminance environment (0.001 Lux) to capture an image, and image performance was evaluated. This solid-state imaging device can clearly recognize a subject on the image. In addition, the incidence angle dependency was good.

Test Example 2

A 16-μm-thick polyethylene terephthalate film (G2-16, manufactured by Teijin Ltd., trade name) was used as a carrier film, and the composition of each of Examples 1 to 38 was applied onto the carrier film so that the film thickness after drying was 1 μm, and dried at 75° C. for 30 minutes using a hot air convection type dryer to form a dry film of the composition for a near-infrared cut filter. Subsequently, a polyethylene film (NF-15, manufactured by Tamapoly Co., Ltd., trade name) (protective layer) was attached onto the surface of the dry film opposite to the side in contact with the carrier film to form a dry film laminate.

Next, while peeling the protective layer from the dry film laminate, the dry film was laminated on an 8-inch (20.32-cm) silicon wafer under conditions of a stage temperature of 80° C., a roll temperature of 80° C., a vacuum degree of 150 Pa, a sticking speed of 5 mm/sec, and a sticking pressure of 0.2 Mpa, using a laminating apparatus (VTM-200M, manufactured by Takatori Co., Ltd.). Then, a pattern was formed by a dry etching method in the same manner as in Test Example 1 to form a 2 μm square Bayer pattern (near-infrared cut filter).

Next, the red composition 1 was applied onto the pattern of the near-infrared cut filter by spin coating so that the film thickness after film formation was 1.0 μm. Then, the film was heated at 100° C. for 2 minutes using a hot plate. Then, the film was exposed through a mask having a Bayer pattern of 2 μm square at an exposure dose of 1,000 mJ/cm², using an i-ray stepper exposure apparatus FPA-3000i5+ (manufactured by Canon Inc.). Next, the film was subjected to puddle development at 23° C. for 60 seconds using a 0.3%-by-mass aqueous solution of tetramethylammonium hydroxide (TMAH). Thereafter, the substrate was rinsed with a spin shower and further washed with pure water. Then, the red composition was patterned on the pattern of the near-infrared cut filter by heating at 200° C. for 5 minutes using a hot plate. Similarly, the green composition 1 and the blue composition 1 were sequentially patterned to form red, green and blue colored patterns, thereby forming a color filter.

Next, the IR-pass composition 1 was applied onto the patterned film by spin coating so that the film thickness after film formation was 2.0 μm. Then, it was heated at 100° C. for 2 minutes using a hot plate. Then, the film was exposed through a mask having a Bayer pattern of 2 μm square at an exposure dose of 1,000 mJ/cm², using an i-ray stepper exposure apparatus FPA-3000i5+ (manufactured by Canon Inc.). Next, the film was subjected to puddle development at 23° C. for 60 seconds using a 0.3%-by-mass aqueous solution of tetramethylammonium hydroxide (TMAH). Thereafter, the substrate was rinsed with a spin shower and further washed with pure water. Then, by heating at 200° C. for 5 minutes using a hot plate, a pattern of the near-infrared transmitting filter was formed in the missing portion of the near-infrared cut filter. Thus, the structure shown in FIG. 1 was produced.

In a case where the obtained structure was evaluated in the same manner as in Test Example 1, the same effect as that of the structure obtained in Test Example 1 could be obtained.

EXPLANATION OF REFERENCES

111: color filter
111a, 111b, 111c: colored pixels
112: near-infrared cut filter
120: near-infrared transmitting filter
130: light-receiving element
131: underlayer
132: interlayer
133: planarization layer
201 to 205: structures

What is claimed is:

1. A structure comprising:
   a light-receiving element:
   first pixels constituted of a laminate including a color filter and a rear-infrared cut filter, provided on a light-receiving surface of the light-receiving element; and
   second pixels including a near-infrared transmitting filter, provided on the light-receiving surface of the light-receiving element at a position different from a region where the first pixels are provided,
   wherein the near-infrared cut filter includes a near-infrared absorbing colorant, a cyclic olefin resin having a glass transition temperature of 100° C. or higher, and a surfactant, and
   the near-infrared absorbing colorant is at least one selected from a colorant compound having a cation and an anion in the same molecule, a colorant compound which is a salt of a cationic chromophore and a counter anion, or a colorant compound which is a salt of an anionic chromophore and a counter cation.

2. The structure according to claim 1,
   wherein the near-infrared absorbing colorant is a squarylium compound or a croconium compound.

3. The structure according to claim 1,
   wherein a content of the near-infrared absorbing colorant in the near-infrared cut filter is 10% by mass or more.

4. The structure according to claim 1,
   wherein the color filter includes a surfactant.

5. The structure according w claim 1,
   wherein the surfactant is a fluorine-based surfactant.

6. The structure according to claim 1,
   wherein a content of the surfactant in the near-infrared cut filter is 10 to 10,000 ppm by mass.

7. The structure according to claim 1,
   wherein a concentration of the surfactant of the near-infrared cut filter in a region in a range of 0% to 5% in a thickness direction from one surface of the near-infrared cut filter is higher than a concentration of the surfactant in a region in a range of 60% to 70% in the thickness direction from the surface.

8. A composition for a near-infrared cut filter, which is used for producing a near-infrared cut filter of the structure according to claim 1, the composition comprising:
   a near-infrared absorbing colorant;
   at least one compound selected from the group consisting of a cyclic olefin resin having a glass transition temperature of 100° C. or higher and a precursor of the cyclic olefin resin having a glass transition temperature of 100° C. or higher; and
   a surfactant,
   wherein the near-infrared absorbing colorant is at least one selected from a colorant compound having a cation and an anion in the same molecule, a colorant compound which is a salt of a cationic chromophore and a counter anion, or a colorant compound which is a salt of an anionic chromophore and a counter cation.

9. A dry film obtained by using the composition for a near-infrared cart filter according to claim 8.

10. A method for producing the structure according to claim 1, the method comprising:
    forming first pixels constituted of a laminate including a color filter and a near-infrared cut filter on a light-receiving surface of the light-receiving element; and
    forming second pixels including a near-infrared transmitting filter on the light-receiving surface of the light-receiving element at a position different from a region where the first pixels are provided,
    wherein the near-infrared cut filter is formed by applying a composition for a near-infrared cut filter onto a light-receiving surface of a light-receiving element to form a composition layer and subjecting the composition layer to a photolithography method or a dry etching method to form a pattern,
    wherein the composition for a near-infrared cut filter includes:
    a near-infrared absorbing colorant;
    at least one compound selected from the group consisting of a cyclic olefin resin having a glass transition temperature of 100° C. or higher and a precursor of the cyclic olefin resin having a glass transition temperature of 100° C. or higher; and
    a surfactant, and
    wherein the near-infrared absorbing colorant is at least one selected from a colorant compound having a cation and an anion in the same molecule, a colorant compound which is a salt of a cationic chromophore and a counter anion, or a colorant compound which is a salt of an anionic chromophore and a counter cation.

11. A method for producing the structure according to claim 1, the method comprising:
    forming first pixels constituted of a laminate including a color filter and a near-infrared cut filter on a light-receiving surface of the light-receiving element; and
    forming second pixels including a near-infrared transmitting filter on the light-receiving surface of the light-receiving element at a position different from a region where the first pixels are provided,
    wherein the near-infrared cut filter is formed by applying a dry film onto a light-receiving surface of a light-receiving element to form a dry film layer and subjecting the dry film layer to a photolithography method or a dry etching method to form a pattern,
    wherein the dry film is obtained by using a composition for a near-infrared cut filter,
    wherein the composition for a near-infrared cut filter includes:
    a near-infrared absorbing, colorant;
    at least one compound selected from the group consisting, of a cyclic olefin resin having a glass transition temperature of 100° C. or higher and a precursor of the cyclic olefin resin having a glass transition temperature of 100° C. or higher; and
    a surfactant, and wherein the near-infrared absorbing colorant is at least one selected from a colorant compound having a cation and an anion in the same molecule, a colorant compound which is, a salt of a cationic chromophore and a counter anion, or a colorant compound which is a salt of an anionic chromophore and a counter cation.

12. An optical sensor comprising the structure according to claim 1.

13. An image display device comprising the structure according to claim 1.

* * * * *